(12) United States Patent
Haba et al.

(10) Patent No.: US 12,057,383 B2
(45) Date of Patent: Aug. 6, 2024

(54) BONDED STRUCTURES WITH INTEGRATED PASSIVE COMPONENT

(71) Applicant: ADEIA SEMICONDUCTOR BONDING TECHNOLOGIES INC., San Jose, CA (US)

(72) Inventors: Belgacem Haba, Saratoga, CA (US); Ilyas Mohammed, Santa Clara, CA (US); Rajesh Katkar, Milpitas, CA (US); Gabriel Z. Guevara, San Jose, CA (US); Javier A. DeLaCruz, San Jose, CA (US); Shaowu Huang, Sunnyvale, CA (US); Laura Willis Mirkarimi, Sunol, CA (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 2 days.

(21) Appl. No.: 18/148,001

(22) Filed: Dec. 29, 2022

(65) Prior Publication Data
US 2023/0317591 A1    Oct. 5, 2023

Related U.S. Application Data

(63) Continuation of application No. 15/856,391, filed on Dec. 28, 2017, now Pat. No. 11,626,363.
(Continued)

(51) Int. Cl.
*H01L 23/498* (2006.01)
*H01G 2/02* (2006.01)
(Continued)

(52) U.S. Cl.
CPC ......... *H01L 23/49838* (2013.01); *H01G 2/02* (2013.01); *H01G 4/1245* (2013.01);
(Continued)

(58) Field of Classification Search
CPC ............... H01L 23/49838; H01L 23/48; H01L 23/49822; H01L 23/49827; H01L 23/5223;
(Continued)

(56) References Cited

U.S. PATENT DOCUMENTS

| | | |
|---|---|---|
| 4,998,665 A | 3/1991 | Hayashi |
| 5,087,585 A | 2/1992 | Hayashi |

(Continued)

FOREIGN PATENT DOCUMENTS

| | | |
|---|---|---|
| EP | 1 441 410 B1 | 4/2006 |
| JP | 2000-100679 | 4/2000 |

(Continued)

OTHER PUBLICATIONS

Bush, Steve, "Electronica: Automotive power modules from On Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

(Continued)

*Primary Examiner* — Arun Ramaswamy
(74) *Attorney, Agent, or Firm* — Knobbe, Martens, Olson & Bear, LLP

(57) ABSTRACT

In various embodiments, a bonded structure is disclosed. The bonded structure can include an element and a passive electronic component having a first surface bonded to the element and a second surface opposite the first surface. The passive electronic component can comprise a first anode terminal bonded to a corresponding second anode terminal of the element and a first cathode terminal bonded to a corresponding second cathode terminal of the element. The first anode terminal and the first cathode terminal can be (Continued)

disposed on the first surface of the passive electronic component.

31 Claims, 36 Drawing Sheets

Related U.S. Application Data

(60) Provisional application No. 62/518,472, filed on Jun. 12, 2017, provisional application No. 62/440,161, filed on Dec. 29, 2016.

(51) Int. Cl.
| | |
|---|---|
| *H01G 4/12* | (2006.01) |
| *H01G 4/228* | (2006.01) |
| *H01G 4/30* | (2006.01) |
| *H01G 4/38* | (2006.01) |
| *H01G 4/40* | (2006.01) |
| *H01L 23/00* | (2006.01) |
| *H01L 23/48* | (2006.01) |
| *H01L 23/522* | (2006.01) |
| *H01L 23/66* | (2006.01) |
| *H05K 1/18* | (2006.01) |
| *H05K 1/02* | (2006.01) |

(52) U.S. Cl.
CPC .............. *H01G 4/228* (2013.01); *H01G 4/30* (2013.01); *H01G 4/40* (2013.01); *H01L 23/48* (2013.01); *H01L 23/49822* (2013.01); *H01L 23/49827* (2013.01); *H01L 23/5223* (2013.01); *H01L 24/08* (2013.01); *H01L 24/32* (2013.01); *H05K 1/18* (2013.01); *H01G 4/38* (2013.01); *H01L 23/49816* (2013.01); *H01L 23/66* (2013.01); *H01L 24/05* (2013.01); *H01L 24/80* (2013.01); *H01L 2223/6666* (2013.01); *H01L 2223/6672* (2013.01); *H01L 2224/03845* (2013.01); *H01L 2224/05005* (2013.01); *H01L 2224/05017* (2013.01); *H01L 2224/05556* (2013.01); *H01L 2224/05567* (2013.01); *H01L 2224/05576* (2013.01); *H01L 2224/05647* (2013.01); *H01L 2224/05686* (2013.01); *H01L 2224/0807* (2013.01); *H01L 2224/08265* (2013.01); *H01L 2224/16265* (2013.01); *H01L 2224/32265* (2013.01); *H01L 2224/80203* (2013.01); *H01L 2224/80895* (2013.01); *H01L 2224/80896* (2013.01); *H01L 2224/80948* (2013.01); *H01L 2924/19011* (2013.01); *H01L 2924/19041* (2013.01); *H01L 2924/19103* (2013.01); *H05K 1/0231* (2013.01); *H05K 1/185* (2013.01); *H05K 2201/10015* (2013.01)

(58) Field of Classification Search
CPC ... H01L 24/08; H01L 24/32; H01L 23/49816; H01L 23/66; H01L 24/05; H01L 2223/6672; H01L 2223/6666; H01L 2224/05005; H01L 2224/05017; H01L 2224/0807; H01L 2224/32265; H01L 2924/19011; H01L 2924/19041; H01L 2924/19103; H01G 2/02; H01G 4/1245; H01G 4/228; H01G 4/30; H01G 4/40; H01G 4/38; H05K 1/18; H05K 2201/10015
USPC .................. 361/301.4, 321.1, 328
See application file for complete search history.

(56) References Cited

U.S. PATENT DOCUMENTS

| | | |
|---|---|---|
| 5,322,593 A | 6/1994 | Hasegawa et al. |
| 5,408,053 A | 4/1995 | Young |
| 5,471,090 A | 11/1995 | Deutsch et al. |
| 5,753,536 A | 5/1998 | Sugiyama et al. |
| 5,771,555 A | 6/1998 | Eda et al. |
| 5,909,624 A | 6/1999 | Yeager et al. |
| 5,985,739 A | 11/1999 | Plettner et al. |
| 5,998,808 A | 12/1999 | Matsushita |
| 6,008,126 A | 12/1999 | Leedy |
| 6,080,640 A | 6/2000 | Gardner et al. |
| 6,115,264 A | 9/2000 | Nosaka |
| 6,265,775 B1 | 7/2001 | Seyyedy |
| 6,300,161 B1 | 10/2001 | Goetz et al. |
| 6,374,770 B1 | 4/2002 | Lee |
| 6,418,029 B1 | 7/2002 | McKee et al. |
| 6,423,640 B1 | 7/2002 | Lee et al. |
| 6,465,892 B1 | 10/2002 | Suga |
| 6,638,808 B1 | 10/2003 | Ochi |
| 6,713,871 B2 | 3/2004 | Searls et al. |
| 6,759,692 B1 | 7/2004 | Ochi |
| 6,887,769 B2 | 5/2005 | Kellar et al. |
| 6,952,049 B1 | 10/2005 | Ogawa et al. |
| 6,970,362 B1 | 11/2005 | Chakravorty |
| 7,045,453 B2 | 5/2006 | Canaperi et al. |
| 7,078,811 B2 | 7/2006 | Suga |
| 7,105,980 B2 | 9/2006 | Abbott et al. |
| 7,126,212 B2 | 10/2006 | Enquist et al. |
| 7,193,423 B1 | 3/2007 | Dalton et al. |
| 7,339,798 B2 | 3/2008 | Chakravorty |
| 7,354,798 B2 | 4/2008 | Pogge et al. |
| 7,355,836 B2 | 4/2008 | Radhakrishnan et al. |
| 7,633,112 B2 | 12/2009 | Won et al. |
| 7,705,691 B2 | 4/2010 | Lu et al. |
| 7,741,724 B2 | 6/2010 | Morikawa et al. |
| 7,746,663 B2 | 6/2010 | Hashimoto |
| 7,750,488 B2 | 7/2010 | Patti et al. |
| 7,803,693 B2 | 9/2010 | Trezza |
| 8,143,135 B2 | 3/2012 | Kemerer et al. |
| 8,183,127 B2 | 5/2012 | Patti et al. |
| 8,222,104 B2 | 7/2012 | Booth et al. |
| 8,241,961 B2 | 8/2012 | Kim et al. |
| 8,314,007 B2 | 11/2012 | Vaufredaz |
| 8,349,635 B1 | 1/2013 | Gan et al. |
| 8,357,931 B2 | 1/2013 | Schieck et al. |
| 8,377,798 B2 | 2/2013 | Peng et al. |
| 8,441,131 B2 | 5/2013 | Ryan |
| 8,476,146 B2 | 7/2013 | Chen et al. |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,524,533 B2 | 9/2013 | Tong et al. |
| 8,620,164 B2 | 12/2013 | Heck et al. |
| 8,647,987 B2 | 2/2014 | Yang et al. |
| 8,697,493 B2 | 4/2014 | Sadaka |
| 8,698,323 B2 | 4/2014 | Mohammed et al. |
| 8,716,105 B2 | 5/2014 | Sadaka et al. |
| 8,802,538 B1 | 8/2014 | Liu |
| 8,809,123 B2 | 8/2014 | Liu et al. |
| 8,841,002 B2 | 9/2014 | Tong |
| 8,916,448 B2 | 12/2014 | Cheng et al. |
| 8,970,003 B2 | 3/2015 | Parris |
| 8,988,299 B2 | 3/2015 | Kam et al. |
| 9,093,350 B2 | 7/2015 | Endo et al. |
| 9,142,517 B2 | 9/2015 | Liu et al. |
| 9,171,756 B2 | 10/2015 | Enquist et al. |
| 9,184,125 B2 | 11/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,263,186 B2 | 2/2016 | Li et al. |
| 9,299,649 B2 | 3/2016 | Chiu et al. |
| 9,299,736 B2 | 3/2016 | Chen et al. |
| 9,312,229 B2 | 4/2016 | Chen et al. |
| 9,331,149 B2 | 5/2016 | Tong et al. |
| 9,337,235 B2 | 5/2016 | Chen et al. |

(56) References Cited

U.S. PATENT DOCUMENTS

| | | |
|---|---|---|
| 9,368,866 B2 | 6/2016 | Yu |
| 9,385,024 B2 | 7/2016 | Tong et al. |
| 9,391,143 B2 | 7/2016 | Tong et al. |
| 9,394,161 B2 | 7/2016 | Cheng et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,461,007 B2 | 10/2016 | Chun et al. |
| 9,496,202 B2 | 11/2016 | Hashimoto |
| 9,496,239 B1 | 11/2016 | Edelstein et al. |
| 9,536,848 B2 | 1/2017 | England et al. |
| 9,537,199 B2 | 1/2017 | Dang et al. |
| 9,559,081 B1 | 1/2017 | Lai et al. |
| 9,620,481 B2 | 4/2017 | Edelstein et al. |
| 9,656,852 B2 | 5/2017 | Cheng et al. |
| 9,716,088 B1 | 7/2017 | Edelstein et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,799,587 B2 | 10/2017 | Fujii et al. |
| 9,852,988 B2 | 12/2017 | Enquist et al. |
| 9,881,882 B2 | 1/2018 | Hsu et al. |
| 9,893,004 B2 | 2/2018 | Yazdani |
| 9,929,050 B2 | 3/2018 | Lin |
| 9,941,241 B2 | 4/2018 | Edelstein et al. |
| 9,941,243 B2 | 4/2018 | Kim et al. |
| 9,947,655 B2 | 4/2018 | Edelstein et al. |
| 9,953,941 B2 | 4/2018 | Enquist |
| 9,960,142 B2 | 5/2018 | Chen et al. |
| 10,002,844 B1 | 6/2018 | Wang et al. |
| 10,026,605 B2 | 7/2018 | Doub et al. |
| 10,075,657 B2 | 9/2018 | Fahim et al. |
| 10,204,893 B2 | 2/2019 | Uzoh et al. |
| 10,269,756 B2 | 4/2019 | Uzoh |
| 10,276,619 B2 | 4/2019 | Kao et al. |
| 10,276,909 B2 | 4/2019 | Huang et al. |
| 10,418,277 B2 | 9/2019 | Cheng et al. |
| 10,446,456 B2 | 10/2019 | Shen et al. |
| 10,707,087 B2 | 7/2020 | Uzoh et al. |
| 10,727,219 B2 | 7/2020 | Uzoh et al. |
| 10,790,262 B2 | 9/2020 | Uzoh et al. |
| 10,820,409 B1 | 10/2020 | Felix |
| 10,840,135 B2 | 11/2020 | Uzoh |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,923,413 B2 | 2/2021 | DeLaCruz |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,011,503 B2 | 5/2021 | Wang et al. |
| 11,031,285 B2 | 6/2021 | Katkar et al. |
| 11,037,919 B2 | 6/2021 | Uzoh et al. |
| 11,056,348 B2 | 7/2021 | Theil |
| 11,069,734 B2 | 7/2021 | Katkar |
| 11,088,099 B2 | 8/2021 | Katkar et al. |
| 11,127,738 B2 | 9/2021 | DeLaCruz et al. |
| 11,158,606 B2 | 10/2021 | Gao et al. |
| 11,171,117 B2 | 11/2021 | Gao et al. |
| 11,176,450 B2 | 11/2021 | Teig et al. |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,329,034 B2 | 5/2022 | Tao et al. |
| 11,348,898 B2 | 5/2022 | DeLaCruz et al. |
| 11,355,443 B2 | 6/2022 | Huang et al. |
| 11,626,363 B2 | 4/2023 | Haba et al. |
| 2002/0000328 A1 | 1/2002 | Motomura et al. |
| 2002/0003307 A1 | 1/2002 | Suga |
| 2003/0036244 A1 | 2/2003 | Jones et al. |
| 2003/0100189 A1 | 5/2003 | Lee et al. |
| 2004/0084414 A1 | 5/2004 | Sakai et al. |
| 2004/0155692 A1 | 8/2004 | Ochi |
| 2005/0135041 A1 | 6/2005 | Kang et al. |
| 2005/0190808 A1 | 9/2005 | Yonekura et al. |
| 2005/0231303 A1 | 10/2005 | Chang et al. |
| 2005/0266652 A1 | 12/2005 | Chudzik et al. |
| 2006/0012966 A1 | 1/2006 | Chakravorty |
| 2006/0017144 A1 | 1/2006 | Uematsu et al. |
| 2006/0054960 A1* | 3/2006 | Seo ............... H01L 21/76838 |
| | | 257/E21.582 |
| 2006/0057945 A1 | 3/2006 | Hsu et al. |
| 2006/0145778 A1 | 7/2006 | Pleva et al. |
| 2006/0278832 A1 | 12/2006 | Zentai et al. |
| 2007/0045814 A1 | 3/2007 | Yamamoto et al. |
| 2007/0096294 A1 | 5/2007 | Ikeda et al. |
| 2007/0111386 A1 | 5/2007 | Kim et al. |
| 2007/0147014 A1 | 6/2007 | Chang et al. |
| 2007/0222048 A1 | 9/2007 | Huang |
| 2007/0295456 A1 | 12/2007 | Gudeman et al. |
| 2008/0124835 A1 | 5/2008 | Chen et al. |
| 2009/0051267 A1 | 2/2009 | Kato |
| 2009/0097186 A1 | 4/2009 | Topaloglu |
| 2009/0108403 A1 | 4/2009 | Gogoi |
| 2009/0206962 A1 | 8/2009 | Chou et al. |
| 2009/0242252 A1 | 10/2009 | Tanaka |
| 2010/0052099 A1 | 3/2010 | Chang et al. |
| 2010/0132476 A1 | 6/2010 | Cheng et al. |
| 2010/0146779 A1 | 6/2010 | Honjo et al. |
| 2010/0178418 A1 | 7/2010 | Tuncer |
| 2010/0181645 A1 | 7/2010 | Marenco |
| 2010/0302012 A1 | 12/2010 | Roesner |
| 2011/0115579 A1 | 5/2011 | Rofougaran |
| 2011/0175215 A1 | 7/2011 | Farooq et al. |
| 2011/0290552 A1 | 12/2011 | Palmateer et al. |
| 2012/0013499 A1 | 1/2012 | Hayata |
| 2012/0147516 A1 | 6/2012 | Kim et al. |
| 2012/0168217 A1 | 7/2012 | Hsu et al. |
| 2012/0212384 A1 | 8/2012 | Kam et al. |
| 2013/0009325 A1 | 1/2013 | Mori et al. |
| 2013/0032952 A1 | 2/2013 | Cho et al. |
| 2013/0063863 A1 | 3/2013 | Timler et al. |
| 2013/0105943 A1 | 5/2013 | Lai et al. |
| 2013/0164905 A1 | 6/2013 | Yang et al. |
| 2013/0205908 A1* | 8/2013 | Hsu ............... B81B 3/0094 |
| | | 73/725 |
| 2013/0207234 A1 | 8/2013 | Ikeda et al. |
| 2013/0242517 A1 | 9/2013 | Fujidai et al. |
| 2013/0265733 A1 | 10/2013 | Herbsommer et al. |
| 2013/0286544 A1 | 10/2013 | Azais |
| 2013/0320556 A1* | 12/2013 | Liu ............... H01L 24/92 |
| | | 438/455 |
| 2014/0001568 A1 | 1/2014 | Wang et al. |
| 2014/0048908 A1 | 2/2014 | Chen et al. |
| 2014/0116761 A1 | 5/2014 | Lee et al. |
| 2014/0145338 A1 | 5/2014 | Fujii et al. |
| 2014/0151100 A1 | 6/2014 | Yu et al. |
| 2014/0175629 A1 | 6/2014 | Sun et al. |
| 2014/0175655 A1 | 6/2014 | Chen et al. |
| 2014/0184351 A1 | 7/2014 | Bae et al. |
| 2014/0225795 A1 | 8/2014 | Yu |
| 2014/0252635 A1 | 9/2014 | Tran et al. |
| 2014/0264751 A1 | 9/2014 | Chen et al. |
| 2014/0264948 A1 | 9/2014 | Chou et al. |
| 2014/0273347 A1 | 9/2014 | Tseng et al. |
| 2014/0370658 A1 | 12/2014 | Tong et al. |
| 2014/0377946 A1 | 12/2014 | Cha et al. |
| 2015/0062846 A1 | 3/2015 | Kim et al. |
| 2015/0064498 A1 | 3/2015 | Tong |
| 2015/0097298 A1 | 4/2015 | Chen et al. |
| 2015/0194379 A1 | 7/2015 | Chen et al. |
| 2015/0206902 A1 | 7/2015 | Cheng et al. |
| 2015/0221571 A1 | 8/2015 | Chaparala et al. |
| 2015/0235952 A1 | 8/2015 | Pan et al. |
| 2015/0270209 A1 | 9/2015 | Woychik et al. |
| 2015/0318618 A1 | 11/2015 | Chen et al. |
| 2016/0049361 A1 | 2/2016 | Wang et al. |
| 2016/0077294 A1 | 3/2016 | Jou et al. |
| 2016/0111404 A1 | 4/2016 | Sanders et al. |
| 2016/0155677 A1 | 6/2016 | Bonart et al. |
| 2016/0197630 A1 | 7/2016 | Kawasaki |

(56) References Cited

U.S. PATENT DOCUMENTS

| | | |
|---|---|---|
| 2016/0233195 A1 | 8/2016 | Nagai |
| 2016/0254345 A1 | 9/2016 | Singh et al. |
| 2016/0309578 A1 | 10/2016 | Park |
| 2016/0343682 A1 | 11/2016 | Kawasaki |
| 2016/0372449 A1 | 12/2016 | Rusu et al. |
| 2017/0019086 A1 | 1/2017 | Dueweke |
| 2017/0062366 A1 | 3/2017 | Enquist |
| 2017/0062409 A1 | 3/2017 | Basker et al. |
| 2017/0179029 A1 | 6/2017 | Enquist et al. |
| 2017/0194271 A1 | 7/2017 | Hsu et al. |
| 2017/0200711 A1 | 7/2017 | Uzoh et al. |
| 2017/0338214 A1 | 11/2017 | Uzoh et al. |
| 2017/0343498 A1 | 11/2017 | Kalnitsky et al. |
| 2018/0096931 A1 | 4/2018 | Huang et al. |
| 2018/0174995 A1 | 6/2018 | Wang et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0191047 A1 | 7/2018 | Huang et al. |
| 2018/0219038 A1 | 8/2018 | Gambino et al. |
| 2018/0226375 A1 | 8/2018 | Enquist et al. |
| 2018/0273377 A1 | 9/2018 | Katkar et al. |
| 2018/0286805 A1 | 10/2018 | Huang et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0096741 A1 | 3/2019 | Uzoh et al. |
| 2019/0096842 A1 | 3/2019 | Fountain, Jr. et al. |
| 2019/0115277 A1 | 4/2019 | Yu et al. |
| 2019/0131277 A1 | 5/2019 | Yang et al. |
| 2019/0198407 A1 | 6/2019 | Huang et al. |
| 2019/0198409 A1 | 6/2019 | Katkar et al. |
| 2019/0265411 A1 | 8/2019 | Huang et al. |
| 2019/0333550 A1 | 10/2019 | Fisch |
| 2019/0348336 A1 | 11/2019 | Katkar et al. |
| 2019/0385935 A1 | 12/2019 | Gao et al. |
| 2019/0385966 A1 | 12/2019 | Gao et al. |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0075520 A1 | 3/2020 | Gao et al. |
| 2020/0075534 A1 | 3/2020 | Gao et al. |
| 2020/0075553 A1 | 3/2020 | DeLaCruz et al. |
| 2020/0091063 A1 | 3/2020 | Chen et al. |
| 2020/0118973 A1 | 4/2020 | Wang et al. |
| 2020/0126906 A1 | 4/2020 | Uzoh et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0371154 A1 | 11/2020 | DeLaCruz et al. |
| 2020/0395321 A1 | 12/2020 | Katkar et al. |
| 2020/0411483 A1 | 12/2020 | Uzoh et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |

FOREIGN PATENT DOCUMENTS

| | | |
|---|---|---|
| JP | 2001-102479 | 4/2001 |
| JP | 2002-353416 | 12/2002 |
| JP | 2003-043281 | 2/2003 |
| JP | 2005-191156 | 7/2005 |
| JP | 2007-096262 | 4/2007 |
| JP | 2008-258258 | 10/2008 |
| JP | 2013-33786 | 2/2013 |
| JP | 2013-179189 | 9/2013 |
| JP | 2014-131039 | 7/2014 |
| JP | 2014-192321 | 10/2014 |
| JP | 2018-160519 | 10/2018 |
| KR | 10-2006-0105797 | 10/2006 |
| KR | 10-2015-0097798 | 8/2015 |
| WO | WO 2005/043584 A2 | 5/2005 |
| WO | WO 2005/064646 A2 | 7/2005 |
| WO | WO 2006/100444 A1 | 9/2006 |
| WO | WO 2012/005236 A1 | 1/2012 |
| WO | WO 2012/125237 A2 | 9/2012 |
| WO | WO 2016/170894 A1 | 10/2016 |
| WO | WO 2017/151442 A1 | 9/2017 |
| WO | WO 2017/159377 A1 | 9/2017 |

OTHER PUBLICATIONS

ONSEMI AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, Electronics Weekly.com ("BUSH article");

(56) References Cited

OTHER PUBLICATIONS however, the imaged part and the part shown in the BUSH article share the part number "ONSEMI AR0820."
SONY IMX260 image, a first cross section of Sony product labeled IMX260, showing a hybrid bonded back side illuminated CMOS image sensor with a pad opening for a wire bond. The second image shows a second cross-section with peripheral probe and wire bond pads in the bonded structure. The part in the images was shipped in Apr. 2016. Applicant makes no representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "SONY IMX260 image."
Amirfeiz et al., "Formation of silicon structures by plasma-activated wafer bonding," Journal of The Electrochemical Society, 2000, vol. 147, No. 7, pp. 2693-2698.
Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.
Chung et al., "Wafer direct bonding of compound semiconductors and silicon at room temperature by the surface activated bonding method," Applied Surface Science, Jun. 2, 1997, vols. 117-118, pp. 808-812.
Farrens et al., "Chemical free room temperature wafer to wafer direct bonding," J. Electrochem. Soc., The Electrochemical Society, Inc., Nov. 1995, vol. 142, No. 11. pp. 3949-3955.
Farrens et al., "Chemical free wafer bonding of silicon to glass and sapphire," Electrochemical Society Proceedings vol. 95-7, 1995, pp. 72-77.
Gösele et al., "Semiconductor Wafer Bonding: A flexible approach to materials combinations in microelectronics; micromechanics and optoelectronics," IEEE, 1997, pp. 23-32.
Hosoda et al., "Effect of the surface treatment on the room-temperature bonding of Al to Si and SiO2," Journal of Materials Science, Jan. 1, 1998, vol. 33, Issue 1, pp. 253-258.
Hosoda et al., "Room temperature GaAs—Si and InP—Si wafer direct bonding by the surface activated bonding method," Nuclear Inst. and Methods in Physics Research B, 1997, vol. 121, Nos. 1-4, pp. 203-206.
Howlader et al., "A novel method for bonding of ionic wafers," Electronics Components and Technology Conference, 2006, IEEE, pp. 7-pp.
Howlader et al., "Bonding of p-Si/n-InP wafers through surface activated bonding method at room temperature, " Indium Phosphide and Related Materials, 2001, IEEE International Conference on, pp. 272-275.
Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.
Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.
International Preliminary Report on Patentability mailed Jul. 2, 2019, in International Application No. PCT/US2017/068788, 9 pages.
International Search Report and Written Opinion mailed May 29, 2017, issued in International Application No. PCT/US2016/067182, 14 pages.
International Search Report and Written Opinion mailed Jan. 9, 2018, issued in International Application No. PCT/US2017/052409, 16 pages.
International Search Report and Written Opinion mailed Apr. 23, 2018, issued in International Application No. PCT/US2017/068788, 13 pages.
International Search Report and Written Opinion mailed Jul. 17, 2018, issued in International Application No. PCT/US2018/025241, 15 pages.
International Search Report and Written Opinion mailed Mar. 7, 2019, in International Application No. PCT/US2018/060044, 14 pages.
International Search Report and Written Opinion mailed Apr. 22, 2019 in International Application No. PCT/US2018/064982, 13 pages.
Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Jeon, Y. et al., "Design of an on-interposer passive equalizer for high bandwidth memory (HBM) with 30Gbps data transmission," Electronic Components and Technology Conference (ECTC), 2016 IEEE 66th, Aug. 18, 2016.
Kalnitsky, Alexander et al., "High Density Capacitor for Power Management Applications and its Integration in the SiP," Taiwan Semiconductor Manufacturing Company, Hsin-Chu, Taiwan, 2014, TSMC, Ltd., 16 slides.
Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.
Kim et al., "Low temperature direct Cu—Cu bonding with low energy ion activation method," Electronic Materials and Packaging, 2001, IEEE, pp. 193-195.
Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—CU, Cu—Si, and Cu—SiO2 at low temperature," Proceedings—Electrochemical Society, 2003, vol. 19, pp. 239-247.
Kim, H. et al., "A wideband on-interposer passive equalizer design for chip-to-chip 30-Gb/s serial data transmission," IEEE Transactions on Components, Packaging and Manufacturing Technology, Jan. 2015, vol. 5, Issue 1, pp. 28-39.
Lee, H. et al., "Signal integrity of bump-less high-speed through silicon via channel for terabyte/s bandwidth 2.5D IC," 2016 IEEE 66th Electronic Components and Technology Conference, Aug. 18, 2016.
Matsuzawa et al., "Room-temperature interconnection of electroplated Au microbump by means of surface activated bonding method," Electornic Components and Technology Confererence, 2001, 51st Proceedings, IEEE, pp. 384-387.
Moriceau, H. et al., "Overview of recent direct wafer bonding advances and applications," Advances in Natural Sciences—Nanoscience and Nanotechnology, 2010, 11 pages.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(I), 6 pages.
Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.

(56) References Cited

OTHER PUBLICATIONS

Plobi, A. et al., "Wafer direct bonding: tailoring adhesion between brittle materials," Materials Science and Engineering Review Journal, 1999, R25, 88 pages.
Reiche et al., "The effect of a plasma pretreatment on the Si/Si bonding behaviouir," Electrochemical Society Proceedings, 1998, vol. 97-36, pp. 437-444.
Roberds et al., "Low temperature , in situ, plasma activated wafer bonding," Electrochecmical Society Proceedings, 1997, vol. 97-36, pp. 598-606.
Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP—Cu film for bumpless interconnection," Electronic Components and Technology Confererence, 51st Proceedings, 2001, IEEE, pp. 755-760.
Shingo et al., "Design and fabrication of an electrostatically actuated MEMS probe card," Tranducers, Solid-State Sensors, Actuators and Microsystems, 12th International Conference, Jun. 8-12, 2003, vol. 2, pp. 1522-1525.
Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga et al., "Bump-less interconnect for next generation system packaging," Electronic Components and Technology Conference, 2001, IEEE, pp. 1003-1008.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Suga et al., "Surface activated bonding—an approach to joining at room temperature," Ceramic Transactions: Structural Ceramics Joining II, The American Ceramic Society, 1993, pp. 323-331.
Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.
Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.
Takagi et al., "Room-temperature bonding of lithium niobate and silicon wafers by argon-beam surface activation," Appl. Phys. Lett., 1999. vol. 74, pp. 2387.
Takagi et al., "Room temperature silicon wafer direct bonding in vacuum by Ar beam irradiation," Micro Electro Mehcanical Systems, MEMS '97 Proceedings, 1997, IEEE, pp. 191-196.
Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.
Takagi et al., "Room-temperature wafer bonding of silicon and lithium niobate by means of arbon-beam surface activation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al, "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.
Tong et al., "Low temperature wafer direct bonding," Journal of Microelectomechanical systems, Mar. 1994, vol. 3, No. 1, pp. 29-35.
Topol et al., "Enabling technologies for wafer-level bonding of 3D MEMS and integrated circuit structures," 2004 Electronics Components and Technology Conference, 2004 IEEE, pp. 931-938.
Wang et al., "Reliability and microstructure of Au—Al and Au—Cu direct bonding fabricated by the Surface Activated Bonding," Electronic Components and Technology Conference, 2002, IEEE, pp. 915-919.
Wang et al., "Reliability of Au bump—Cu direct interconnections fabricated by means of surface activated bonding method," Microelectronics Reliability, May 2003, vol. 43, Issue 5, pp. 751-756.
Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.
Westphal, W.B. et al., "Dielectric constant and loss data," Air Force Materials Laboratory, Apr. 1972.
Xu et al., "New Au—Al interconnect technology and its reliability by surface activated bonding," Electronic Packaging Technology Proceedings, Oct. 28-30, 2003, Shanghai, China, pp. 479-483.
Ceramic Microstructures: Control at the Atomic Level, Recent Progress in Surface Activated Bonding, 1998, pp. 385-389.
Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

* cited by examiner

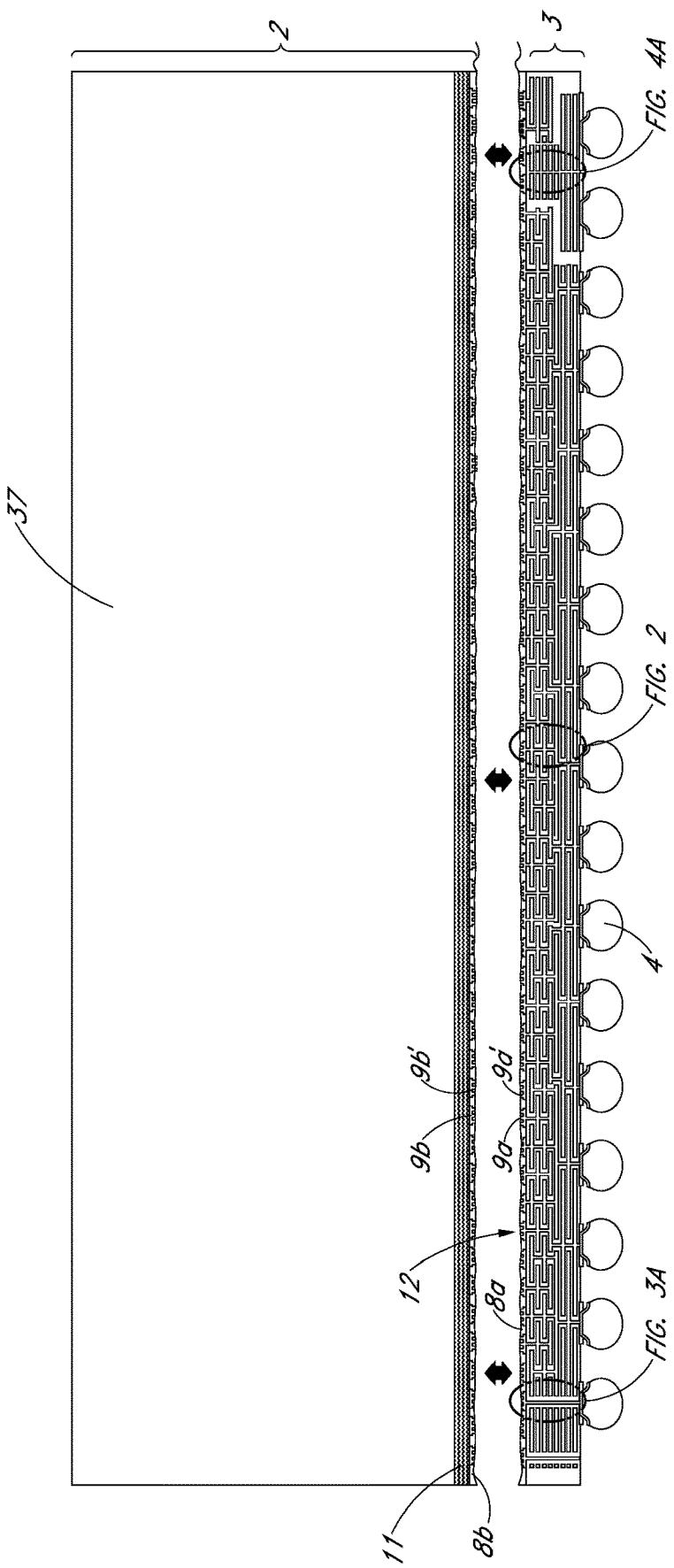

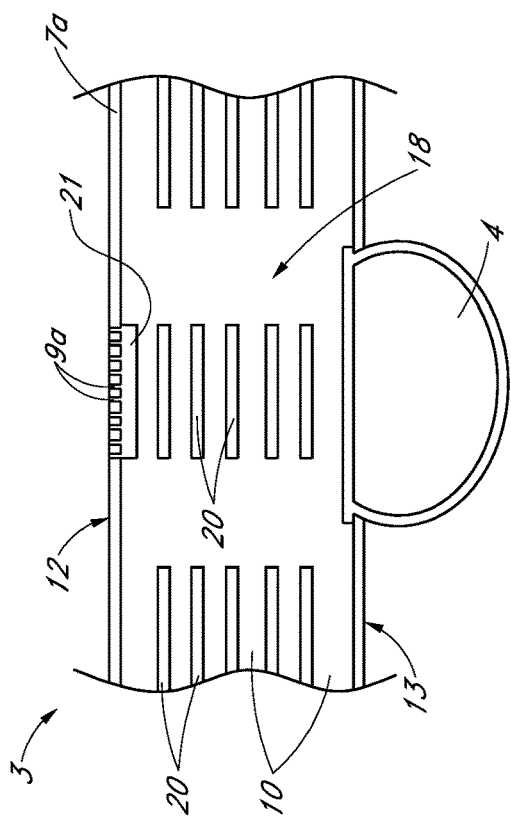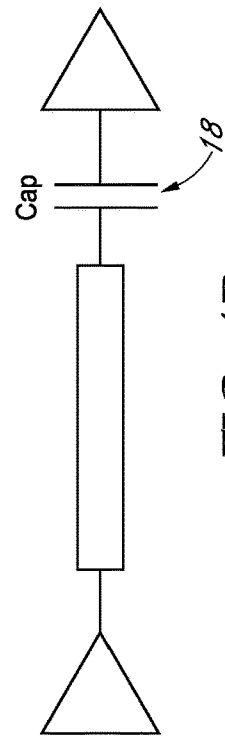
FIG. 4A
FIG. 4B
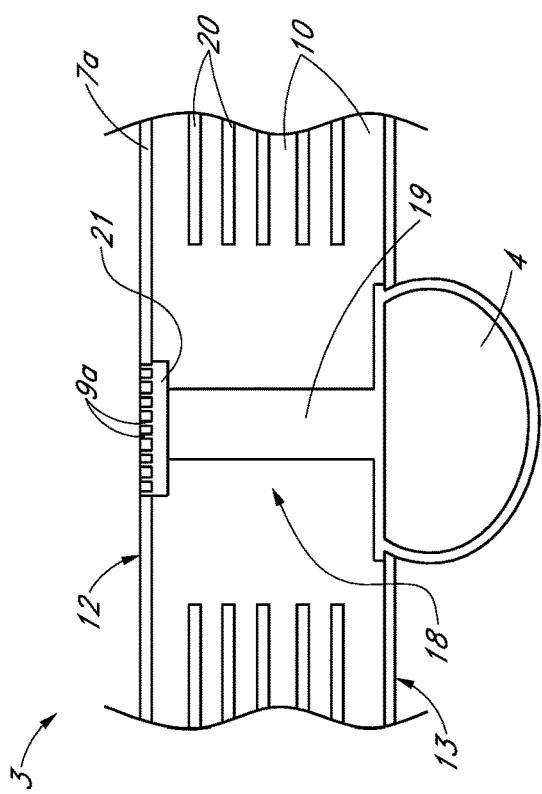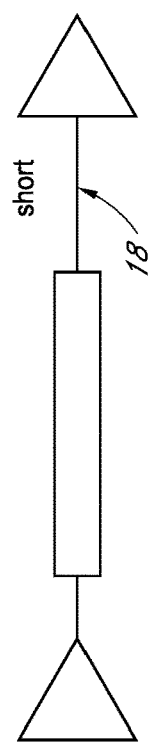
FIG. 3A
FIG. 3B

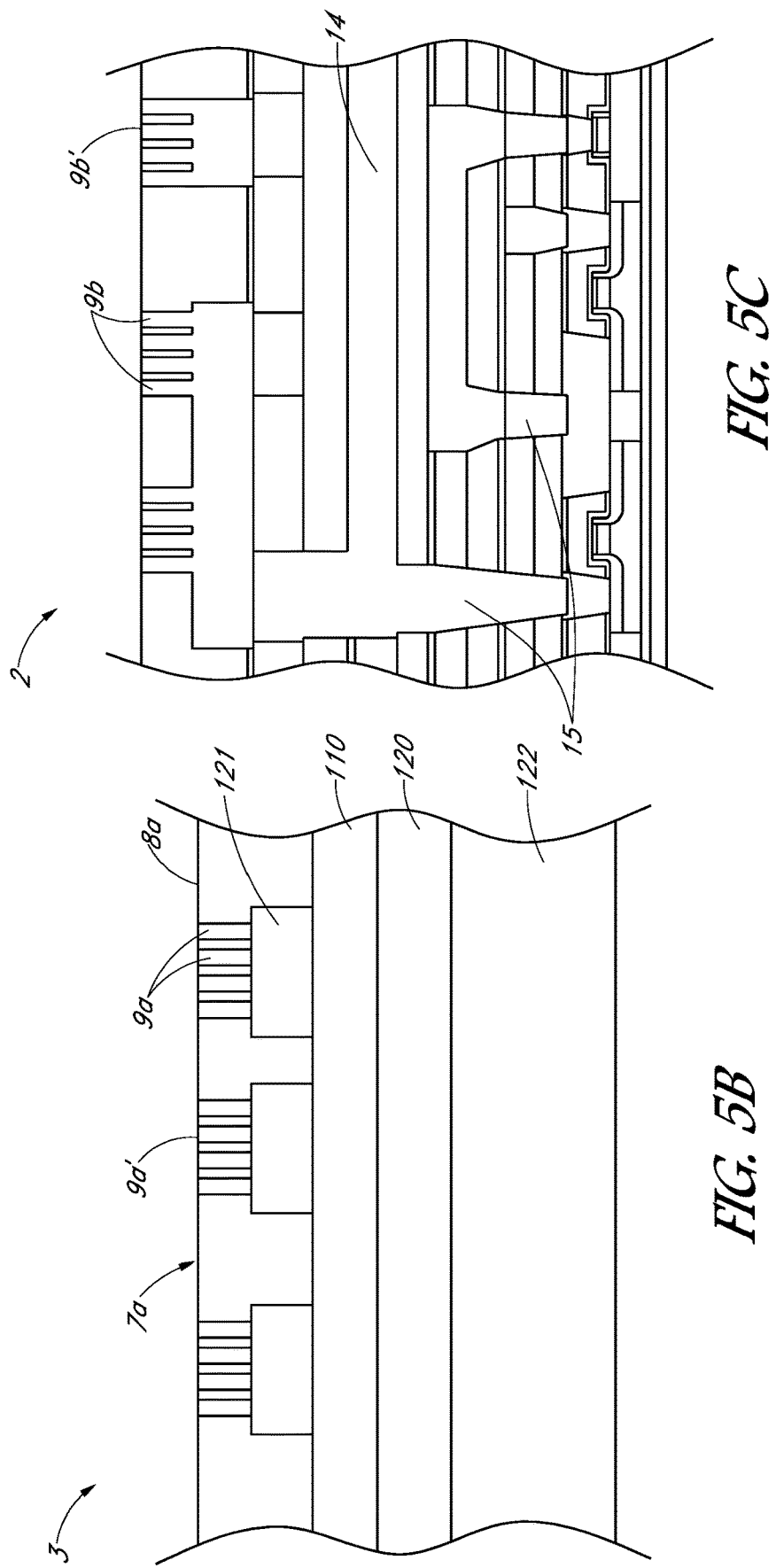

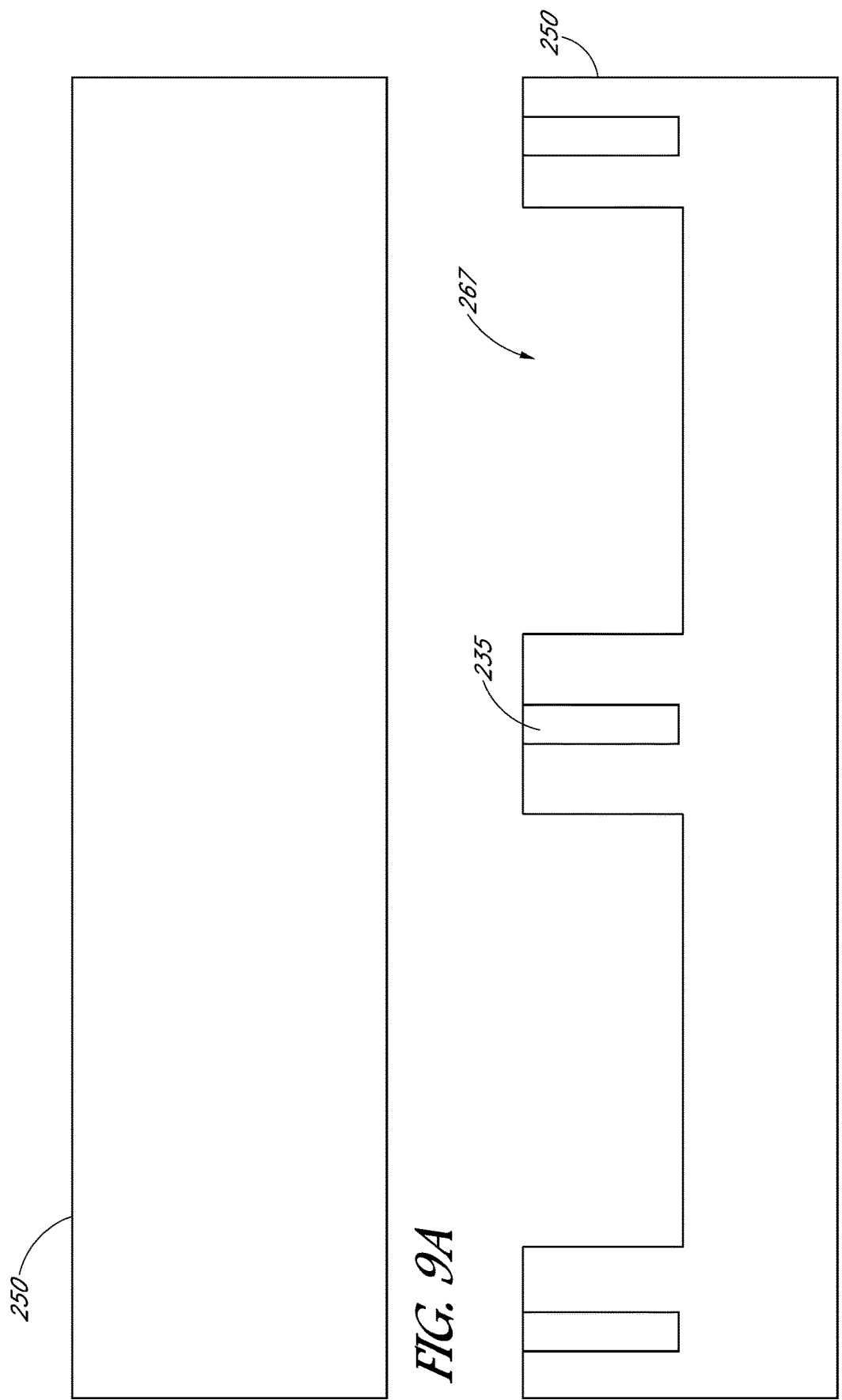

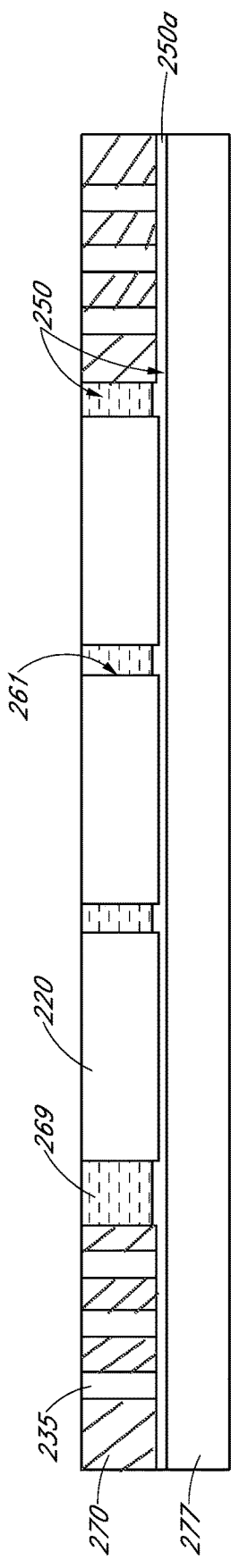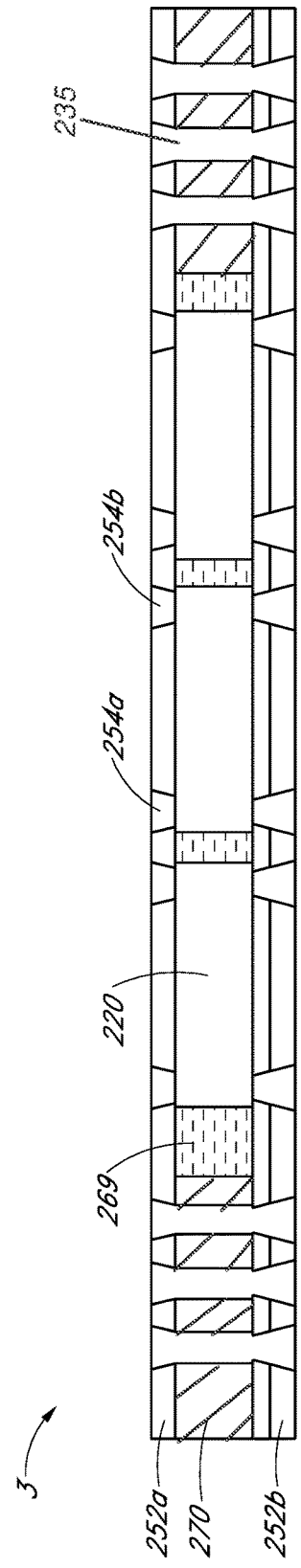
FIG. 14A
FIG. 14B

BONDED STRUCTURES WITH INTEGRATED PASSIVE COMPONENT

CROSS-REFERENCE TO RELATED APPLICATIONS

This application is a continuation of U.S. patent application Ser. No. 15/856,391, filed Dec. 28, 2017, which claims priority to U.S. Provisional Patent Application No. 62/440,161, filed Dec. 29, 2016, and to U.S. Provisional Patent Application No. 62/518,472, filed Jun. 12, 2017, the entire contents of each of which are incorporated by reference herein in their entirety and for all purposes.

This application is also related to U.S. patent application Ser. No. 15/426,942, filed Feb. 7, 2017, which is incorporated by reference herein in its entirety and for all purposes.

BACKGROUND

Field

The field relates to bonded structures with integrated passive components.

Description of the Related Art

Passive electronic components, such as capacitors, resistors, and inductors, play important roles in electronic systems. For example, passive components help smooth signals and increase the performance of active devices of the system. Incorporating passive components in an efficient manner may be challenging, since the passive components occupy valuable space on the integrated device die, the package, and/or the system board. Accordingly, there remains a continuing need for improved incorporation of passive electronic components into electronic systems.

BRIEF DESCRIPTION OF THE DRAWINGS

FIG. 1B is a schematic side view of an element and a passive electronic component prior to forming a bonded structure.

FIG. 3A is a schematic side sectional view of a portion of a passive electronic component configured for relatively low speed connections.

FIG. 3B is a schematic circuit diagram of the passive electronic component of FIG. 3A.

FIG. 4A is a schematic side sectional view of a portion of a passive electronic component configured for relatively high speed connections.

FIG. 4B is a schematic circuit diagram of the passive electronic component of FIG. 4A.

FIG. 5B is a schematic side sectional view of the passive electronic component of FIG. 5A, with a bonding layer provided over a patterned electrode.

FIG. 5C is a schematic side sectional view of a portion of the semiconductor element prior to bonding.

FIG. 9A is a schematic side sectional view of an insulating layer used in the formation of a passive electronic component, according to various embodiments.

FIG. 9B is a schematic side sectional view of the insulating layer of FIG. 9A with one or more cavities formed therein.

FIG. 14A is a schematic side sectional view of a carrier having a plurality of capacitors mounted thereto by way of an adhesive layer.

FIG. 14B is a schematic side sectional view of a passive electronic component according to various embodiments.

DETAILED DESCRIPTION

Figure 1A:
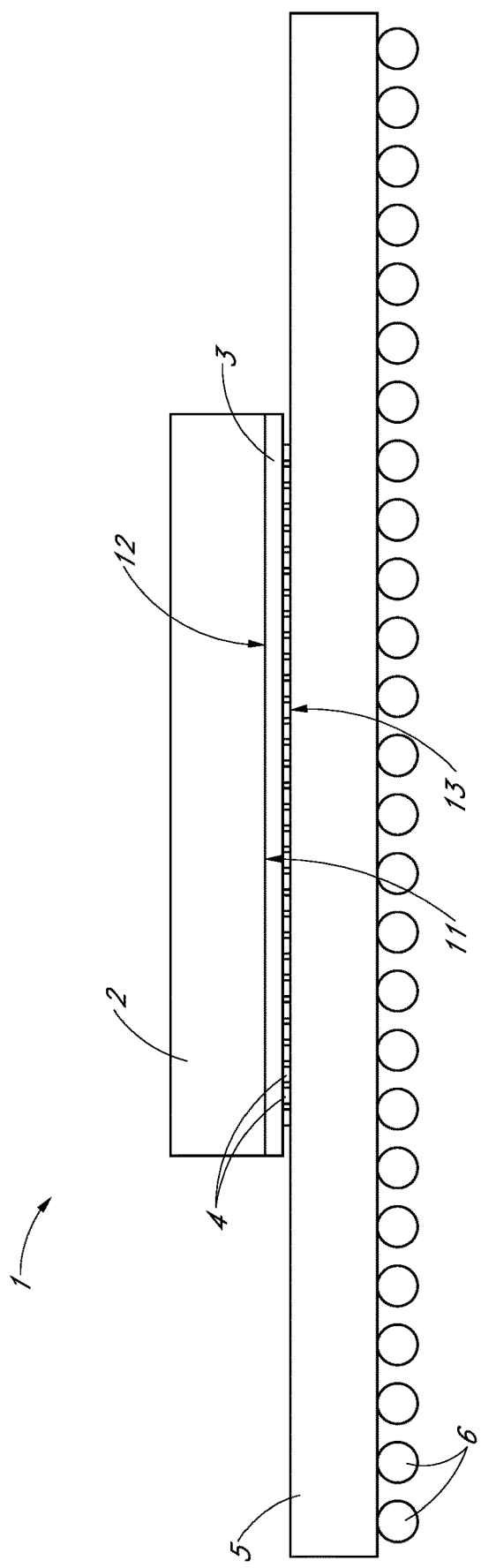
FIG. 1A is a schematic side view of a bonded structure mounted to a carrier such as a package substrate, according to various embodiments.

Various embodiments disclosed herein related to a bonded structure comprising a semiconductor element and a passive electronic component directly bonded to the semiconductor element without an intervening adhesive. In various embodiments, the passive electronic component comprises a capacitor. In other embodiments, the passive electronic component can comprise other devices, such as an inductor, a resistor, a voltage regulator, a filter, and/or a resonator. Beneficially, the passive electronic component can be integrated into a layer of passive components that is directly bonded to the semiconductor element (such as an integrated device die). In the illustrated embodiments, for example, the layer of passive components can be disposed between the semiconductor element and another system component such as an interposer, system substrate, etc. The passive electronic component described herein can thereby reduce the space occupied by passive components at the integrated device, at the package, and/or at the system board. Moreover, positioning the passive electronic component closer to active components of the semiconductor element can beneficially reduce overall inductance, which can improve the bandwidth and signal integrity of the semiconductor element, as compared with passive devices that are mounted to the package substrate or system board. In addition, the overall capacitance provided by the disclosed embodiments enables significantly higher capacitances (and reduced inductance) as compared with discrete passives mounted to a die.

In various embodiments, the passive component can comprise a layered capacitor structure with a massive capacitance. In some embodiments, for example, high dielectric constant (high K) wafer or sheets can be created with layered capacitors. A wafer-to-wafer bonding layer can be provided on a first element, such as a first semiconductor element or wafer (e.g., a processor wafer comprising a plurality of processors), and a second element, such as a second semiconductor element or wafer (e.g., a capacitor wafer that defines one or a plurality of capacitors). The first and second elements disclosed herein can comprise semiconductor elements that are formed of a semiconductor material, or can comprise other non-semiconductor elements, such as various types of optical devices (e.g., lenses, filters, waveguides, etc.). In various embodiments, an additional direct bonding layer can be added and prepared for direct bonding to both the capacitor wafer and the processor wafer. The layered capacitor structures disclosed herein may be used as alternating current (AC) coupling capacitors connected in series to a signal path to filter out direct current (DC) components of signals for balanced high-speed signaling. The layered capacitor structure may also be used as a decoupling capacitor with high capacitance and extremely low parasitic inductance and resistance for reducing system power delivery network (PDN) impedance. Results show the capacitor structure enables operation for all frequency ranges with PDN impedance reduced by more than 1000 times compared with the use of discrete capacitors mounted to the die or package substrate.

The direct bond between the semiconductor element and the passive component can include a direct bond between corresponding conductive features of the semiconductor element (e.g., a processor die or wafer) and the passive component (e.g., a bond pad of the semiconductor element and a corresponding contact pad of the passive component) without an intervening adhesive, without being limited thereto. In some embodiments, the conductive features may be surrounded by non-conductive field regions. To accomplish the direct bonding, in some embodiments, respective bonding surfaces of the conductive features and the non-conductive field regions can be prepared for bonding. Preparation can include provision of a nonconductive layer, such as silicon oxide, with exposed conductive features, such as metal bond pads or contacts. The bonding surfaces of the conductive features and non-conductive field regions can be polished to a very high degree of smoothness (e.g., less than 20 nm surface roughness, or more particularly, less than 5 nm surface roughness). In some embodiments, the surfaces to be bonded may be terminated with a suitable species and activated prior to bonding. For example, in some embodiments, the non-conductive surfaces (e.g., field regions) of the bonding layer to be bonded, such as silicon oxide material, may be very slightly etched for activation and exposed to a nitrogen-containing solution and terminated with a nitrogen-containing species. As one example, the surfaces to be bonded (e.g., field regions) may be exposed to an ammonia dip after a very slight etch, and/or a nitrogen-containing plasma (with or without a separate etch). In a direct bond interconnect (DBI) process, nonconductive features of the die and the passive component layer can directly bond to one another, even at room temperature and without the application of external pressure, while the conductive features of the die and the passive component layer can also directly bond to one another, without any intervening adhesive layers. Bonding by DBI forms stronger bonds than Van der Waals bonding, including significant covalent bonding between the surfaces of interest.

In some embodiments, the respective conductive features can be flush with the exterior surfaces (e.g., the field regions) of the semiconductor element and the passive component. In other embodiments, the conductive features may extend above the exterior surfaces. In still other embodiments, the conductive features of one or both of the semiconductor element and the passive component layer are recessed relative to the exterior surfaces (e.g., nonconductive field regions) of the semiconductor element and the passive component. For example, the conductive features can be recessed relative to the field regions by less than 20 nm, e.g., less than 10 nm.

Once the respective surfaces are prepared, the nonconductive field regions (such as silicon oxide) of the semiconductor element can be brought into contact with corresponding nonconductive regions of the passive component. The interaction of the activated surfaces can cause the nonconductive regions of the semiconductor element to directly bond with the corresponding nonconductive regions of the passive component without an intervening adhesive, without application of external pressure, without application of voltage, and at room temperature. In various embodiments, the bonding forces of the nonconductive regions can include covalent bonds that are greater than Van der Waals bonds and exert significant forces between the conductive features. Prior to any heat treatment, the bonding energy of the dielectric-dielectric surface can be in a range from 150-300 mJ/m$^2$, which can increase to 1500-4000 mJ/m$^2$ after a period of heat treatment. Regardless of whether the conductive features are flush with the nonconductive regions or recessed, direct bonding of the nonconductive regions can facilitate direct metal-to-metal bonding between the conductive features. In various embodiments, the semiconductor element and the passive component may be heated after bonding at least the nonconductive regions. As noted above, such heat treatment can strengthen the bonds between the nonconductive regions, between the conductive features, and/or between opposing conductive and non-conductive regions. In embodiments where one or both of the conductive features are recessed, there may be an initial gap between the conductive features of the semiconductor element and the passive component layer, and heating after initially bonding the nonconductive regions can expand the conductive elements to close the gap. Regardless of whether there was an initial gap, heating can generate or increase pressure between the conductive elements of the opposing parts, aid bonding of the conductive features and form a direct electrical and mechanical connection.

In some embodiments, the capacitance can be improved by providing capacitors that have electrode surfaces generally disposed along a direction non-parallel to (e.g., generally perpendicular to) a major lateral surface of the element (e.g., a semiconductor element). The undulations that provide the increased surfaces can be relatively simply patterned, compared to multiple layers and masks for producing laterally extending fins. The capacitor can comprise first and second electrodes that include major surfaces extending along the non-parallel direction and spaced apart by an intervening dielectric. The vertically-disposed undulations (e.g., trenches) of the capacitor can have a high aspect ratio, e.g., a first height of the first electrode along the non-parallel direction can be longer than a width of the capacitor along the major lateral surface. The aspect ratio, which can be defined by the first height divided by the width, can be greater than 5:1. In such embodiments, providing the capacitor primarily vertically relative to the semiconductor element can beneficially increase the overall surface area of the electrodes, improving capacitance relative to other arrangements.

Additional details of the direct bonding processes used in conjunction with each of the disclosed embodiments may be found throughout U.S. Pat. Nos. 7,126,212; 8,153,505; 7,622,324; 7,602,070; 8,163,373; 8,389,378; and 8,735,219, and throughout U.S. patent application Ser. Nos. 14/835,379; 62/278,354; 62/303,930; and Ser. No. 15/137,930, the contents of each of which are hereby incorporated by reference herein in their entirety and for all purposes.

FIG. 1A is a schematic side view of a bonded structure 1 mounted to a carrier such as a package substrate 5, according to various embodiments. The illustrated carrier comprises a package substrate, but in other embodiments, the carrier can comprise an integrated device die or any other suitable element. The package substrate 5 can comprise any suitable substrate configured to mount to a system motherboard. For example, in various embodiments, the package substrate 5 can comprise a printed circuit board (PCB), an interposer, a leadframe, a ceramic substrate, a polymer substrate, or any other suitable carrier. As shown in FIG. 1A, the package substrate 5 can comprise a plurality of solder balls 6 to provide electrical connection with the system motherboard (not shown). In other embodiments, the package substrate 5 can electrically connect to the system motherboard in other ways.

In FIG. 1A, the bonded structure 1 comprises an element (e.g., a semiconductor element 2) and a passive electronic component 3 directly electrically and mechanically connected with the element 2. The element 2 illustrated in FIG. 1A comprises a semiconductor element such as a processor die, but other types of integrated device dies or semiconductor elements can be used. For example, in other embodiments, the element 2 can comprise a memory die, a microelectromechanical systems (MEMS) die, an optical device or die, an interposer, a reconstituted die or wafer, or any other suitable device or element. In various embodiments, the element 2 illustrated herein can instead comprise a non-semiconductor element such that the passive electronic component 3 can be mechanically and electrically connected to other types of elements, such as optical elements (e.g., optical lenses, waveguides, filters, etc.), which may or may not comprise a semiconductor material.

As explained herein, in various applications (such as high speed communications or power dies), it can be important to provide passive electronic components (such as a capacitor) near the active circuitry of the semiconductor element 2 in order to reduce the overall impedance and/or inductance, which can accordingly improve the signal integrity and reduce switching noise. Thus, as shown in FIG. 1A, the passive electronic component 3 can be bonded to an active surface 11 of the semiconductor element 2, i.e., active electronic circuitry can be defined at or near the active surface 11 of the semiconductor element 2. In the illustrated embodiment, the passive electronic component 3 is directly bonded to the active surface 11 of the semiconductor element 2 without an intervening adhesive. In other embodiments, however, the passive electronic component 3 can be adhered to the semiconductor element 2, e.g., by way of a microbump array with reflow, conductive pillars, or by a thermocompression bond. Beneficially, bonding the passive electronic component 3 to the front or active surface 11 of the semiconductor element 2 can reduce the length of the signal lines and the overall impedance and/or inductance, as compared with systems which mount passive devices at the system board or package substrate. The passive component 3 can reduce the voltage requirements for the semiconductor element 2 by acting to quiet the noisy components therein. Moreover, bonding the passive electronic component 3 to the semiconductor element 2 can reduce the overall dimensions of the package, since the passives occupy a thin layer bonded to the semiconductor element 2. The skilled artisan will appreciate, however, direct bonding of passive electronic components between a carrier and a semiconductor element, for example, by way of through silicon vias (TSVs) on the back side thereof.

As shown in FIG. 1A, the passive electronic component 3 can comprise a first surface 12 directly bonded to the semiconductor element 2 and a second exterior surface 13 opposite the first surface 12 of the passive electronic component 3. A plurality of electrical contacts 4 (e.g., solder balls) can be provided on the second exterior surface 13 of the passive electronic component 3. The plurality of electrical contacts 4 can be configured to electrically connect to an external semiconductor element, such as the package substrate 5 shown in FIG. 1A (e.g., a printed circuit board, an interposer, etc.). Alternatively, the second surfaces 13 can have exposed contacts or pads that are configured for direct bond connection to another element that serves as a carrier for the bonded structure, such as another semiconductor element (e.g., die or interposer).

As shown in FIG. 1A, the passive electronic component 3 can cover (e.g., can be disposed over) a majority of the active surface 11 of the semiconductor element 2, e.g., a majority of the surface of the semiconductor element 2 that is used for processing or other active tasks. For example, in various embodiments, the passive electronic component 3 can cover at least 55%, at least 65%, at least 75%, at least 85%, at least 95%, at least 99%, or at least 100% of the active surface 11 of the semiconductor element 2. In FIG. 1A, a single unitary passive component 3 is shown as covering substantially the entire active surface 11 of the semiconductor element 2; however, in other embodiments, the passive component 3 can comprise a plurality of discrete or separate passive components that are bonded to cover a majority of the active surface 11 of the element 2. In addition, in other embodiments, the passive electronic component 3 may be mechanically and electrically connected to the back side of the semiconductor element 2, i.e., the surface opposite the active surface 11. In such arrangements, the length of conductors within the element 2 may be sufficiently short so as to sufficiently reduce impedance relative to routing to separate surface mounted passives on a packaging substrate, even though the passive component 3 is mounted to the back side of the element 2. Moreover, as shown in FIG. 1A, the passive electronic component 3 can comprise a sheet that is bonded (e.g., directly bonded without an intervening adhesive) to the semiconductor element 2, i.e., the passive electronic component 3 can be dimensioned so as to have a lateral width that is significantly larger than its thickness. For example, the passive electronic component 3 can have a lateral width (e.g., as defined along a direction parallel to the active surface 11 of the element 2) that is at least 3 times, at least 5 times, at least 10 times, or at least 50 times its thickness (e.g., as defined along a direction perpendicular to the active surface 11 of the element 2) of the component 3.

The passive electronic component 3 can be provided on a sacrificial wafer (e.g., silicon or glass), and the semiconductor element 2 can also be provided on a wafer. The two wafers can be directly bonded to one another at the wafer level (e.g., wafer-to-wafer or W2W), such that a plurality of passive components 3 can be bonded to a corresponding plurality of semiconductor elements 2, which can improve manufacturing throughput. After bonding, the base material of the wafers can be thinned or removed prior to or after dicing. In other embodiments, the passive electronic component 3 can be picked and placed on the semiconductor element 2, or can be bonded to the semiconductor element 2 using other processing techniques.

FIG. 1B is a schematic side view of a semiconductor element 2 comprising a bulk material portion 37 (e.g., bulk semiconductor material) and active surface 11, and a passive electronic component 3 prior to forming a bonded structure 1. Unless otherwise noted, the features of FIG. 1B may be the same as or generally similar to like-numbered features of FIG. 1A. As explained above, the passive component 3 and the semiconductor element 2 can comprise respective bonding layers 8a, 8b (see also FIG. 2). In the illustrated embodiment, the bonding layer 8a of the passive electronic component 3 can comprise one or a plurality of conductive features 9a, 9a', such as metal, surrounded by non-conductive field regions (see FIG. 2), such as a form of silicon oxide material. Similarly, the bonding layer 8b can comprise one or a plurality of conductive features 9b, 9b', such as metal, surrounded by non-conductive field regions (see FIG. 2), such as silicon oxide. The conductive features 9a, 9a', 9b, 9b' can act as electrical interconnects to provide electrical communication between the semiconductor element 2 and the passive component 3. The conductive features 9a, 9a', 9b, 9b' can comprise any suitable metal or conductor, such as copper. As explained above, the conductive features 9a, 9a', 9b, 9b' can be recessed below, can protrude above, or can be flush with, exterior surfaces of the non-conductive field regions.

In the embodiment of FIG. 1B, the conductive feature 9a can comprise a first terminal (e.g., an anode of a capacitive device), and the other conductive feature 9a' can comprise a second terminal (e.g., a cathode of a capacitive device) that is of a different type than the first terminal. Similarly, the conductive feature 9b can comprise a first terminal of the element 2 (e.g., an anode), and the other conductive feature 9a' can comprise a second terminal of the element 2 (e.g., a cathode) that is of a different type than the first terminal. Beneficially, various embodiments disclosed herein can include both the anode and the cathode (e.g., conductive features 9a, 9a') on the same first surface 12 of the passive electronic component 3. Thus, respective anode terminals 9b of the semiconductor element 2 can bond and electrically connect to corresponding respective anode terminals 9a of the passive electronic component 3 disposed on the first surface 12. Respective cathode terminals 9b' of the semiconductor element 2 can bond and electrically connect to corresponding respective cathode terminals 9a' of the passive electronic component 3 disposed on the first surface 12.

Advantageously, providing the anode terminal 9a and the cathode terminal 9a' on the same first surface 12 of the passive electronic component 3 can enable wafer level bonding of two structures along the same side of the passive component 3 (e.g., bonding of the semiconductor element 2 and the passive component 3). Thus, in the embodiments, disclosed herein, each opposing side of the passive component 3 can comprise one or a plurality of anodes and one or a plurality of cathodes (e.g., terminals of different types). In various embodiments, one or both sides of the component 3 can comprise one or more dummy terminals. An element (such as semiconductor element 2) can have contacts connected (e.g., bonded) to corresponding anode and cathode terminals on one side (e.g., a first side) of the passive component. A second element (such as another semiconductor element, a package substrate, etc.) can have contacts connected (e.g., bonded) to corresponding second anode and cathode terminal on the opposite side (e.g., a second side) of the passive component 3. In the illustrated embodiment of FIG. 1B, for example, the element 2 can connect to corresponding first and second terminals which are of a different type (e.g., anode and cathode terminals) on a first side of the passive component 3. Another element (not shown) such as a package substrate can connect to corresponding first and second terminals which are of a different type (e.g., anode and cathode terminals) on the second opposite side of the passive component 3, for example, by way of the interconnects 4 (which may comprise solder balls).

In various embodiments, the anode terminals 9a, 9b are directly bonded to one another without an intervening adhesive. Similarly, the cathode terminals 9a', 9b' can also be directly bonded to one another without an intervening adhesive. In various embodiments, the respective anode terminals 9a, 9b and cathode terminals 9a', 9b' can be connected by way of thermocompression bonding. In other embodiments, the respective anode terminals 9a, 9b and cathode terminals 9a', 9b' can be connected in other ways, e.g., by way of a conductive adhesive, such as solder, anisotropic conductive film, etc. Furthermore, as shown in FIG. 1B, various portions of the passive component 3 can have different types of interconnects and/or passive components. For example, one portion of the passive electronic component 3 can comprise a multilayer capacitive portion, similar to the portion illustrated in FIG. 2, and another portion of the passive electronic component 3 can comprise a series capacitive interconnect similar to what is shown in FIG. 4A. In still other portions of the passive electronic component, a low resistance electrical pathway (e.g., a through interconnect), such as that shown in FIG. 3A, may be provided. Moreover, passive electronic components such as those shown in FIGS. 7A-7C may also include anode and cathode terminals 9a, 9a' on the same side of the component.

Figure 2:
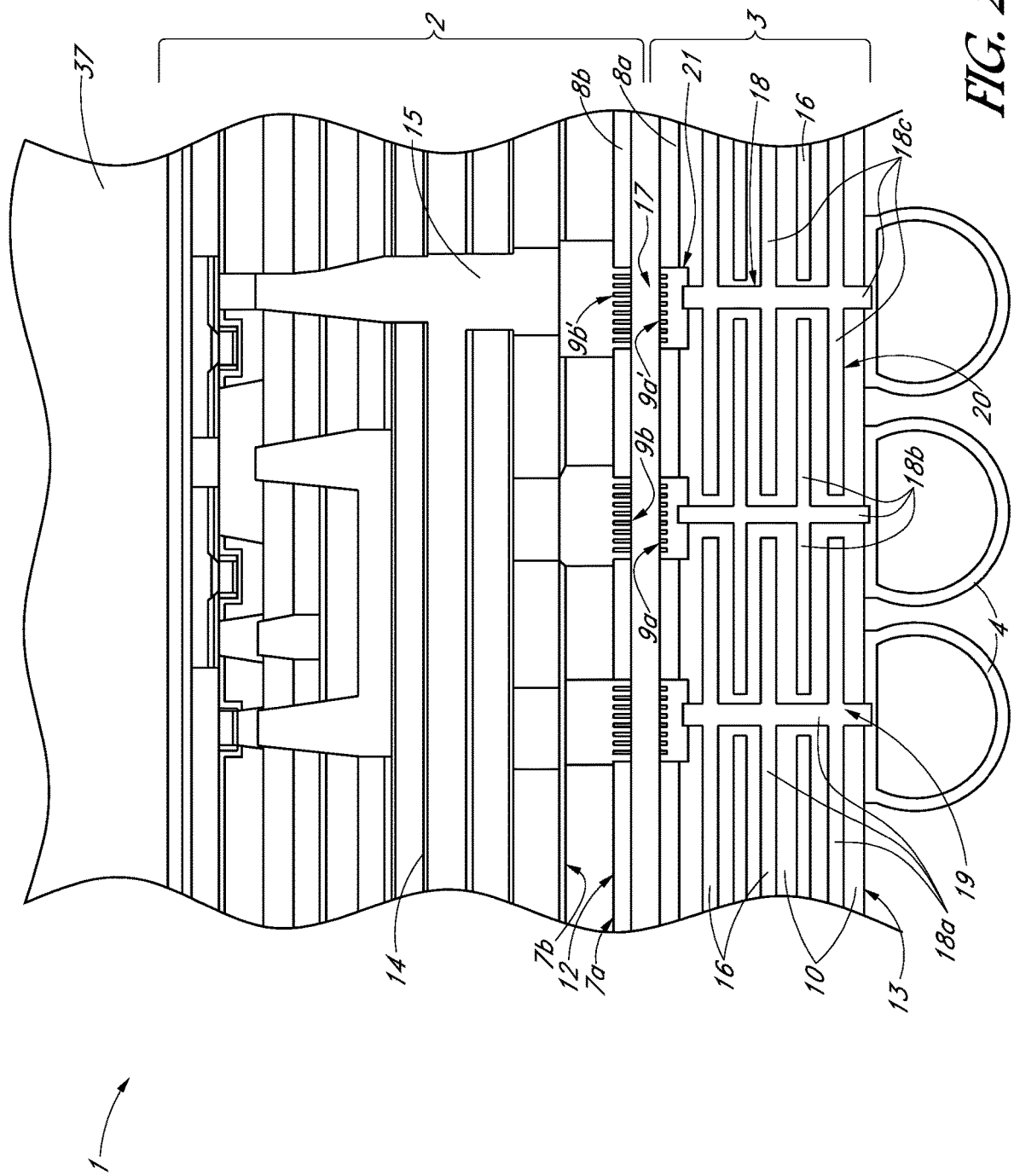
FIG. 2 is a schematic, magnified side cross-sectional view of portions of the bonded structure shown in FIG. 1A.

FIG. 2 is a schematic, magnified side cross-sectional view of portions of the semiconductor element 2 and the passive electronic component 3 shown in FIGS. 1A-1i, just prior to direct bonding. As explained above, the passive component 3 can comprise a bonding layer 8a, and the semiconductor element 2 can comprise a bonding layer 8b. In the illustrated embodiment, the bonding layer 8a can comprise one or a plurality of conductive features 9a, 9a', such as metal, surrounded by non-conductive field regions 7a, such as a form of silicon oxide material. Similarly, the bonding layer 8b can comprise one or a plurality of conductive features 9b, 9b', such as metal, surrounded by non-conductive field regions 7b, such as silicon oxide. The conductive features 9a, 9a', 9b, 9b' can act as electrical interconnects to provide electrical communication between the semiconductor element 2 and the passive component 3. The conductive features 9a, 9a', 9b, 9b' can comprise any suitable metal or conductor, such as copper. As explained above, the conductive features 9a, 9a', 9b, 9b' can be recessed below, can protrude above, or can be flush with, exterior surfaces of the non-conductive field regions 7a, 7b. The non-conductive field regions 7a, 7b can comprise any suitable non-conductive material, such as silicon oxide, undoped or very lightly doped silicon, silicon nitride, etc., that can be prepared for direct bonding.

As explained above, the bonding layers 8a, 8b can be polished (e.g., by chemical mechanical polishing, or CMP) to a very low surface roughness (e.g., RMS roughness less than 20 nm, or more particularly, less than 5 nm). As explained above, the bonding layers 8a, 8b (e.g., the non-conductive field regions 7a, 7b) can be activated and terminated with a suitable species, such as nitrogen, e.g., by way of exposure to a nitrogen-containing plasma (e.g., in a reactive ion etch) or by very slightly etching and subsequently exposing to a nitrogen-containing (e.g., ammonia) solution. The bonding layers 8a, 8b can be brought together at room temperature in some embodiments to form a direct bond between the field regions 7a, 7b. The semiconductor element 2 and the passive component 3 can be heated to strengthen the bond between the field regions 7a, 7b, and/or to cause the conductive features 9a and 9b, and 9a' and 9b' to expand and form an electrical connection. Beneficially, the use of a direct bond can provide a low impedance and low inductance electrical pathway between the semiconductor element 2 and the passive component 3, which can improve power or signal integrity.

As shown in FIG. 2, the semiconductor element 2 can comprise internal conductive traces 14 and vias 15 to route electrical signals within the semiconductor element 2 and/or between the semiconductor element 2 and the passive electronic component 3. The electrical signals can pass through the conductive features 9a, 9a' and 9b, 9b' (which may be directly bonded to one another, respectively) to and/or from the passive electronic component 3. The conductive features 9a, 9a' can define, can act as, or can connect to a contact pad 21 at or near the first surface 12 of the passive electronic component 3. As shown in FIG. 2, in various embodiments, the passive electronic component 3 can comprise a plurality of (e.g., two or more, or three or more) conductive layers 16 spaced apart by one or a plurality of dielectric or nonconductive layers 10. As show in FIG. 2, the bonded structure 1 can include conductive features 9a, 9a', 9b, 9b' that define an interconnect structure 17 that includes the contact pads 21 and electrical pathways or interconnects 18 between the semiconductor element 2 and the electrical contacts 4 on the second surface 13 of the passive electronic component 3. In FIG. 2, a plurality of conductive features 9a, 9a', 9b, 9b' are shown on each of the bonding layers 8a, 8b, which may reduce dishing. However, in other embodiments, the contact pads 21 may be defined sufficiently small so as to avoid the effects of dishing during processing. In such arrangements, each contact pad 21 can comprise one conductive feature.

Although FIG. 2 illustrates three contact pads 21 and three interconnects 4, in various embodiments, the number of contact pads 21 and interconnects 4 may differ. For example, in some embodiments, the pitch of the contact pads 21 on the semiconductor element 2 and/or passive component 3 may be smaller than the pitch of the interconnects 4. In various implementations, for example, the pitch of the interconnects 4 may be significantly greater than the pitch of the contact pads 21, e.g., the pitch of the interconnects 4 may be at least 10 times, at least 20 times, at least 30 times the pitch of the contact pads 21. As an example, the pitch of the interconnects 4 can be in a range of 100 microns to 300 microns, or in a range of 100 microns to 200 microns (e.g., about 150 microns). The pitch of the contact pads 21 can be in a range of 0.5 microns to 50 microns, in a range of 0.5 microns to 20 microns, or in a range of 1 micron to 10 microns (e.g., about 5 microns).

In some embodiments, a first conductive interconnect 18a extends from the first surface 12 (or the contact pad 21) to a corresponding electrical contact 4 at the second surface 13 of the passive electronic component 3. Second and third conductive interconnects 18b, 18c can also extend from the contact pad 21 to corresponding electrical contacts 4 at the second surface 13. In FIG. 2, for example, each of the conductive electrical interconnects 18a-18c can comprise a longitudinal conductive portion 19 extending from a corresponding contact pad 21 at or near the first surface 12 to a corresponding electrical contact 4. As shown in FIG. 2, the longitudinal portions 19 can extend vertically through the thickness of the passive electronic component 3 (e.g., transverse to the active surface 11 of the semiconductor element 2). The conductive interconnects 18a-18c can include one or more lateral conductive portions 20 extending laterally outward from the longitudinal conductive portions 19. The longitudinal conductive portions 19 can define resistive electrical pathways, and the one or more lateral conductive portions 20 can define capacitive electrical pathways in parallel with the resistive electrical pathways. As shown in FIG. 2, the one or more lateral conductive portions 20 of the first interconnect 18a can be interleaved with the lateral portions 20 of the second interconnect 18b and can separated by the intervening dielectric layers 10. Similarly, the lateral conductive portions 20 of the second interconnect 18b can be interleaved with the lateral portions 20 of the third interconnect 18c and can separated by the intervening dielectric layers 10. The interleaving of the lateral portions 20 of the respective interconnects 18a-18c can define, at least in part, the respective capacitive electrical pathways, such that each lateral portion 20 acts as an electrode of a capacitor and the intervening dielectric layer 10 acts as the capacitor dielectric. In various embodiments, the dielectric layer 10 can comprise a high K dielectric layer, such as titanates, ($Ba_xSr_{1-x}TiO_3$, $Bi_4Ti_3O_{12}$, $PbZr_xTi_{1-x}O_3$), niobates ($LiNbO_3$), and/or zirconates ($BaZrO_3$, $CaZrO_3$ etc). In other embodiments, the dielectric layer 10 may comprise any suitable dielectric material, such as silicon oxide, silicon nitride, etc. In some embodiments, the dielectric layer can have a dielectric constant in a range of 1 to 1000. In some embodiments, the dielectric layer can have a dielectric constant in a range of 1 to 10. As explained above in connection with FIG. 1B, in the illustrated embodiment, the anode and cathode terminals of the passive component 3 may be disposed along the same side of the component 3.

In various embodiments, the first and third interconnect structures 18a, 18c can be configured to connect to a power source, and the second interconnect structure 18b can be configured to connect to electrical ground, or vice versa. The passive electronic component 3 of FIG. 2 can beneficially act as multi-layer decoupling capacitors in parallel connection between power and ground to reduce power delivery network (PDN) impedance so as to improve power integrity. Moreover, providing the decoupling capacitors (e.g., the capacitors defined by the interconnect structures 18a-18c) near the active surface 11 of the semiconductor element 2 (e.g., near switches of a processing die) can further improve the power integrity of the bonded structure 1. Decoupling capacitance (such as that provided by the disclosed embodiments) in the core region of the die can provide a stable power supply to the computation engines in electronic devices. Increasing this decoupling capacitance provides more stability in the voltage swings which reduces the amount of additional margins that are accommodated in timing analysis to account for voltage uncertainty. By contrast, adding decoupling capacitance in parallel plate structures offers relatively small capacitance values. Deep trench capacitors may provide higher capacitances but occupy a valuable footprint which may add area and cost to electronic devices.

FIG. 3A is a schematic side sectional view of a portion of a passive electronic component 3 configured for relatively low speed connections. FIG. 3B is a schematic circuit diagram of the passive electronic component 3 of FIG. 3A. As shown in FIG. 3A, the passive component 3 can comprise an electrical pathway 18 having a low resistance and low capacitance between the first and second surfaces 12, 13 of the passive component 3. For example, in FIG. 3A, the pathway 18 can include a longitudinal conductive portion 19 that directly connects the contact pad 21 and the electrical contact 4. The longitudinal conductive portion 19 acts to short the signal between the contact pad 21 and the contact 4. In addition, as shown in FIG. 3A, lateral conductive portions 20 can be disposed offset from the longitudinal conductive portion 19. The lateral conductive portions 20 can be spaced from one another along the thickness of the passive component 3 and can be separated by intervening dielectric layer(s) 10. The electrical pathway 18 defined in the passive component 3 of FIGS. 3A-3B may be suitable for relatively low speed connections, since the longitudinal conductive portion 19 shorts the connection between the contact pad 21 and the electrical contact 4.

FIG. 4A is a schematic side sectional view of a portion of a passive electronic component 3 configured for high speed series link signaling. FIG. 4B is a schematic circuit diagram of the passive electronic component 3 of FIG. 4A. In the series link, the passive electronic component 3 can act as a DC-blocking capacitor, which can serve various purposes. For example, the passive electronic component 3 can regulate the average DC-bias level (e.g., filtering out the DC component), can protect the transmitter/receiver from destructive overload events that can occur due to poor power-up sequencing, and/or can function as part of a circuit that detects when the lines are disconnected. In these applications, the DC-blocking capacitor does not distort the high frequency components of signals passing through it. In various embodiments, all high frequency components, except the DC component of a signal, can pass through without any distortion. Hence, a large capacitance value with low connection parasitic resistance and/or inductance can be provided. The embodiment of FIGS. 4A-4B can be beneficial for frequencies of at least 500 MHz, although in other embodiments, lower frequency ranges may be used in conjunction with the disclosed embodiments. As shown in FIG. 4A, the passive electronic component 3 can comprise an electrical pathway that includes a multi-layer capacitor disposed between the contact pad 21 and the electrical contact 4. Indeed, unlike the embodiment of FIG. 3A, in FIG. 4A, the pathway 18 between the contact pad 21 and the contact 4 is a capacitive electrical pathway defined by a plurality of lateral conductive portions 20 spaced apart by intervening dielectric layer(s) 10 through the thickness of the passive electronic component 3. The multiple layers shown in FIG. 4A can function electrically as multiple capacitors electrically connected in series. The effective capacitance provided by the pathway 18 of FIG. 4A can be in a range of 10 nF/mm$^2$ to 1 µF/mm$^2$. Beneficially, in the illustrated embodiment, the capacitor(s) defined along the electrical pathway 18 can filter out DC components of signals to provide balanced, high-speed signaling (e.g., the pathway 18 can act as a high pass filter). Moreover, positioning the passive component 3 closer to the active circuitry of the semiconductor element 2 can further improve the performance of the bonded structure 1 and can reduce reflection noises.

FIGS. 5A-5I illustrate another embodiment in which a passive electronic component 3 is bonded (e.g., directly bonded) to a semiconductor element 2. As explained above in connection with FIG. 1B, in FIGS. 5A-5I, the anode and cathode terminals of the passive electronic component 3 can be disposed along the same side or surface of the component 3. In various arrangements, the passive component 3 can comprise a high dielectric constant (a high K) thin film capacitor layer with integrated interconnects for direct bonding and integration with other components, such as a processor. For example, in the embodiments of FIGS. 5A-5I, the passive component 3 can comprise dielectric materials that have a dielectric constant greater than 5, greater than 10, greater than 20, or greater than 100. Such high K materials may be difficult to manufacture, and may be processed at high temperatures that may be unsuitable for exposing other types of devices (e.g., processor or other semiconductor manufacture), such that it is difficult to integrate such materials into a conventional semiconductor device. Accordingly, in the embodiments disclosed herein, the semiconductor element 2 can be manufactured in one facility (e.g., a complementary metal oxide semiconductor, or CMOS, facility), and the passive component 3 can be manufactured in another facility that can accommodate the processing parameters for the high K materials. The semiconductor element 2 and the passive component 3 can be provided with bonding layers and can be directly bonded so as to connect the semiconductor element 2 and the passive component 3. Thus, the embodiments disclosed herein can enable the separate manufacture and subsequent integration of thin film, high K dielectric materials with any suitable type of semiconductor or optical element.

Figure 5A:
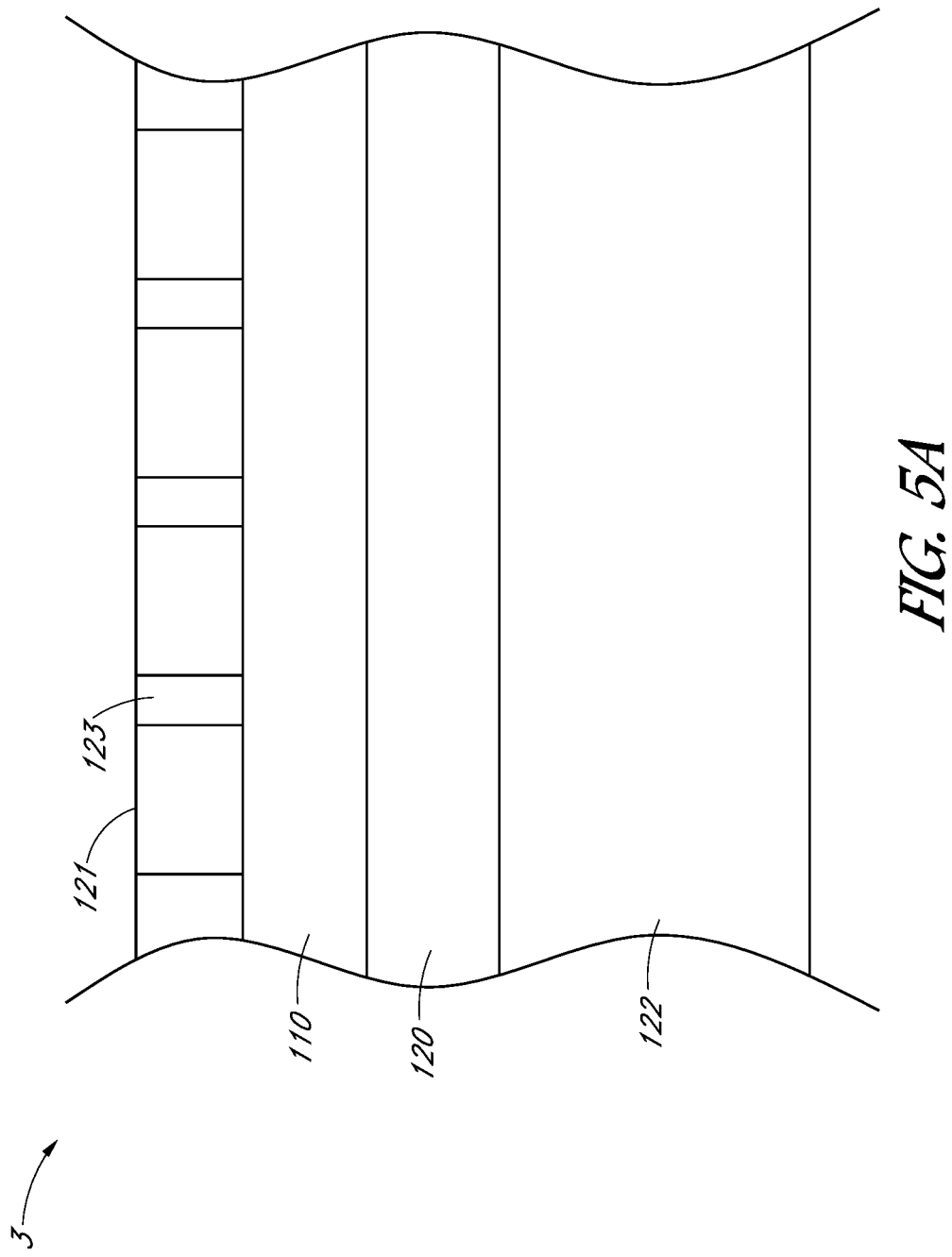
FIG. 5A is a schematic side sectional view of a passive electronic component that incorporates a high K dielectric material to define a capacitive sheet.

FIG. 5A is a schematic side sectional view of a passive electronic component 3 that incorporates a high K dielectric material to define a capacitive sheet. The passive electronic component 3 can comprise a base 122 upon which the capacitive sheet can be defined. The base 122 may be sacrificial, such that the base 122 can be removed prior to bonding the passive component 3 to the semiconductor element 2. In various embodiments, the base 122 can comprise a semiconductor material, such as silicon. A first electrode 120 can be formed on the base 122 in any suitable manner. For example, the first electrode 120 can be deposited on the base 122 using a metal organic chemical vapor deposition (MOCVD) process, a physical vapor deposition (PVD) or sputtering process, or a sol-gel process (spin on and cure). The first electrode 120 can comprise a refractory metal, such as platinum (Pt) or ruthenium (Ru). In the illustrated embodiment, the first electrode 120 can be deposited as a continuous or blanket film atop the base 122, and can serve as a common electrode for multiple capacitors.

A high K dielectric layer 110 can be deposited or otherwise formed on the first electrode 120. For example, in various embodiments, the dielectric layer 110 can be deposited using CVD, PVD, powder sintering, or other suitable techniques. Beneficially, the dielectric layer 110 can have a dielectric constant greater than 5, greater than 10, greater than 20, greater than 100, or greater than 200 (e.g., about 300), or greater than 1000. In various embodiments, for example, the dielectric layer can comprise a complex oxide high K material, such as the ternary oxide barium strontium titanate (BaSrTiO$_3$ or BST), other titanates, (Ba$_x$Sr1-xTiO3, Bi4Ti3O12, PbZrxTi1-xO3), niobates (LiNbO3), and/or zirconates (BaZrO3, CaZrO3 etc). Unlike the embodiment of FIGS. 2-4B, therefore, only a single thin dielectric layer (rather than alternating multiple layers with conductors) may be used with the passive component 3. In some embodiments, multiple layers of dielectric material may be provided to form the dielectric layer 110.

A second electrode 121 can be deposited on the dielectric layer 110. The second electrode 121 can be any suitable conductive material, such as a refractory metal, and particularly a noble metal (e.g., Pt or Ru). The refractory or noble metals of one or both of the first electrode 120 and the second electrode 121 (e.g., Pt) can beneficially form a Schottky barrier (as opposed to ohmic contact) which can improve the performance of the capacitor. In the illustrated embodiment, therefore, the refractory or noble metals of the electrodes 120, 121 can remain in the final bonded structure 1 to provide improved performance. In some embodiments, the noble or refractory metal of the first and/or second electrodes 120, 121 can be plated with another metal (e.g., copper) to reduce resistance. In other embodiments, however, the first and/or second electrodes 120, 121 may be removed after formation of the passive component 3 and replaced with another metal (e.g., copper) to serve as the first and second electrodes 120, 121.

The second electrode 121 can be patterned to define a number of gaps 123 between portions of the second electrode 121. Patterning the electrode into a plurality of portions can define the overall capacitance provided by passive electronic component 3. For example, larger portions of the second electrode 121 may provide increased area and increased capacitance, while smaller portions of the second electrode 121 may provide reduced area and reduced capacitance. In various embodiments, the passive component 3 can comprise an array of capacitive cells, with a cell being similar to that illustrated in FIG. 5A. In some embodiments, the passive component 3 can include cells having an effective capacitance per unit area of at least 5 $nF/mm^2$, at least 10 $nF/mm^2$, at least 20 $nF/mm^2$, at least 50 $nF/mm^2$, at least 100 $nF/mm^2$, or at least 200 $nF/mm^2$. For example, in various embodiments, the passive component 3 can include cells having an effective capacitance per unit area in a range of 5 $nF/mm^2$ to 400 $nF/mm^2$, in a range of 10 $nF/mm^2$ to 300 $nF/mm^2$, in a range of 10 $nF/mm^2$ to 250 $nF/mm^2$, in a range of 10 $nF/mm^2$ to 150 $nF/mm^2$, or in a range of 10 $nF/mm^2$ to 100 $nF/mm^2$. In some embodiments, for example, the passive component 3 can include cells having an effective capacitance per unit area in a range of 1 $nF/mm^2$ to 10 $nF/mm^2$, in a range of 10 $nF/mm^2$ to 100 $nF/mm^2$, in a range of 100 $nF/mm^2$ to 400 $nF/mm^2$, or above 400 $nF/mm^2$ (e.g., in a range of 400 $nF/mm^2$ to 1000 $nF/mm^2$). Beneficially, only the high K dielectric material may be used, such that there are no low K materials in series with the high K material. By using only high K materials, the overall capacitance of the passive component 3 can be improved.

FIG. 5B is a schematic side sectional view of the passive electronic component 3 of FIG. 5A, with a bonding layer 8a provided over the second patterned electrode 121. The bonding layer 8a can act as an interconnect layer, such as a redistribution layer (RDL) to bond the passive electronic component 3 to other structures, such as the element 2. For example, as explained above, the bonding layer 8a can comprise conductive features 9a connected to or defining contact pads and surrounding non-conductive field regions 7a. The conductive features 9a can comprise any suitable metal such as copper. The field regions 7a can comprise any suitable non-conductive material, such as silicon oxide. As shown in FIG. 5B, the non-conductive field regions 7a can be disposed in the gaps 123 of FIG. 5A so as to electrically separate the patterned portions of the second electrode 121 to define separate capacitive cells in some embodiments. Advantageously, providing the bonding layer 8a (e.g, with metals such as copper) on the passive electronic component 3 can enable the use of a low temperature anneal (e.g., less than 150° C.) to improve the direct bond and to reduce or eliminate thermal mismatch of materials due to different coefficients of thermal expansion (CTE). FIG. 5C is a schematic side sectional view of a portion of the semiconductor element 2 prior to bonding. The semiconductor element 2 can be the same as or generally similar to the semiconductor element 2 shown in FIG. 2, with traces 14 and vias 15 providing electrical communication with the element 2 between the conductive features 9b and active circuitry.

Figure 5D:
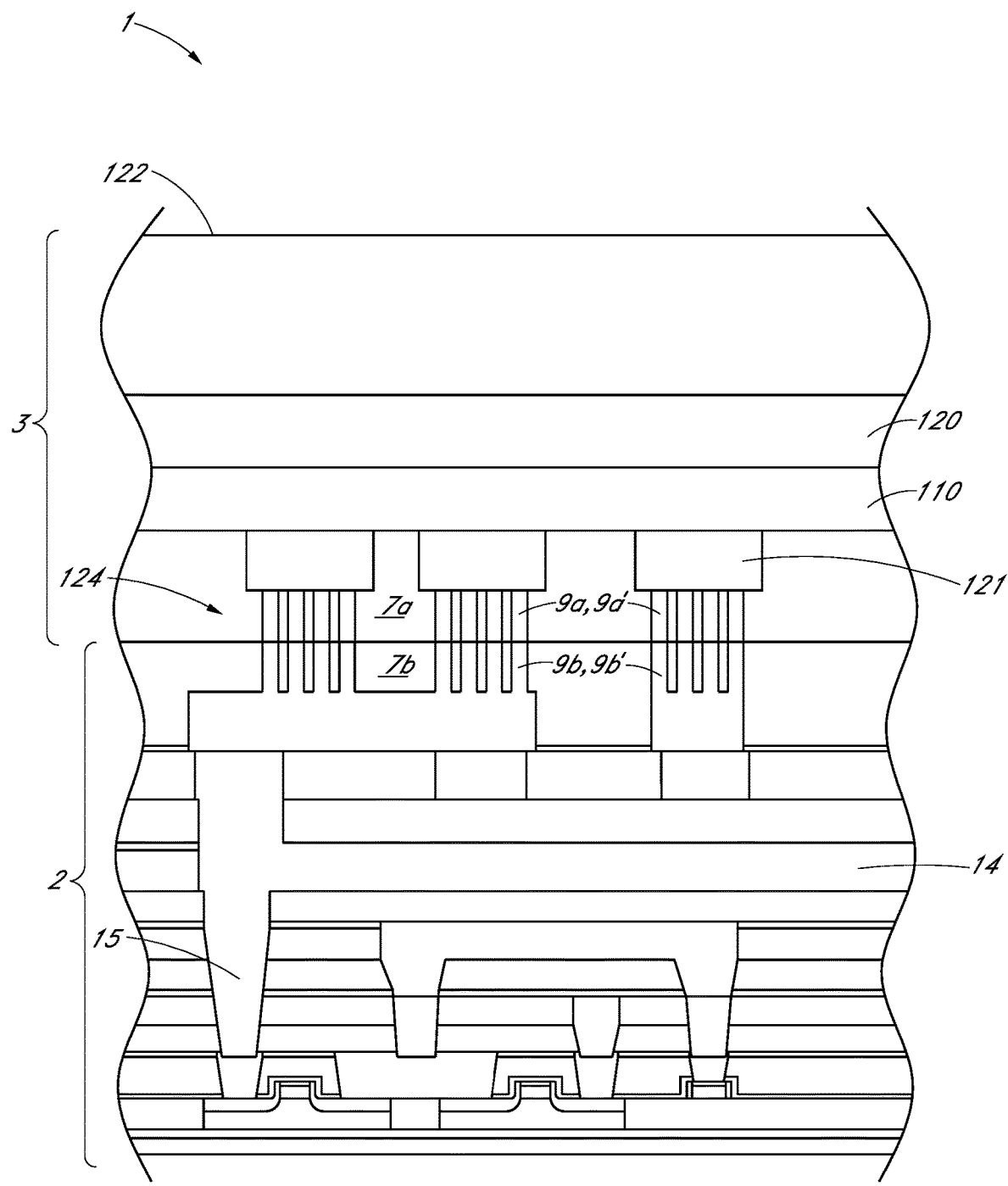
FIG. 5D is a schematic side sectional view of a bonded structure, in which the semiconductor element is directly bonded to the passive component that includes a high K dielectric material.

FIG. 5D is a schematic side sectional view of a bonded structure 1, in which the semiconductor element 2 is directly bonded to the passive component 3 that includes a high K dielectric material. As explained above, the bonding layers 8a, 8b of the passive component 3 and the semiconductor element 2 can be polished to a very low surface roughness. The polished surfaces can be activated and terminated with a desired species (such as nitrogen). The bonding layers 8a, 8b can be brought into direct contact (e.g., at room temperature) to form strong bonds between the respective field regions 7a, 7b, such as oxide materials. The structure 1 can be heated to increase the bond strength and to cause electrical connection between the conductive features 9a, 9b. Thus, as shown in FIG. 5D, the passive electronic component 3 can be directly bonded to the semiconductor element 2 along a direct bond interface 24 without an intervening adhesive. Beneficially, the use of a direct bond can provide a low impedance and low inductance electrical pathway between the semiconductor element 2 and the passive component 3, which can improve power or signal integrity. In other embodiments, however, the conductive features 9a, 9b can be adhered to one another with a conductive adhesive (e.g., solder) or can be bonded using thermocompression bonding techniques.

Figure 5E:
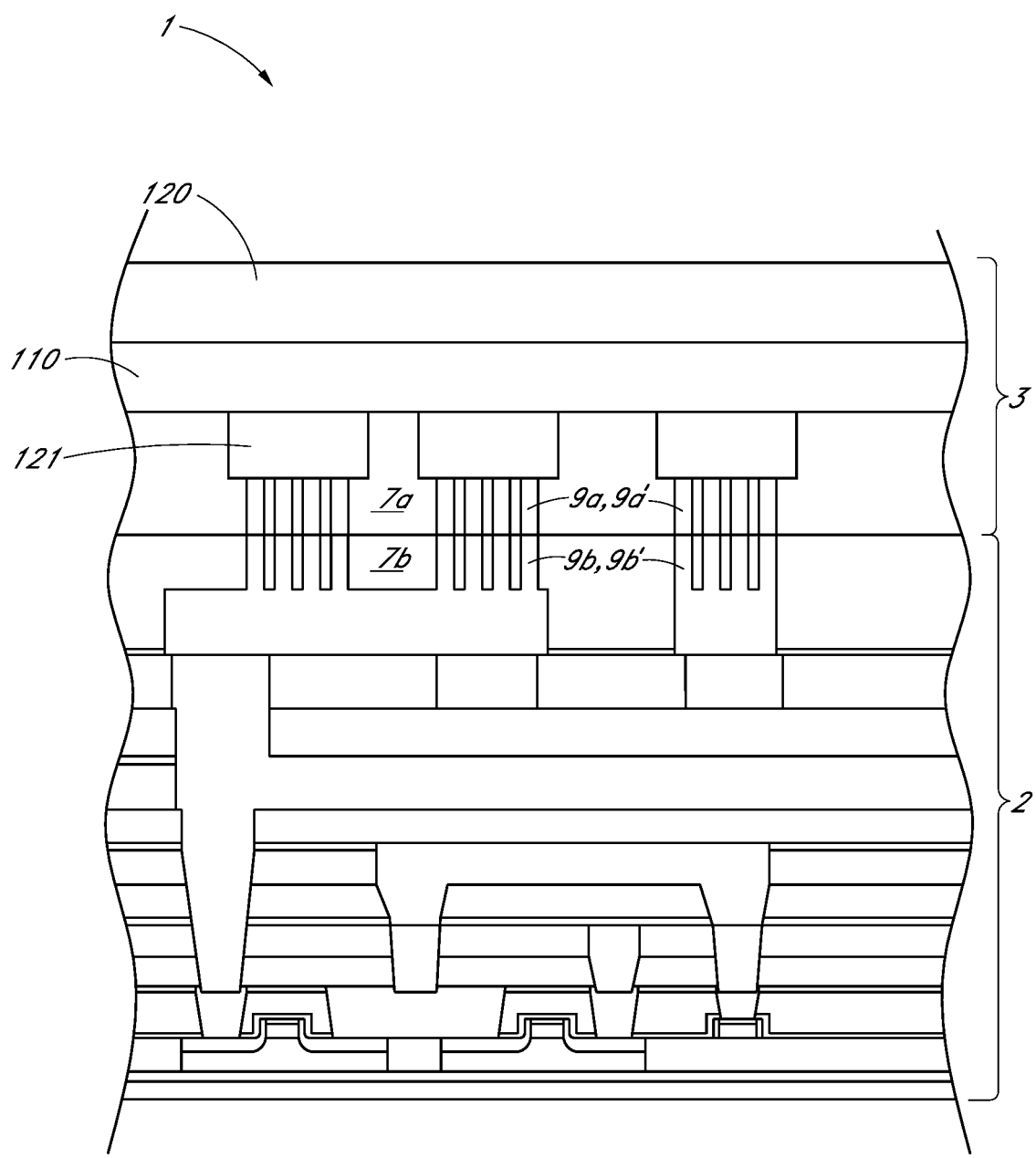
FIG. 5E is a schematic side sectional view of the bonded structure of FIG. 5D after removal of the sacrificial base.

As shown in FIG. 5E, the base 122 can be removed from the backside of the passive electronic component 3 (for example, by grinding, polishing, etching, etc.). In some embodiments, the first electrode 120 may also be patterned to further define the capacitance of the component 3. For example, noble or refractory metals can be used during processing to define the passive electronic component 3. In some arrangements, it may be desirable to add or deposit an additional metal electrode on the refractory metal to reduce the pad resistance or to meet a specific integration requirement. In other embodiments, however, the noble or refractory metals that serve as the first and second electrodes 120, 121 may not be removed and may thus remain in the resulting bonded structure 1. These noble or refractory metals may or may not be patterned to produce additional discrete electrode regions. In other embodiments, the first electrode 120 and/or the second electrode 121 can comprise sacrificial materials that can be removed and replaced by other metals. In FIG. 5E, the passive electronic component 3 is illustrated as being laterally wider than the semiconductor element 2. However, it should be appreciated that the passive electronic component 3 may cover only a portion of the semiconductor element 2. For example, as explained above, the passive component 3 can cover at least 55%, at least 65%, at least 75%, at least 85%, at least 95%, at least 99%, or at least 100% of the active surface 11 of the semiconductor element 2.

Figure 5G:
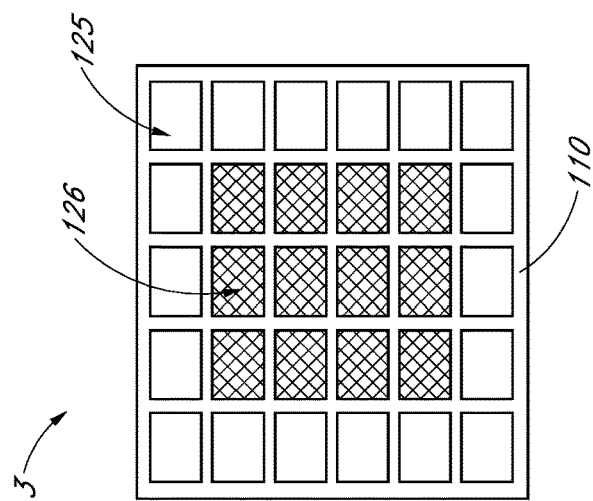
FIG. 5G is a top plan view of the passive electronic component of FIG. 5F.
Figure 5F:
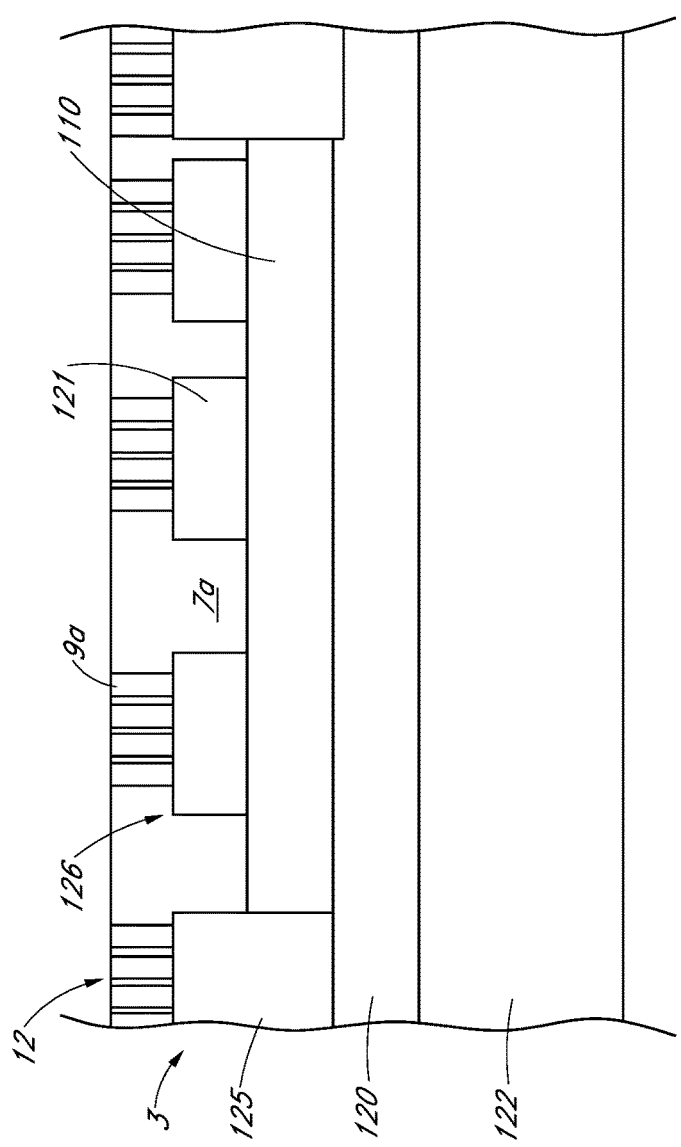
FIG. 5F is a schematic side sectional view of a passive electronic component with integrated power electrodes and ground electrodes.

FIG. 5F is a schematic side sectional view of a passive electronic component 3 with integrated power electrodes 126 (or signal electrodes) and ground electrodes 125. FIG. 5G is a top plan view of the passive electronic component 3 of FIG. 5F. As shown in FIG. 5F, the ground electrodes 125 can extend from the first surface 12, through the field regions 7a and the dielectric layer 110, and can contact the first electrode 120. In various embodiments, the first electrode 120 can be connected to electrical ground, which can provide a ground pin or terminal when connected with the semiconductor element 2. The power electrodes 126 shown in FIGS. 5A and 5B can comprise capacitive electrical pathways between the first surface 12 and the first electrode 120. Thus, when connected to the semiconductor element 2, electrical power can be transferred between the first surface 12 (by way of the conductive features 9a and/or contact pads 21) and portions of the first electrode 120, which can in turn connect to another structure, such as the package substrate 5. Although not illustrated, the first electrode 120 can be patterned or can be removed and replaced by an interconnect layer (such as a back-end of the line metallization layer) so as to provide electrical power along predefined electrical pathways.

Figure 5H:
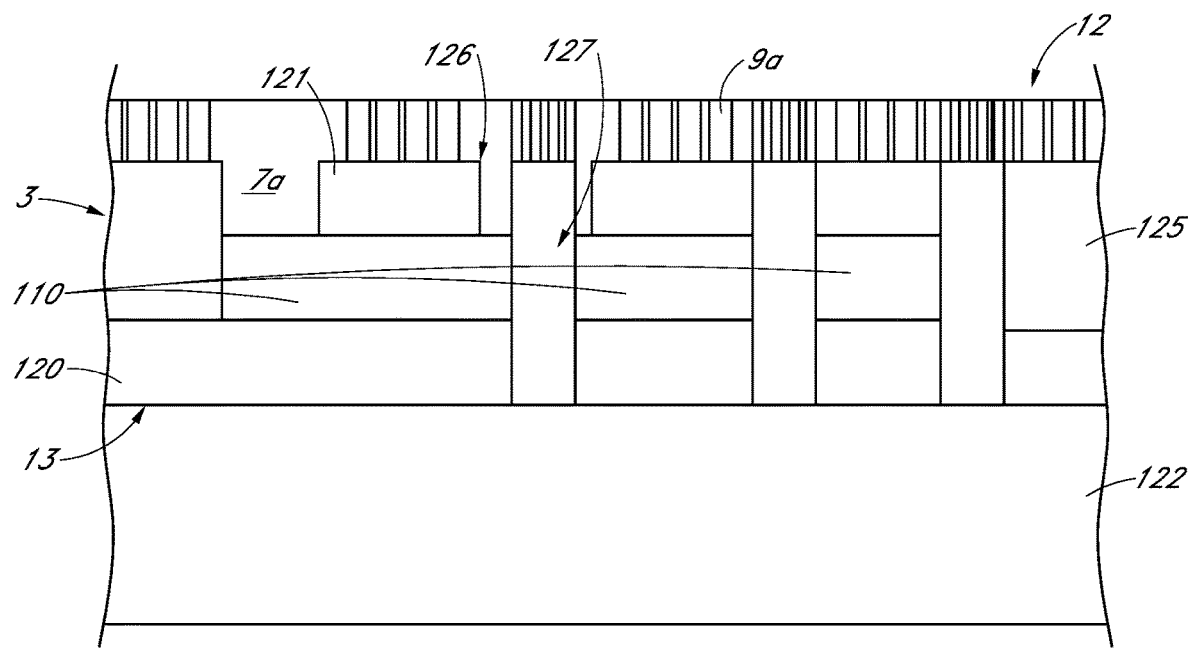
FIG. 5H is a schematic side sectional view of a passive electronic component according to another embodiment.
Figure 5I:
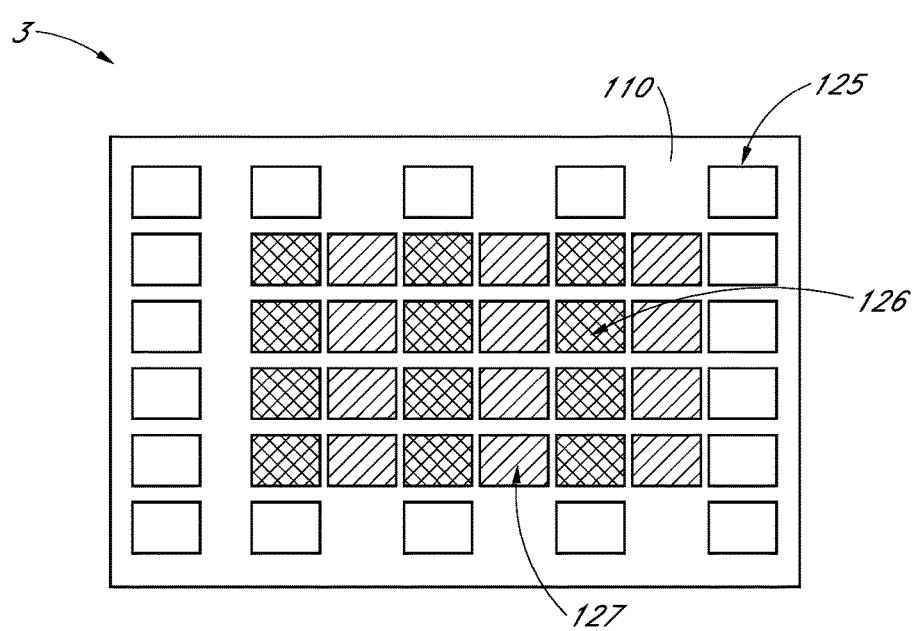
FIG. 5I is a top plan view of the passive electronic component of FIG. 5H.

FIG. 5H is a schematic side sectional view of a passive electronic component 3 according to another embodiment. FIG. 5I is a top plan view of the passive electronic component 3 of FIG. 5H. Unlike the embodiment of FIGS. 5F and 5G, in FIGS. 5H and 5I, the passive electronic component 3 can include shorted power electrodes 127, in addition to the power electrodes 126 and ground electrodes 125 shown in FIGS. 5F and 5G. As shown in FIG. 5H, for example, some power electrodes 127 may be connected to the second surface 13 of the component 3 by way of direct conductive interconnects. Thus, in FIGS. 5H and 5I, the power electrodes 126 may comprise capacitive electrical pathways between the conductive features 9a (or contact pads 21) and the second surface 13, while the shorted power electrodes 127 may comprise conductive or resistive electrical pathways between the conductive features 9a (or contact pads 21) and the second surface 13.

Thus, in the embodiments of FIGS. 5A-5I, high K, thin film dielectric materials can be used to define the passive electronic component 3. In some embodiments, the passive component 3 may be manufactured in one facility in order to form the high K material and electrodes (which may comprise noble or refractory metals suitable for contact with high K materials), and the semiconductor element 2 can be formed in another facility to form the active components and interconnects of the element 2. Beneficially the noble or refractory metals can be provided to enable high temperature processing. As explained above, in some embodiments, the noble or refractory metals can be removed and replaced by other metals, such as copper, or by other metallization or routing layers. In other embodiments, the noble or refractory metals can be kept in the ultimate bonded structure 1. The passive component 3 can be bonded (e.g., directly bonded) to the semiconductor element 2, which can provide a low impedance and low inductance connection to improve signal and/or power integrity of the bonded structure 1.

Figure 6:
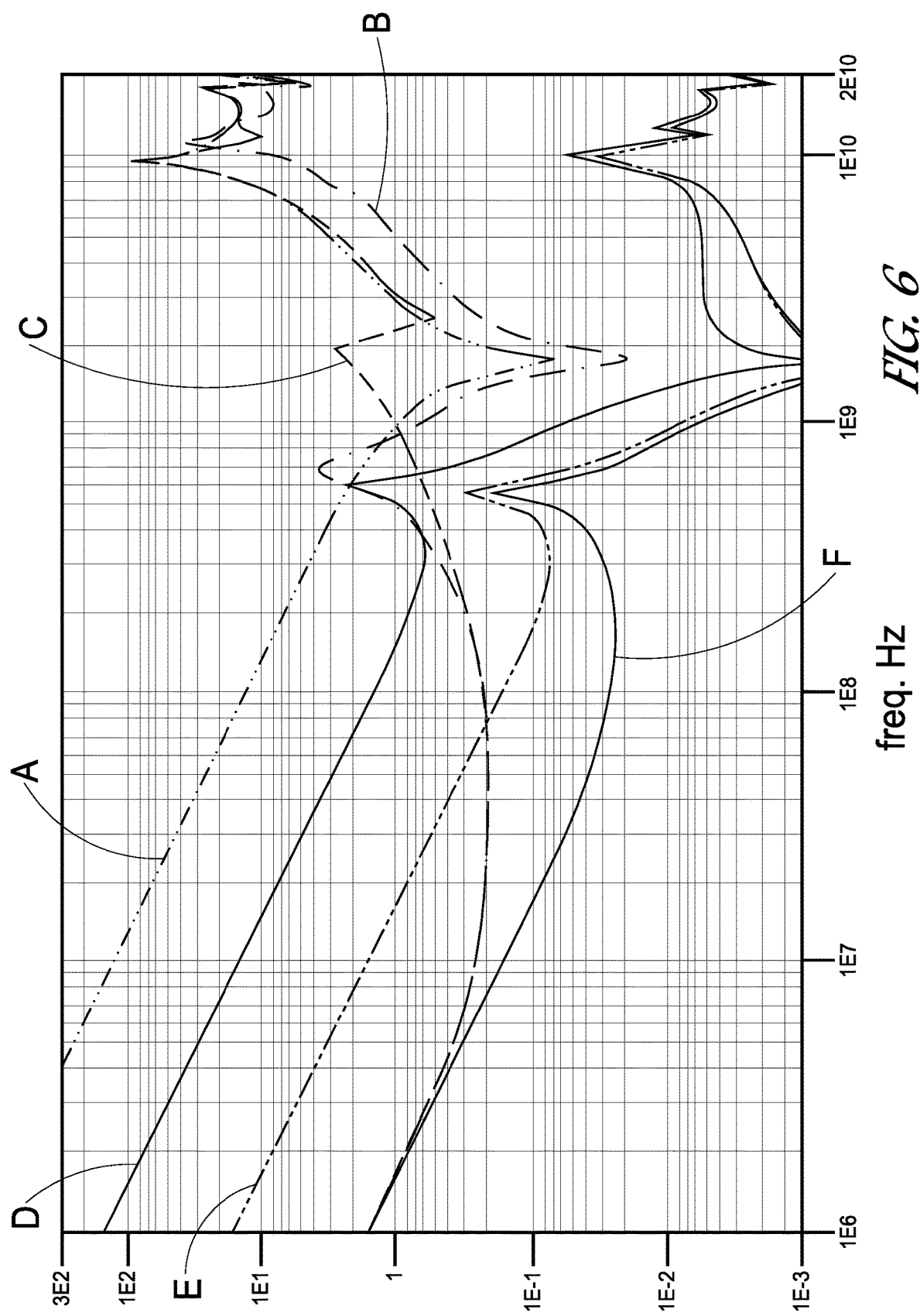
FIG. 6 is a plot of the transfer impedance as a function of frequency for various devices having different passive electronic components.

FIG. 6 is a plot of the transfer impedance of various devices as a function of signal frequency, including a processor die without a capacitive element (plot A), a processor die with a 100 nF discrete capacitor mounted thereon (plot B), a processor die with a 100 nF capacitor mounted to the package substrate (plot C), a processor die with a 100 nF capacitive sheet similar to those disclosed in the embodiments of FIGS. 1-5I (plot D), a processor die with a 10 nF capacitive sheet similar to those disclosed in the embodiments of FIGS. 1-5I (plot E), and a processor die with a 1 nF capacitive sheet similar to those disclosed in the embodiments of FIGS. 1-5I (plot F). As shown in FIG. 6, the conventional devices reflected in plots A, B, and C have relatively high transfer impedance values at frequencies above 500 MHz and/or above 1 GHz. Such high impedances above 500 MHz or 1 GHz may reduce the power or signal integrity of the processor dies. By contrast, as reflected in Plots D, E, and F, the embodiments disclosed herein enable significantly reduced impedance at frequencies above 500 MHz, e.g., at or above 1 GHz, which can provide improved signal or power integrity at these higher frequencies. For example, the embodiments disclosed herein can provide impedance at 1 GHz that is at least 10 times, e.g., at least 100 times, less than the impedance of the conventional devices shown in Plots A-C. At the same capacitance levels, the directly bonded capacitance sheets show improved performance over discrete capacitors mounted on either the processor die or the package substrate. Moreover, as shown in FIG. 6, the embodiments disclosed herein can provide the reduced impedance, even at significantly lower effective capacitances (e.g., at capacitances as low as about 1 nF or 10 nF). Thus, the embodiments disclosed herein can advantageously provide reduced impedances with effective capacitance values in a range of about 0.5 nF to 10 mF, in a range of about 0.5 nF to 1 mF, in a range of about 0.5 nF to 1 µF, in a range of about 0.5 nF to 150 nF, in a range of about 1 nF to 100 nF, or in a range of about 1 nF to 10 nF.

Figure 7A:
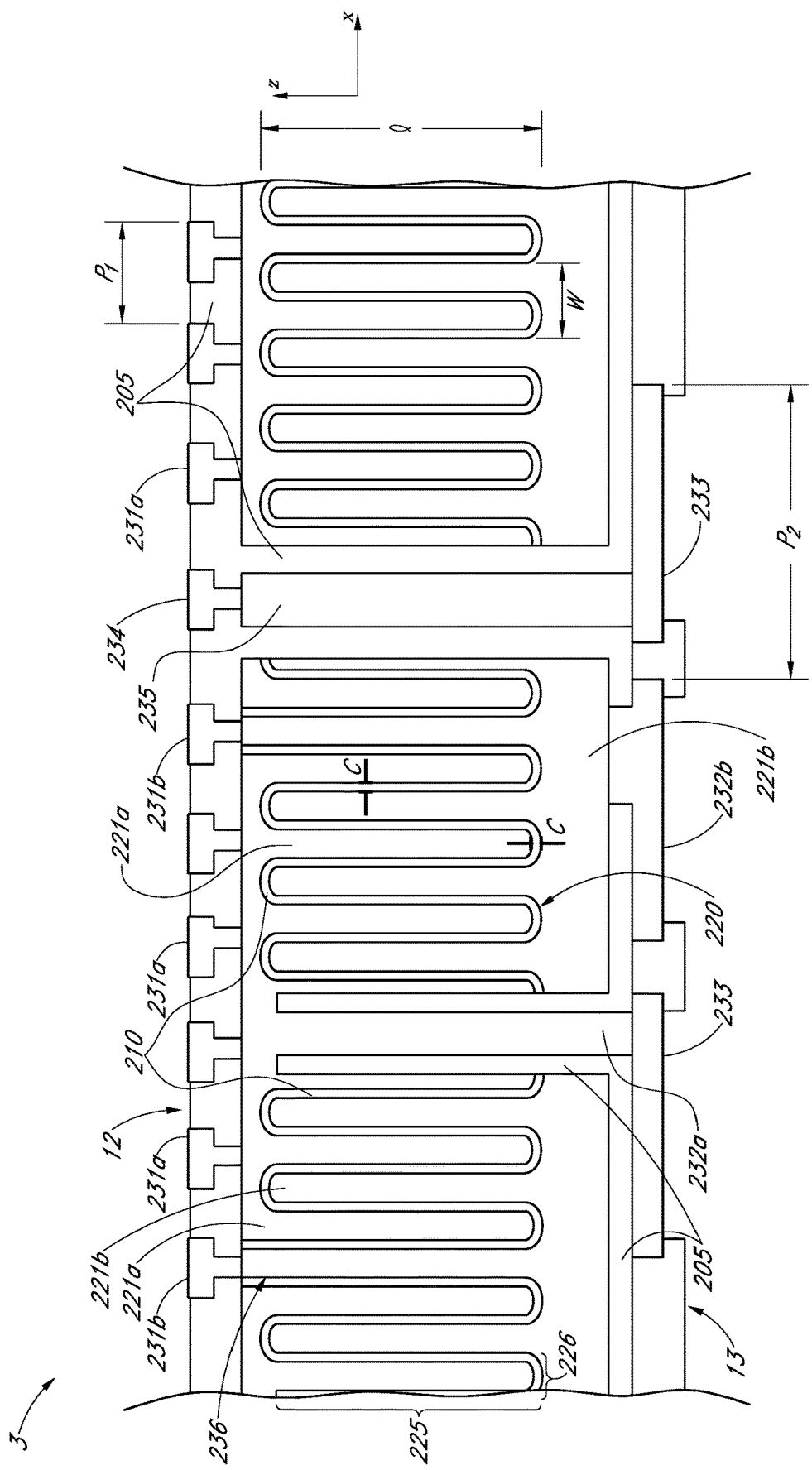
FIG. 7A is a schematic side sectional view of a passive electronic component, according to another embodiment.

FIG. 7A is a schematic side sectional view of a passive electronic component 3, according to another embodiment. Unless otherwise noted, the passive electronic component 3 of FIG. 7A can be bonded to the element 2 (which may comprise a semiconductor element or a non-semiconductor element) described herein. In various embodiments, the passive electronic component can comprise a first surface 12 directly bonded to the element 2 (not shown in FIG. 7A) without an intervening adhesive. A second surface 13 can electrically connect to a package substrate (such as the substrate 5) or other packaging or system structure. The passive component 3 shown in FIG. 7A beneficially comprises capacitors in which a majority of electrode surfaces are disposed non-parallel to (e.g., generally perpendicular to) the element 2 and the surfaces 12, 13. For example, as shown in FIG. 7A, one or more capacitors 220 can be defined in which a majority of electrode surfaces generally extend parallel to the z-axis, which can be non-parallel or perpendicular to the major surface of the passive element 3 (e.g., the x-y plane), e.g., the surfaces 12, 13.

In the embodiment illustrated in FIG. 7A, the capacitor 220 can comprise a first electrode 221a (which may comprise one of an anode and a cathode) and a second electrode 221b (which may comprise the other of the anode and the cathode) spaced apart from one another by an intervening dielectric 210. As explained above in connection with FIG. 1B, in FIG. 7A, the anode and cathode terminals of the passive electronic component 3 can be disposed along the same side or surface of the component 3. The capacitor 220 can be defined within a base 205 that can comprise an insulating or dielectric material, such as silicon, silicon oxide, etc. The electrodes 221a, 221b and the dielectric 210 can include major surfaces that primarily extend along the direction non-parallel to the surfaces 12, 13, which corresponds to the z-axis in FIG. 7A. In various embodiments, the capacitor 220 can have a serpentine profile extending along the x-axis. For example, as shown in FIG. 7A, the electrodes 221a, 221b and dielectric 210 can have respective vertical portions 225 that are generally vertical, e.g., extending along the z-axis non-parallel or perpendicular to the first and second surfaces 12, 13. The vertical portions 225 can be connected by corresponding lateral portions 226 of the electrodes 221a, 22b and dielectric 210, such that the vertical portions 225 and the lateral portions 226 define a generally serpentine capacitor within the passive element 3. As shown in FIG. 7A, a capacitance C can be provided between the two electrodes 221a, 221b along the entirety of the serpentine capacitor 220. In various embodiments, the overall capacitance C along the capacitor 220 can be in a range of 100 nF/mm$^2$ to 20 µF/mm$^2$, or in a range of 100 nF/mm$^2$ to 10 µF/mm$^2$. Beneficially, the use of a serpentine capacitor in which the predominant surfaces of the capacitor 220 lie along planes parallel (or close to parallel) to the vertical z-axis can significantly increase the overall surface area of the electrodes 221a, 221b, and, therefore, can accordingly increase the overall capacitance provided by the passive element 2. The electrodes 221a, 221b can comprise any suitable type of conductor, such as aluminum, silicon, doped silicon, nickel, or other materials. The dielectric 210 can comprise any suitable dielectric material, such as aluminum oxide, silicon oxide, etc. In some embodiments, increased capacitance can be provided by using high dielectric materials (e.g., k>10), such as $HfO_2$, $ZrO_2$, BST, SBT, etc.

The capacitors 220 can electrically connect to the element 2 (not shown) by way of upper terminals 231a, 231b and to the package substrate 5 (not shown) or another element by way of lower terminals 232a, 232b. As shown in FIG. 7A, first terminals 231a can provide electrical communication to the first electrode 221a. Second terminals 231b can provide electrical communication to the second electrode 221b which may be of a different type than the first terminals 231a. For example, as shown in FIG. 7A, first terminals 231a can extend through the insulating base 205 to contact an upper portion of the first electrode 221a, and can be exposed at the first surface 12 of the passive component 3. The second terminals 231b can extend through the insulating base 205 and can contact an extension portion 236 of the second electrode 221b. As shown in FIG. 7A, for example, the extension portion 236 of the second electrode 221b can extend through the material of the first electrode 221a, with the dielectric 210 intervening between the first electrode 221a and the extension portion 236 of the second electrode 221b. Still other ways to electrically connect to the capacitors 220 may be suitable.

Further, as shown in FIG. 7A, first lower terminals 232a can provide electrical communication to the first electrode 221a. The second lower terminals 232b can provide electrical communication to the second electrode 221b. Thus, in various embodiments, at the first surface 12, upper terminals 231a can electrically connect to the first electrodes 221a (e.g., one of an anode or a cathode), and upper terminals 231b can electrically connect to the second electrodes 221b (e.g., the other of an anode and a cathode). At the second surface 13, lower terminals 232a can electrically connect to the first electrodes 221a (e.g., one of an anode or a cathode), and lower terminals 232b can electrically connect to the second electrodes 221b (e.g., the other of an anode and a cathode). Accordingly, each surface 12, 13 can comprise anode and cathode terminals (e.g., different types of terminals).

The passive electronic component 3 can also have a through signal connector 235 extending through the thickness of the passive electronic component 3. The through signal connector 235 can comprise a conductor that provides a conductive pathway between a first through signal terminal 234 on the first surface 12 and a second through signal terminal 233 on the second surface 13. Any or all of the upper terminals 231a, 231b, the lower terminals 232a, 232b, and the through signal terminals 234, 233 can be configured for direct bonding to the element 2 and/or to the system board. Thus, the passive electronic component 3 shown in FIG. 7A can beneficially provide capacitive pathway(s) and conductive through signal pathway(s). Accordingly, passive devices with relatively high capacitance can be provided in line with the integrated circuit, without occupying separate real estate for the system, without interfering with direct signal connections. Disposing the capacitor 220 with a majority of electrode surfaces along (or close to parallel with) the vertical direction can beneficially improve capacitance by significantly increasing the effective surface area of the electrodes 221a, 221b.

As shown in FIG. 7A, the upper terminals 231a, 231b and the through signal terminals 234 can be laterally spaced at a finer pitch than the lower terminals 232a, 232b and the through signal terminals 233. For example, in various embodiments, an upper pitch $p_1$ of the terminals on the first surface 12 (e.g., the terminals 231a, 231b, and 234) can be spaced at a pitch less than 50 microns, or less than 40 microns. In various embodiments, the upper pitch $p_1$ can be in a range of 0.5 microns to 50 microns, in a range of 0.5 microns to 40 microns, in a range of 0.5 microns to 20 microns, in a range of 0.5 microns to 10 microns, or in a range of 1 micron to 10 microns. The fine pitch of the upper terminals 231a, 231b and the terminals 234 can provide a relatively high number of channels for connection to the element 2. By contrast, a lower pitch $p_2$ of the lower terminals 232a, 232b and the terminals 233 can be selected for suitable connection to the system motherboard. The lower pitch $p_2$ can be less than 200 microns, or less than 150 microns. For example, the lower pitch $p_2$ can be in a range of 50 microns to 200 microns or in a range of 50 microns to 150 microns. Accordingly, the passive component serves both to provide high capacitance passive devices and serves as an interposer without occupying separate real estate.

The vertical capacitors 220 can be defined in any suitable manner. For example, the second electrode 221b can be defined from an initially planar sheet of porous silicon, porous aluminum, etc. The upper surface of the planar sheet can be masked and etched such that channels can be etched into the sheet of the second electrode 221b material. The dielectric 210 can be conformally deposited into the channels over the etched surface of the porous aluminum or porous silicon. For example, the dielectric 210 can be deposited by physical vapor deposition (PVD), chemical vapor deposition (CVD) or atomic layer deposition (ALD). An additional conductive material (e.g., aluminum) can be deposited, coated or otherwise applied over the dielectric 210 to define the first electrodes 221a. In some embodiments, the first and second electrodes 221a, 221b can comprise the same material. In other embodiments, the first and second electrodes 221a, 221b can comprise different materials. Advantageously, the illustrated structure with vertical channels or fins can be readily defined with fewer masking steps compared to horizontal fins.

Figure 7B:
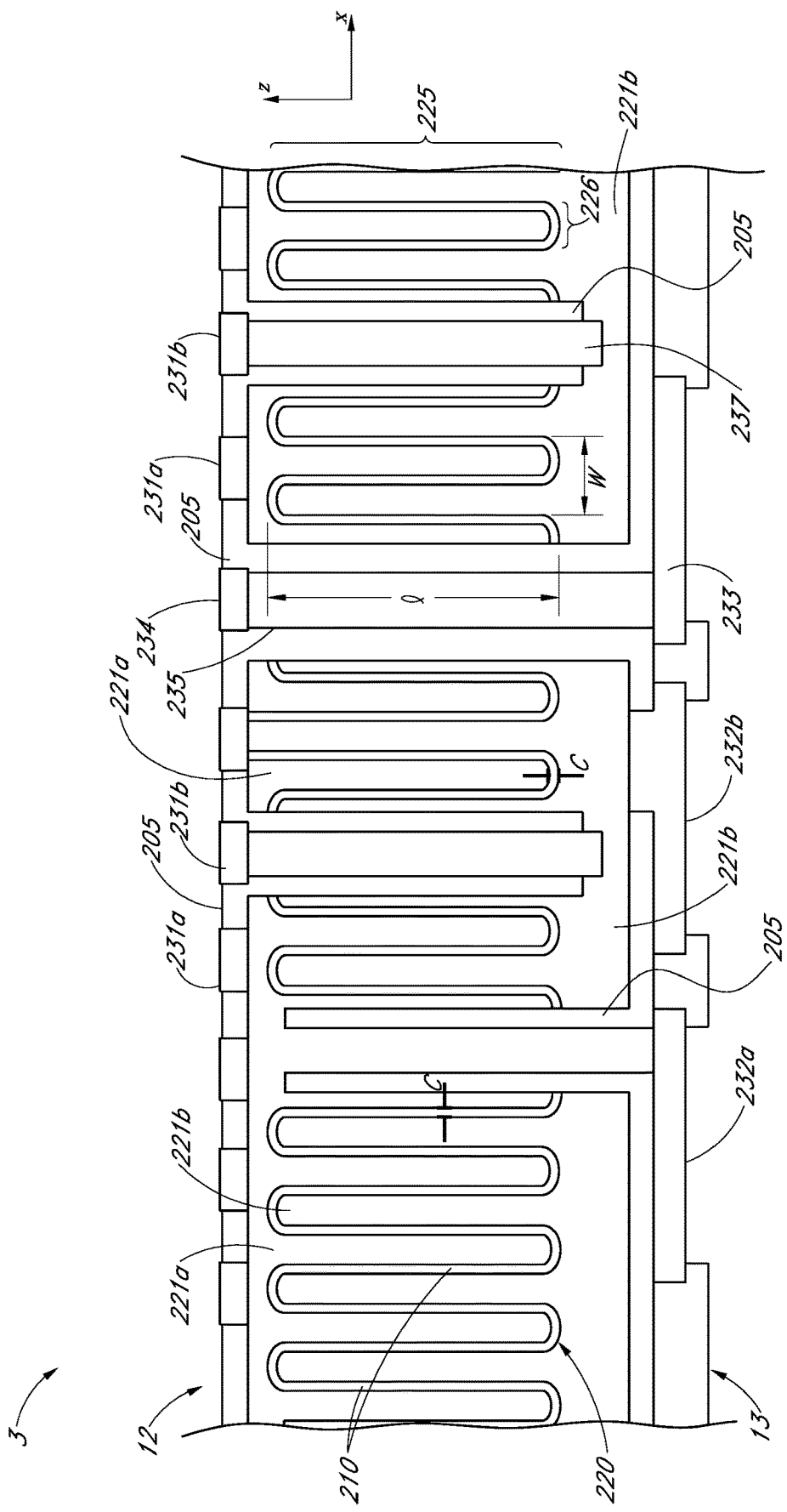
FIG. 7B is a schematic side sectional view of a passive electronic component, according to yet another embodiment.

FIG. 7B is a schematic side sectional view of a passive electronic component 3 according to another embodiment. Unless otherwise noted, reference numerals in FIG. 7B refer to the same or similar features as like-numbered components in FIG. 7A. For example, as with FIG. 7A, the passive electronic component 3 of FIG. 7B can comprise a capacitor 220 in which a majority of electrode surfaces are vertically positioned and that defines a serpentine pattern along the x-axis. Major surfaces of the first and second electrodes 221a, 221b and the intervening dielectric 210 can primarily extend non-parallel or perpendicular to the first and second surfaces 12, 13. As with FIG. 7A, first upper terminals 231a can electrically connect to the first electrode 221a at or near the first surface 12. Further, as with FIG. 7A, in FIG. 7B, each surface 12, 13 of the passive component 3 can comprise anode and cathode terminals, such that anode and cathode terminals can be disposed along the same side or surface of the component 3 (e.g., terminals 231, 231b at surface 12 and terminals 232a, 232b at surface 13). Unlike in FIG. 7A, however, in which an extension portion 236 of the second electrode 221b contacts the corresponding second upper terminal 221b, in FIG. 7B, a separate vertical connector 237 can extend downwardly into the passive element 3 to electrically connect the second upper terminal 231b with the second electrode 221b.

Figure 7C:
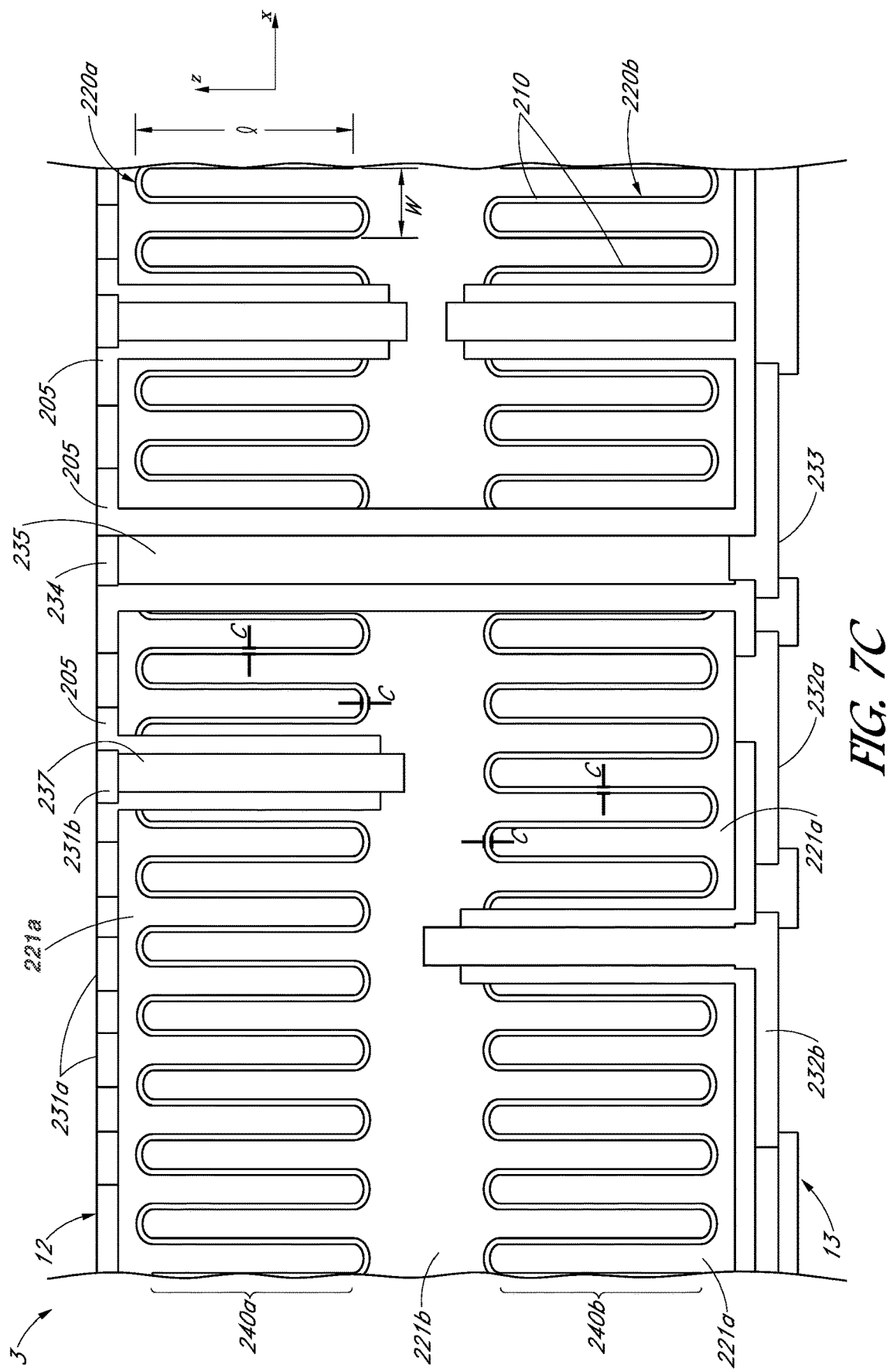
FIG. 7C is a schematic side cross-sectional view of a passive electronic component, according to another embodiment.

FIG. 7C is a schematic side cross-sectional view of a passive electronic component 3, in which one or more serpentine capacitors may be defined along both sides of the second electrode 221b. Multiple, separate capacitors may be defined within the passive electronic component 3 in various embodiments. Unless otherwise noted, reference numerals in FIG. 7C refer to the same or similar features as like-numbered components in FIGS. 7A and 7B. As with FIGS. 7A-7B, the passive electronic component 3 of FIG. 7C with a majority of electrode surfaces that can extend generally vertically and non-parallel relative to the first and second surfaces 12, 13. Further, as with FIGS. 7A-7B, in FIG. 7C, each surface 12, 13 of the passive component 3 can comprise anode and cathode terminals, such that anode and cathode terminals can be disposed along the same side or surface of the component 3 (e.g., terminals 231, 231b at surface 12 and terminals 232a, 232b at surface 13). Unlike the embodiment of FIGS. 7A-7B, however, in FIG. 7C, upper capacitor(s) 220a can be defined in an upper portion 240a of the passive component 3, and lower capacitor(s) 220b can be defined in a lower portion 240b of the passive component 3. In the embodiment of FIG. 7C, both sides of the initial planar sheet of aluminum or silicon can be masked and simultaneously etched to define channels within the second electrode 221b. Dielectric 210 can be deposited on both the upper and lower portions 240a, 240b. Similarly, conductive material can be deposited over the dielectric 210 on the upper and lower portions 240a, 240b to define the first electrode 221a. The embodiment of FIG. 7C can beneficially further increase the overall surface area of the electrodes 221a, 221b and thus the overall capacitance of the passive electronic component 3.

Figure 7D:
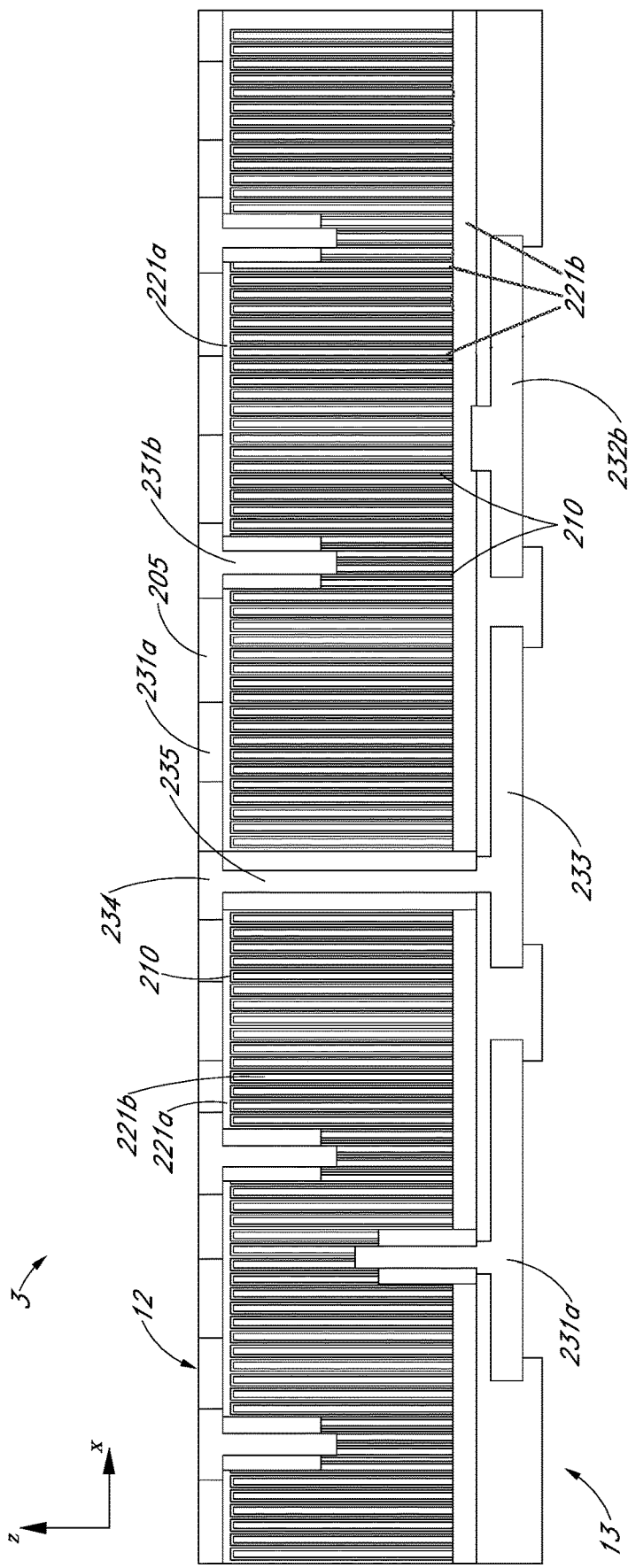
FIG. 7D is a schematic side cross-sectional view of a passive electronic component, in which capacitor(s) can be defined by aligned fibers.

FIG. 7D is a schematic side cross-sectional view of a passive electronic component 3, in which capacitor(s) 220 can be defined by aligned fibers (e.g., carbon fibers) extending along the non-parallel direction z. Unless otherwise noted, reference numerals in FIG. 7D refer to the same or similar features as like-numbered components in FIGS. 7A-7C. As with FIGS. 7A-7C, the passive electronic component 3 of FIG. 7D can have a majority of electrode surfaces that can extend generally vertically and non-parallel relative to the first and second surfaces 12, 13. Further, as with FIGS. 7A-7C, in FIG. 7D, each surface 12, 13 of the passive component 3 can comprise anode and cathode terminals, such that anode and cathode terminals can be disposed along the same side or surface of the component 3 (e.g., terminals 231a, 231b at surface 12 and terminals 232a, 232b at surface 13). In such embodiments, fibers (such as elongate carbon fibers) can act as the second electrode 221b. The fibers can be coated with non-conductive material to define the dielectric 210, and can be subsequently coated with conductive material to define the first electrode 221a. Still other ways of forming the vertical capacitors 220 may be suitable.

The capacitors 220 shown in FIGS. 7A-7D can be elongated, e.g., heights l of the electrode surfaces of the capacitors 220 (e.g., which may be defined by the lengths of the electrodes 221a, 221b) along the non-parallel direction z may be longer than corresponding widths w of undulations of the capacitors 220 along the major lateral surface x-y. As shown in FIGS. 7A-7D, the widths w can be defined according to the pitch of the capacitors 220, e.g., a width of a single undulation of the capacitor. An aspect ratio of the capacitors 220 can be defined by l divided by w. In various arrangements, the aspect ratio can be greater than 5:1. Beneficially, the elongate capacitors 220 illustrated in FIGS. 7A-7D can provide increased electrode surface area as compared with other passive devices without entailing greater masking steps. The increased surface areas can significantly increase overall capacitance, even when used with low dielectric constant materials.

As explained herein, various types of elements, such as dies or wafers, may be stacked in a three-dimensional arrangement as part of various microelectronic packaging schemes. This can include stacking a layer of one or more dies or wafers on a larger base die or wafer, stacking multiple dies or wafers in a vertical arrangement, and various combinations of both. Dies in the stacks can include memory devices, logic devices, processors, discrete devices, and the like. In various embodiments disclosed herein, very small or thin profile capacitors can be embedded within an insulating material and can be included in a stacked die arrangement, to decouple adjacent bonded devices, for example.

Dies or wafers may be bonded in a stacked arrangement using various bonding techniques, including direct bonding, non-adhesive techniques such as the direct bonding techniques disclosed above (see for example, U.S. Pat. No. 7,485,968, which is incorporated by reference herein in its entirety). When bonding stacked dies using a direct bonding technique, it is desirable that the surfaces of the dies to be bonded be extremely flat and smooth. For instance, as explained above, the surfaces should have a very low variance in surface topology, so that the surfaces can be closely mated to form a lasting bond. It is also desirable that the surfaces be clean and free from impurities, particles, or other residue.

According to various embodiments disclosed herein, capacitors (e.g., multi-layered capacitors or other passive components) can be embedded within an insulating material such as a ceramic or polymer to form wafer level stackable capacitor or other passive devices. In various embodiments, using a ceramic, polymer, or the like, results in a device that may be planarized to have a smoother bonding surface than may be possible with some other conventional insulating materials. For instance co-fired ceramic, liquid crystal polymer (LCP), glass, silicon, or other semiconductor, and like materials may be used in various embodiments. In some implementations, the ceramic is precast, or a paste or liquid may be used to form self-leveling bonding surfaces for the devices. The bonding surfaces of the capacitor devices can be planarized after firing in preparation for bonding.

The capacitors to be embedded can comprise single or multi-layered components (to provide the capacitance desired) with edge conductors to electrically couple the terminals of the capacitors. One or more of the capacitors can be embedded in an insulating material (such as the "green sheet" illustrated in the figures) using a variety of techniques. In a first embodiment, the capacitors can be deposited on a layer of insulating material (e.g., pre co-fired ceramic), and another layer of the insulating material can be placed or deposited over the capacitors. The two layers of insulating material can be pressed together, sandwiching the capacitors, and the combination can be fired. The insulating material layers can be joined together during firing, forming a unified device, with the capacitors embedded within. Thus, in various embodiments, the dielectric material of the capacitor can be monolithically integrated with the layer(s) of insulating material.

In embodiments where the multi-layer capacitor is thicker, an additional layer of insulating material can be placed between the top and bottom insulating layers and around the capacitors (forming a middle layer that includes the capacitors). When the combination is fired, all of the insulating material layers can be joined together, forming a unified device. In various embodiments, any number of insulating layers may be used with any number of capacitors or layers of capacitors to form the device. Alternately, the capacitors can be coated with a liquid or paste insulating material that can be fired or cured to solidify the insulating material and form the embedded device.

In various embodiments, the insulating material can be selected to have a coefficient of thermal expansion (CTE) that is low, or that has a value close to the CTE value of the dies (which may be made of silicon in some examples) that will be bonded to the capacitive device. For instance, the CTE of the capacitive device can be selected to be similar to the CTE of a logic device, processor, etc., to be bonded to the capacitive device, so that the combination of devices can be packaged together (in a stacked arrangement, for instance) if desired.

Vias may be formed in the capacitive device, through the insulating material, to allow signal or power transfer through the capacitive device or to the embedded capacitors. In various implementations, the vias may be formed prior to or after firing the capacitive device. In some embodiments, redistribution layers may be formed on one or both surfaces of the capacitive device, which may be coupled to the vias if desired.

Further, conductive traces can be coupled to the edge connectors of the capacitors to form external terminals for the capacitors on one or both surfaces of the capacitive device. For instance, the terminals for the capacitors can be located one on each surface of the capacitive device (e.g., anode and cathode terminals can be on opposing sides of the capacitive device), both on a single surface of the capacitive device (e.g., anode and cathode terminals can be on the same side or surface of the capacitive device), or there may be terminals for each of the edge connectors on each side of the capacitive device (e.g., each surface of the capacitive device can comprise both anode and cathode terminals). Thus, for example, two terminals may be connected to one edge connector of the capacitor and may be configured to carry a power signal from one side of the capacitive device to the other. Two other terminals may be connected to a second edge connector of the capacitor and may be configured to provide a ground from one side of the capacitive device to the other. In such a configuration one side of the capacitor is coupled to a power signal and the other side of the capacitor coupled to ground. The terminals may be coupled to one or more of the vias or to a redistribution layer (RDL) (on one or both surfaces) if desired. The terminals, vias, and/or RDL connections can be formed as direct bonding interconnects on the one or more surfaces of the capacitive device, when the capacitive device is to be bonded using direct bonding techniques. In such cases, at least some of the interconnects can have a pitch in the range of a single micron, where the vias may have a size in the 10-15 micron range. In an embodiment, the direct bonding interconnects may only be used on one surface of the capacitive device, with the terminals for the capacitors on the one surface.

In another embodiment, one or more cavities may be formed into a surface of a pre-fired insulating material layer. A capacitor can be deposited within each cavity and vias can be formed within the insulating layer (in any order). A redistribution layer can be formed over the layer and the capacitors, embedding the capacitors within the device. The opposite surface can be planarized, and another RDL formed on the planarized surface if desired.

The techniques described can result in fewer processing steps, higher manufacturing through-put, and improved yield. Other advantages of the disclosed techniques will also be apparent to those having skill in the art.

Figure 8A:
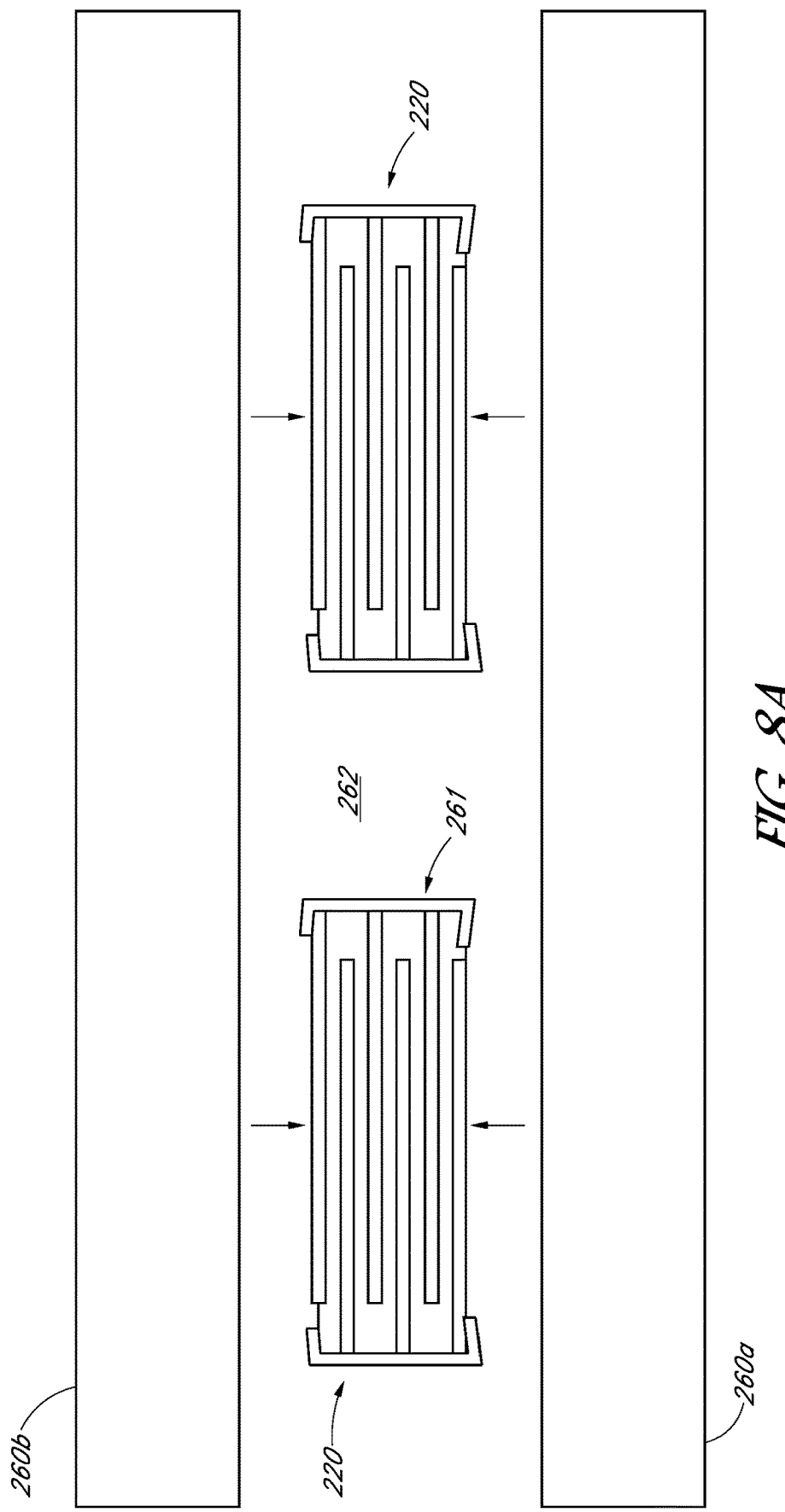
FIG. 8A is a schematic side sectional view of a first insulating layer, a plurality of capacitors, and a second insulating layer, prior to forming a passive electronic component.
Figure 8B:
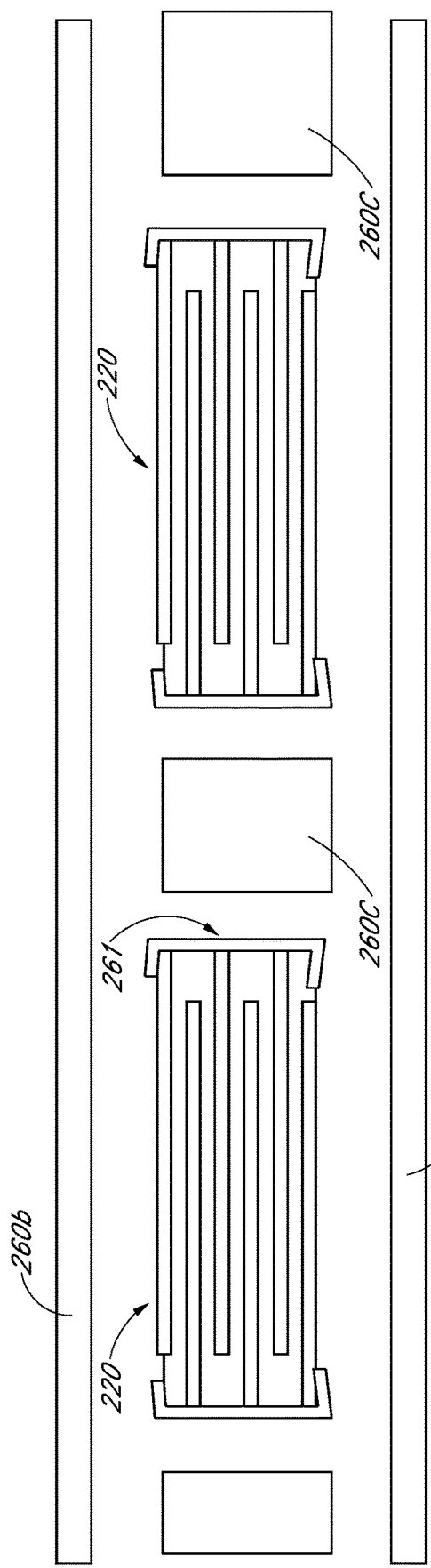
FIG. 8B is a schematic side sectional view of a first insulating layer, a plurality of capacitors, a second insulating layer, and an intermediate third insulating layer disposed between the first and second insulating layers, prior to forming a passive electronic component.
Figure 8C:
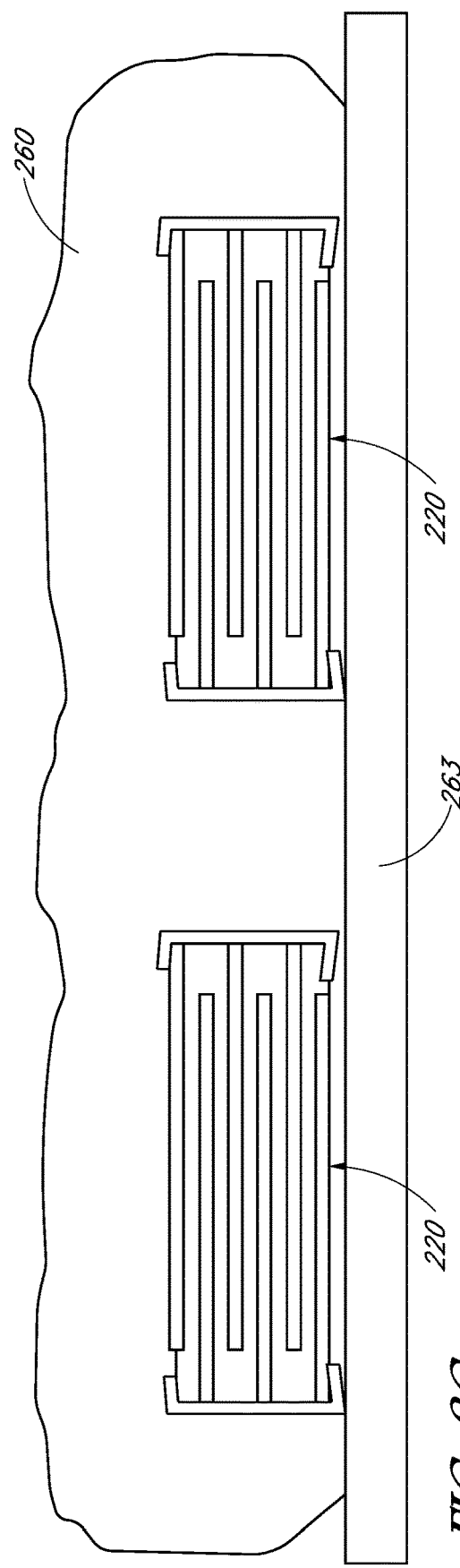
FIG. 8C is a schematic side sectional view of capacitors embedded in an insulating layer, prior to forming a passive electronic component.
Figure 8D:
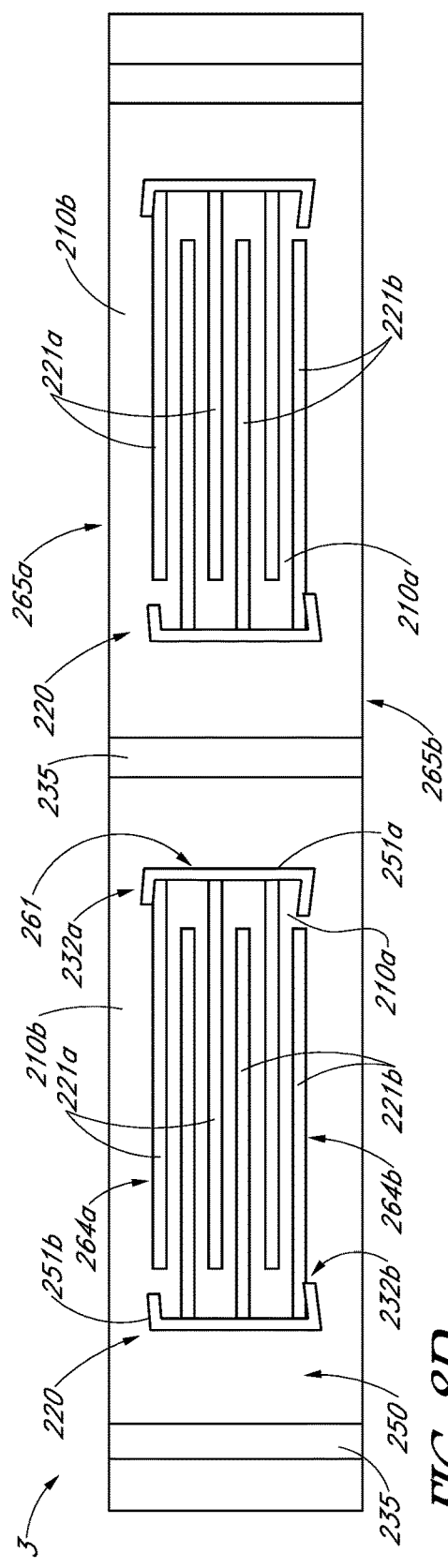
FIG. 8D is a schematic cross-sectional view of a passive electronic component formed using any of the techniques shown in FIGS. 8A-8C.
Figure 8E:
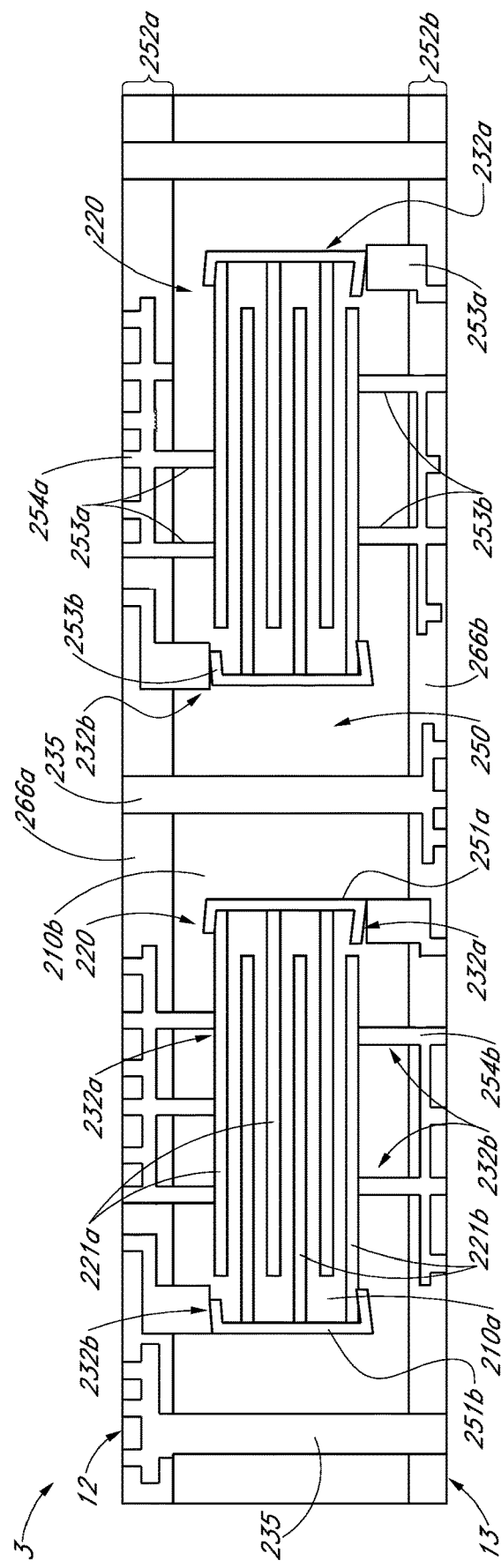
FIG. 8E is a schematic side sectional view of the passive electronic component shown in FIG. 8D, with one or more redistribution layers (RDLs) applied to the passive electronic component.

FIGS. 8A-8C illustrate various techniques for embedding a capacitor 220 in an insulating layer, according to various embodiments. FIGS. 8D-8E are schematic side sectional views of the passive electronic component 3 which can be formed using any of the techniques shown in FIGS. 8A-8C. FIG. 8A is a schematic side sectional view of a first insulating layer 260a, a plurality of capacitors 220, and a second insulating layer 260b, prior to forming the passive electronic component. The embodiments shown in FIGS. 8A-8C illustrate a plurality of capacitors 220, which may be used in wafer-level processing. In other embodiments, only one capacitor 220 may be provided. The capacitors 220 can comprise any suitable type of capacitor, including, e.g., single-layered capacitors with a single dielectric layer between two conductive electrode layers, or multi-layered capacitors having a plurality of dielectric layers between a plurality of conductive electrode layers. The capacitors 220 may also be similar to or the same as any of the capacitive structures disclosed herein, including horizontally- or vertically-oriented capacitors. The first and second insulating layers 260a, 260b can comprise any suitable type of insulating or non-conductive material, such as a ceramic, a glass, or a polymer. In various embodiments, the first and second insulating layers 260a, 260b can comprise ceramics, such as aluminum oxide. In other embodiments, the first and second insulating layers 260a, 260b can comprise polymers, such as liquid crystal polymer (LCP).

In various embodiments, the first and second insulating layers 260a, 260b can comprise soft or flexible ceramic green sheets, e.g., ceramic sheets that when heated or fired at or above a suitable firing temperature, harden to form a stiffer ceramic material. In such embodiments, the capacitor 220 can be provided on the first insulating layer 260a. The second insulating layer 260b can be provided (e.g., deposited) on the capacitor 220. The first and second layers 260a, 260b can be pressed together such that the first and second layers 260a, 260b contact one another in gaps 262 and around edge portions 261 of the capacitors 220. In various embodiments, the first and second layers 260a, 260b can accordingly conform around the capacitors 262 and can contact one another when pressed. After the pressing, the first and second layers 260a, 260b and the embedded capacitors 220 can be fired or co-fired at a temperature at or above a ceramic firing temperature so as to cause the first and second layers 260a, 260b to meld or blend together to form a harder or stiffer structure.

The first and second layers 260a, 260b can comprise the same material in various embodiments. In other embodiments, the first and second layers 260a, 260b can comprise different materials. In arrangements in which the first and second layers 260a, 260b comprise different materials, the materials can be selected such that the materials harden at or around the same firing or co-firing temperature, e.g., the temperature or temperature range at which the first and second layers 260a, 260b are sufficiently hardened. For example, some materials may comprise high temperature ceramics (e.g., with a firing temperature at or above 1000° C.) or low temperature ceramics (e.g., those with a firing temperature at or above 500° C. or at or above 600° C., e.g., between 500° C. and 1200° C., or between 550° C. and 1100° C. The resulting passive electronic component 3 is illustrated in FIG. 8D, which is described in more detail below.

FIG. 8B is a schematic side sectional view of a first insulating layer 260a, a plurality of capacitors 220, a second insulating layer 260b, and an intermediate third insulating layer 260c disposed between the first and second insulating layers 260a, 260b, prior to forming the passive electronic component. Unless otherwise noted, the embodiment of FIG. 8B is generally similar to or the same as the embodiment of FIG. 8A. For example, like FIG. 8A, the method for forming a passive component of FIG. 8B may also form the passive component 3 shown in FIG. 8D. Unlike in FIG. 8A, however, in FIG. 8B, the intermediate third insulating layer 260c can be deposited around the side edges 261 of the capacitors 220 prior to firing. Beneficially, the third intermediate layer 260c can have a thickness selected such the first and second layers 260a, 260b can contact the intermediate layer 260c with little or no applied pressure. In other arrangements, pressure may be applied to cause the first layer 260a to contact the third layer 260c and to cause the third layer 260c to contact the second layer 260b. After pressing the first and second layers 260a, 260b together (with the third layer 260c intervening therebetween), the first layer 260a, second layer 260b, third layer 260c, and the capacitors 220 can be co-fired at a temperature sufficient to cause the layers 260a-260c to meld or otherwise join together to form a unitary or unified device, e.g., the unified passive component 3 shown in FIG. 8D.

FIG. 8C is a schematic side sectional view of capacitors 220 embedded in an insulating layer 260, prior to forming the passive electronic component. Unless otherwise noted, the embodiment of FIG. 8C is generally similar to or the same as the embodiments of FIGS. 8A-8B. For example, like in FIGS. 8A-8B, the method for forming a passive component of FIG. 8B may also form the passive component 3 shown in FIG. 8D. However, in the embodiments of FIGS. 8A-8B, the first, second, and third insulating layers 260a-260c may be formed prior to depositing or connecting to the capacitors 220. Unlike the embodiments of FIGS. 8A-8B, in the embodiment of FIG. 8C, a powder or other solid mixture can be provided on a carrier 263. The capacitors 220 can be provided over the power or mixture, and a solution can be added to the powder or mixture. The solution can cause the powder or mixture to thicken into a soft, flexible insulating layer 260 (e.g., a soft ceramic or polymer). The resulting soft, flexible layer 260 can be molded or otherwise formed over and around the capacitors 220 to embed the capacitors 220 within the insulating layer 260. After molding or forming the insulating layer 260 over the capacitors 220, the insulating layer 260 and the capacitors 260 can be co-fired at a temperature sufficient to cause the layer 260 to meld, mix or otherwise join together to form a unitary or unified device, e.g., the unified passive component 3 shown in FIG. 8D. The carrier 263 can be removed after co-firing. The embodiment of FIG. 8C can beneficially enable the formation of a passive component without utilizing multiple deposition processes, such as those shown in FIGS. 8A-8B. Rather, the base insulating layer 260 can be formed about the capacitors 220 and co-fired to form the passive component 3 in relatively few process steps.

FIG. 8D is a schematic cross-sectional view of a passive electronic component 3 formed using any of the techniques shown in FIGS. 8A-8C. The passive electronic component 3 may include features similar to or the same as those shown in FIGS. 7A-7D, such that reference numerals in FIG. 8D may represent similar components to like reference numerals of FIGS. 7A-7D, except where noted. After co-firing the structures of FIGS. 8A-8C, the capacitors 220 can be embedded within a layer 250 of insulating material. In the illustrated embodiment, for example, the capacitors 220 can be completely embedded in the layer 250 such that the layer 250 of insulating material is disposed along the side edges 261 of the capacitor 220, as well as along upper and lower surfaces 264a, 264b of the capacitor 220. In FIG. 8D, the layer 250 of insulating material can comprise a first insulator 210a formed by firing or co-firing the assemblies shown in FIGS. 8A-8C. Thus, the first insulator 210a can comprise a hardened ceramic, polymer, glass, etc.

As with FIGS. 7A-7D, the capacitors 220 shown in FIG. 8D can be defined at least in part by a first electrode 221a, a second electrode 221b, and a second insulator 210b intervening between the first and second electrodes 221a, 221b. The first and second insulators 210a, 210b can be selected so as to have similar co-firing temperatures, and/or with a relatively low CTE that matches the components to which the passive electronic component 3 is to be bonded (e.g., a semiconductor element 2, which may comprise silicon). In various embodiments, the insulators 210a, 210b comprise the same material. In other embodiments, the insulators 210a, 210b comprise different materials that each have firing temperatures at which the layers 210a, 210b both harden and merge or meld with one another. Thus, after co-firing the assemblies shown in any of FIGS. 8A-8C, the first and second insulators 210a, 210b can merge or mix with one another to form a monolithically integrated and unified or unitary structure. For example, co-firing the first and second insulators 210a, 210b can cause portions of the first insulator 210a to merge or mix with portions of the second insulator 210b, e.g., at the boundary between the two insulators 210a, 210b. In the embodiment of FIG. 8D, therefore, the monolithically integrated insulator 210a of the layer 250 may seamlessly integrate with the insulator 210b of the capacitor 220. As explained above, in various embodiments, the insulators 210a, 210b can comprise dielectrics in various embodiments, e.g., ceramic dielectrics. In other embodiments, the insulators 210a and/or 210b may comprise polymers, glass, etc.

In various embodiments, as with the embodiments of FIGS. 7A-7D, the capacitor 220 can comprise first terminal(s) 232a connected to the corresponding first electrode(s) 221a. Second terminal(s) 232b can be connected to corresponding second electrode(s) 221b of the capacitor 220. Each of the first and second terminals 232a, 232b can be defined at least in part by respective outermost layers of the electrodes 221a, 221b (e.g., those electrodes 221a, 221b disposed at or near the respective upper and lower surfaces 264a, 264b of the capacitor 220), and by edge connectors 251a, 251b that electrically connect respective alternating electrodes 221a, 221b. For example, as shown in FIG. 8D, the first edge connector 251a can be disposed vertically, e.g., non-parallel relative to the electrodes 221a and can electrically connect respective ends of the electrodes 221a. Similarly, the second edge connector 251b can be disposed vertically, e.g., non-parallel relative to the electrodes 221b and can electrically connect respective ends of the electrodes 221b. As explained above, the electrodes 221a, 221b may be of a different type, e.g., one electrode 221a may comprise an anode and the other electrode 221b may comprise a cathode, or vice versa.

Furthermore, as with the embodiments of FIGS. 7A-7B, one or more through signal connectors 235 (e.g., conductive vias) can extend through the thickness of the passive electronic component 3, from a first surface 265a of the insulating layer 250 to a second surface 265b of the insulating layer 250. In some embodiments, the through signal connectors 235 can be formed after co-firing and forming the passive component 3. For example, in some embodiments, the insulating layers 260a, 260b, and/or 260c, and the capacitors 220 can be co-fired to form a passive component. Subsequently, holes can be provided (e.g., drilled, etched, etc.) through the insulating layer 250, and the through signal connectors 235 can be provided or deposited in the holes. In such an arrangement, in which the signal connectors 235 are formed after firing, the conductive material for the connectors 235 may not be able to withstand the high temperatures used during the firing or co-firing process. In other embodiments, however, the connectors 235 can comprise a conductor with material properties configured to withstand the high temperatures used for firing the structure. In such arrangements, the connectors 235 may be co-fired along with the capacitors 220 and insulating layers 260a-260c.

FIG. 8E is a schematic side sectional view of the passive electronic component 3 shown in FIG. 8D, with one or more redistribution layers (RDLs) 252a, 252b (e.g., interconnect layer(s)) applied to the passive electronic component 3. The RDLs 252a, 252b can be provided on at least one of the first surface 265a and the second surface 265b of the insulating layer 250. The RDLs 252a, 252b can be pre-formed in some embodiments, prior to providing on the component 3. For example, in some embodiments, the RDLs 252a, 252b can be pre-formed and directly bonded to the component 3 without an intervening adhesive. In other arrangements, the RDLs 252a, 252b can be built up in layers over the insulating layer 250. The RDLs 252a, 252b can be configured to route electrical signals between selected terminals of the capacitors 220 and corresponding terminals or contact pads of the element(s) to which the passive electronic component 3 is to be connected. For example, in the embodiment of FIG. 8E, a first RDL 252a can be provided over the first surface 265a of the insulating layer 250. A second RDL 252b can be provided over the second surface 265b of the insulating layer 250. The RDLs 252a, 252b can comprise a plurality of metallic traces at least partially embedded in corresponding RDL insulating layers 266a, 266b. The first surface 12 of the passive component 3 can be defined at an upper surface of the RDL 252a, and the second surface 13 of the passive component 3 can be defined at a lower surface of the RDL 252b.

As shown in FIG. 8E, first conductive traces 253a or conductive vias of the respective RDLs 252a, 252b can electrically connect to the first electrodes or terminals 221a of the capacitor at or by way of the first terminals 232a. As shown, the traces 253a or vias (also referred to as interconnect(s)) can extend through at least a portion of the insulating material, or insulator 210b to connect to respective terminals of the capacitor. Similarly, second conductive traces 253b of the respective RDLs 252a, 252b can electrically connect to the second electrodes 221b at or by way of the second terminals 232b. In the illustrated embodiment, the terminals 232a, 232b can be defined at least in part by respective portions of the edge connectors 251a, 252b (which connect interleaving electrodes 221a, 221b), and by outermost electrodes 221a, 221b (e.g., the electrodes 221a, 221b at or near the respective first or second surfaces 265a, 265b of the capacitors 220). Thus, electrical connection to the respective electrodes 221a, 222b can be made to the edge connectors 251b and/or to the outermost electrodes 221a, 221b at the surfaces 265a, 265b.

The traces 253a, 253b can electrically connect the terminals 232a, 232b to respective interconnects 254a, 254b at the first or second surfaces 265a, 265b of the insulating material layer 250. As shown in FIG. 8E, the interconnects 254a, 254b can extend through the RDL insulators 266a, 266b and can be exposed at the first and second surfaces 12, 13. In various embodiments, as explained below, the insulating layers 266a, 266b can act as respective layers or substrates through which the interconnects (or portions thereof) can extend to connect to the capacitor. The exposed surfaces of the interconnects 254a, 254b can be configured to electrically connect to other elements, such as elements 2 (e.g., semiconductor elements such as integrated device dies), package substrates, interposers, etc. As explained herein, the RDL insulating layers 266a, 266b and the exposed surfaces of the interconnects 254a, 254b at the surfaces 12, 13 can be polished and prepared for direct bonding in various embodiments. The insulating layers 266a, 266b and the exposed interconnects 254a, 254b can be directly bonded to corresponding insulating and/or conductive features of other elements, without an intervening adhesive. In some embodiments, elements may be bonded to both surfaces 12, 13 of the component 3. In other embodiments, elements may be bonded to only one surface 12 or 13 of the passive component 3. In still other embodiments, the insulating layers 266a, 266b and/or the interconnects 254a, 254b can be bonded to the other elements with various adhesives.

As with the above-described embodiments, in some arrangements, each surface 12, 13 of the passive component 3 can comprise first and second respective interconnects 254a, 254b that connect to different types of terminals 232a, 232b on each side of the capacitor 220. For example, each of the surfaces 265a, 265b of the insulating material 250 can comprise an anode and a cathode terminal. In other embodiments, however, one surface 265a can comprise anode terminal(s) and the other surface 265b can comprise cathode terminal(s). Still other combinations of terminals can be provided herein, based on, e.g., the structure of the RDLs 252a, 252b and how they route electrical signals. For example, in the embodiments disclosed herein, some terminals 232a may connect to electrical power, and other terminals 232b may connect to electrical ground, or vice versa.

Figure 9C:
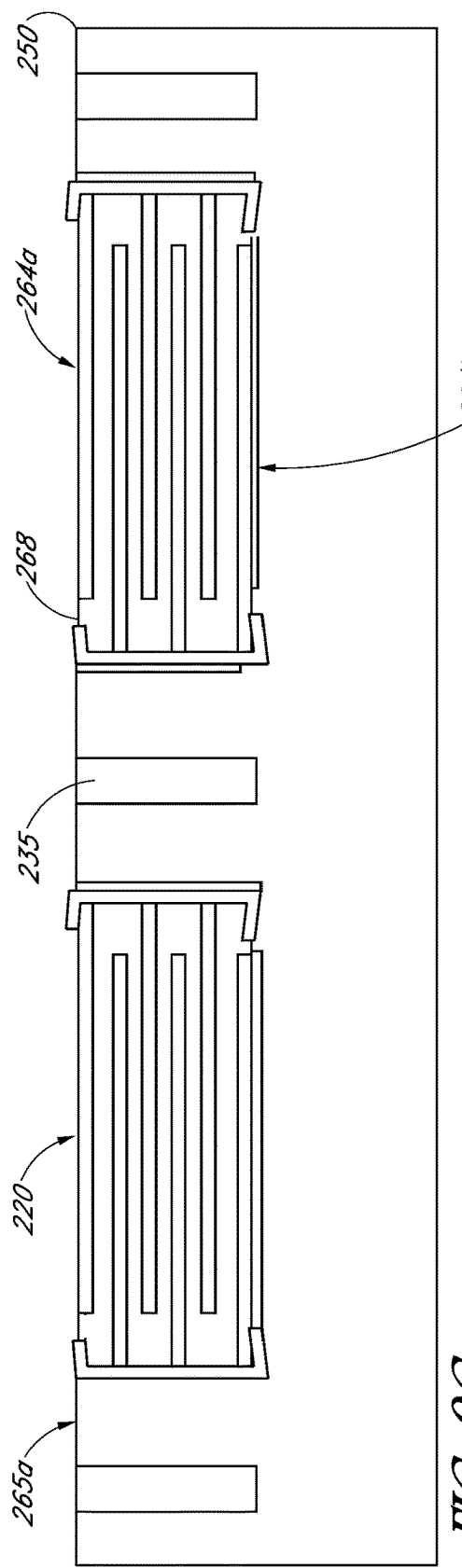
FIG. 9C is a schematic side sectional view in which one or more capacitors are provided in the cavities.

FIGS. 9A-9E illustrate a process for forming a passive electronic component 3 according to various embodiments. Unless otherwise noted, the components of FIGS. 9A-9E can be similar to or the same as like numbered components of FIGS. 7A-8E. FIG. 9A is a schematic side sectional view of an insulating layer 250. The insulating layer 250 can comprise any suitable type of insulator, such as a ceramic, a polymer, a glass, a semiconductor (e.g., silicon), etc. Turning to FIG. 9A, one or more cavities 267 can be formed in the insulating layer 250, e.g., by etching, drilling, etc. The through signal interconnects 235 (or conductive vias) can also be provided through at least a portion of the thickness of the insulating layer 250. For example, in some embodiments, holes can be formed (e.g., drilled, etched, etc.), and conducive material can be provided in the holes to form the vias or interconnects 235. In FIG. 9C, one or more capacitors 220 can be provided in the cavities 267. In some embodiments, a low CTE insulating filler 268 can be provided over and/or around the capacitors 220 in the cavities 267 in order to support, stabilize, and/or reduce stress on the capacitors 220.

Figure 9D:
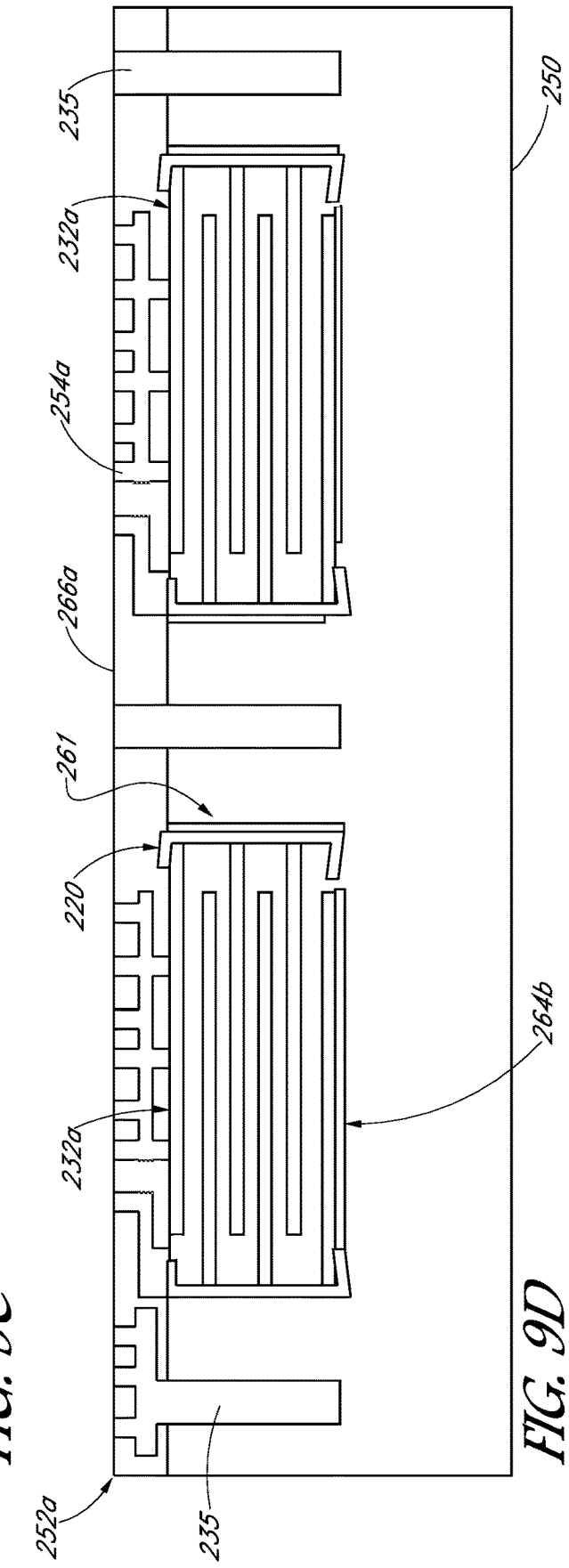
FIG. 9D is a schematic side sectional view of the device of FIG. 9C after a first RDL is provided on the insulating layer.
Figure 9E:
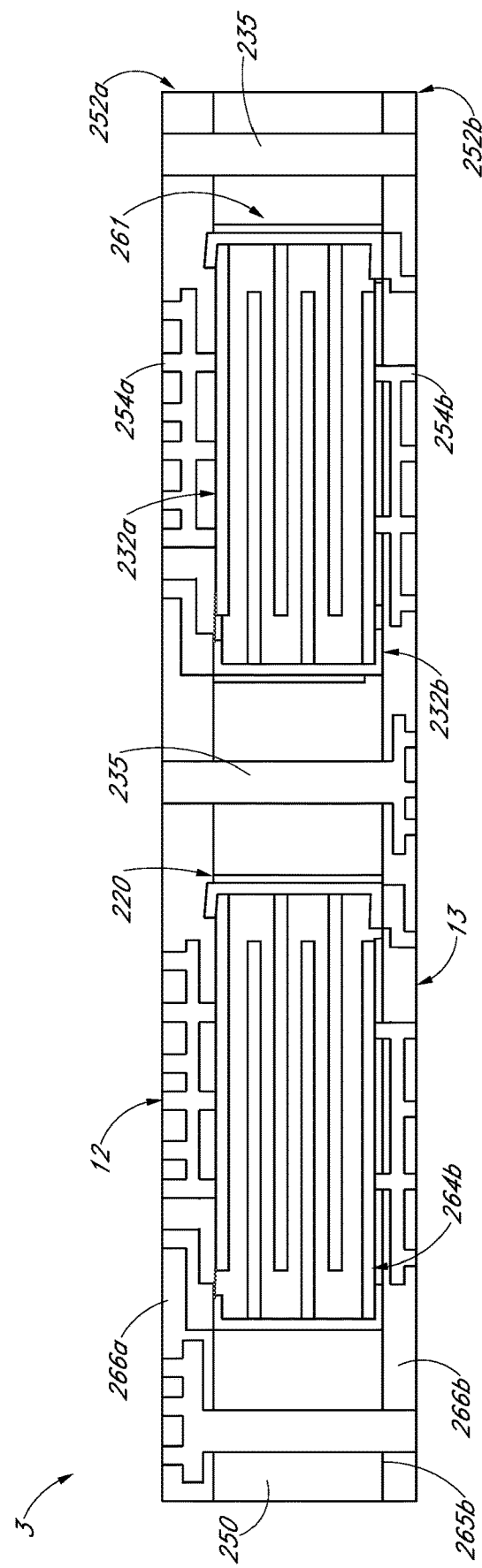
FIG. 9E is a schematic side sectional view of a passive electronic component after a second RDL is provided on an opposite side of the insulating layer.

As shown in FIG. 9D, the first RDL 252a can be provided over the first surface 265a of the insulating layer 250. Interconnects 254a in the first RDL 252a can connect to corresponding terminals 232a of the capacitor 220, and other interconnects 254b (not shown) in the first RDL 252a can connect to corresponding terminals 232b of the capacitor 220. For example, portions of the interconnects 254a, 254b can extend through the insulating layer 266a, 266b of the RDLs 252a, 252b (which can act as insulating layers or substrates) to connect to the capacitor. In FIG. 9E, the back side of the insulating material 250 can be partially removed (e.g., polished, grinded, etched, etc.) to expose the surface 264b of the capacitor 220 and the ends of the vias 235. The second RLD 252b can be provided over the surface 265b of the insulating material 250 and the surface 264b of the capacitor 220. As explained above, the RDLs 252a, 252b can be bonded (e.g., direct bonded in some arrangements) to the insulating layer 250 and the capacitors 220. In other embodiments, the RDLs 252a, 252b can be bonded in other ways, e.g., using adhesives. In still other embodiments, the RDLs 252a, 252b can be built up layer-by-layer.

As with the embodiment of FIGS. 8D-8E, in FIG. 9E, the capacitor 3 can be embedded in the insulating layer 250, which can act as an insulating element between the insulating layers 266a, 266b. For example, as shown in FIG. 9E, the insulating layer 250 can be disposed along the side edges 261 of the capacitors 220, and may cover a majority of the side edges 261, e.g., all or substantially the entirety of the side edges 261. In the embodiment of FIG. 9E, the RDLs 252a, 252b can be provided over the upper and lower surfaces 264a, 264b of the capacitors 220. Unlike FIGS. 8D-8E, however, in FIG. 9E, the capacitor 3 is not monolithically integrated with the insulating material 250, but is instead inserted in the cavities 267 (with the filler 268). As with other embodiments disclosed herein, each surface 12, 13 of the passive component 3 can comprise different types of terminals, e.g., each surface 12, 13 can comprise an anode terminal or interconnect and a cathode terminal or interconnect. In other embodiments, one surface 12 may comprise only anode terminals or interconnects, and the other surface 13 may comprise only cathode terminals or interconnects, or vice versa. In various embodiments, a pitch of the interconnects 254a and/or 254b on the first surface 12 of the component may have a pitch smaller than a pitch of the interconnects 254a, 254b on the second surface 13. For example, the interconnects 254a and/or 254b on the first surface 12 may be spaced and configured for direct bonding to another element. In some embodiments, a pitch of the interconnects 254a and/or 254b on the first surface 12 can be 50 microns or less, 10 microns or less, or 1 micron or less. In some embodiments, terminals of the capacitor 220 can be connected to corresponding interconnects 254a and/or 254b of the RDL at the first surface 12, and may not be connected to any interconnects at the second surface 13, or vice versa.

Figure 10A:
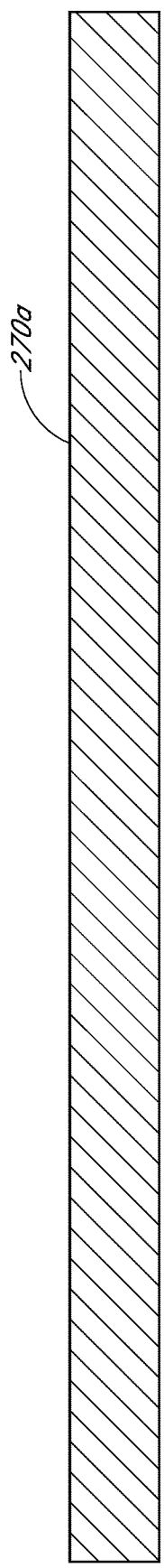
FIG. 10A is a schematic side sectional view of a first insulating carrier used to form a passive electronic component, according to another embodiment.
Figure 10B:
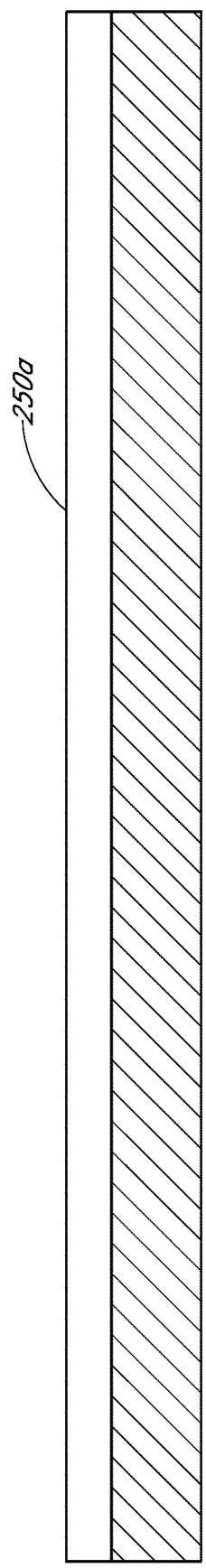
FIG. 10B is a schematic side sectional view of the first insulating carrier with a first adhesive deposited thereon.

FIGS. 10A-10G illustrate another method for forming a passive electronic component 3 in which the passive component is embedded in an insulating layer 250. FIG. 10A is a schematic side sectional view of a first insulating substrate 270a. The first insulating substrate 270a can comprise any suitable type of insulator, such as a ceramic, a polymer, a glass, an insulating composite, etc. Beneficially, the substrates 270a, 270b can comprise a material that has a coefficient of thermal expansion (CTE) of no more than 6 ppm/° C., or no more than 5 ppm/° C. In various embodiments, the CTE of the substrates 270a, 270b can be in a range of 2 ppm/° C. to 6 ppm/° C., in a range of 3 ppm/° C. to 6 ppm/° C., or in a range of 3 ppm/° C. to 5 ppm/° C. In various embodiments, the substrates 270a, 270b can comprise the same material. In other embodiments, the substrates 270a, 270b may comprise different materials. Turning to FIG. 10B, a first adhesive 250a can be applied or deposited on the first insulating substrate 270a. The first adhesive 250a can comprise any suitable type of adhesive, such as an insulating adhesive. In various embodiments, the first adhesive 250a can comprise a non-conductive epoxy.

Figure 10C:
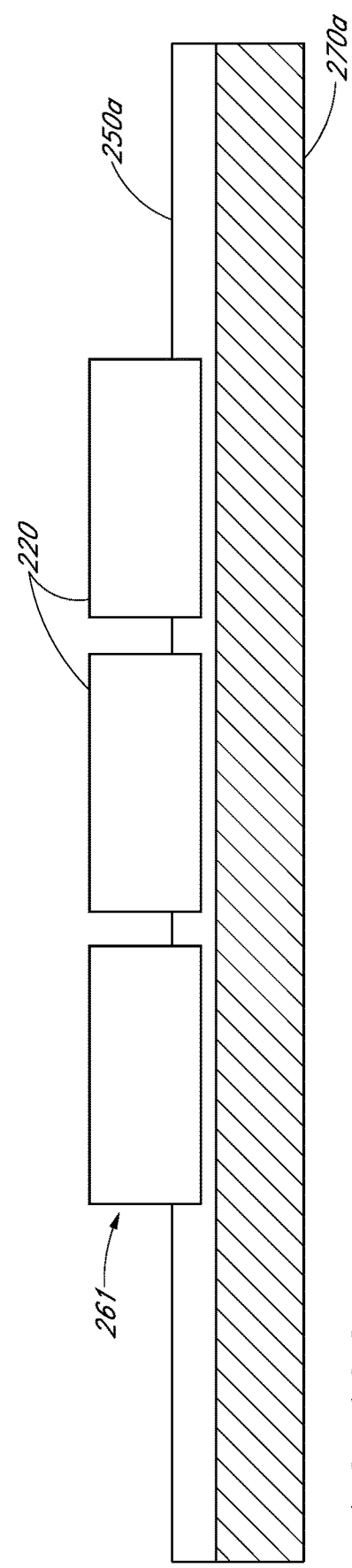
FIG. 10C is a schematic side sectional view of the first insulating carrier with a plurality of capacitors bonded to the first insulating carrier by way of the first adhesive.
Figure 10D:
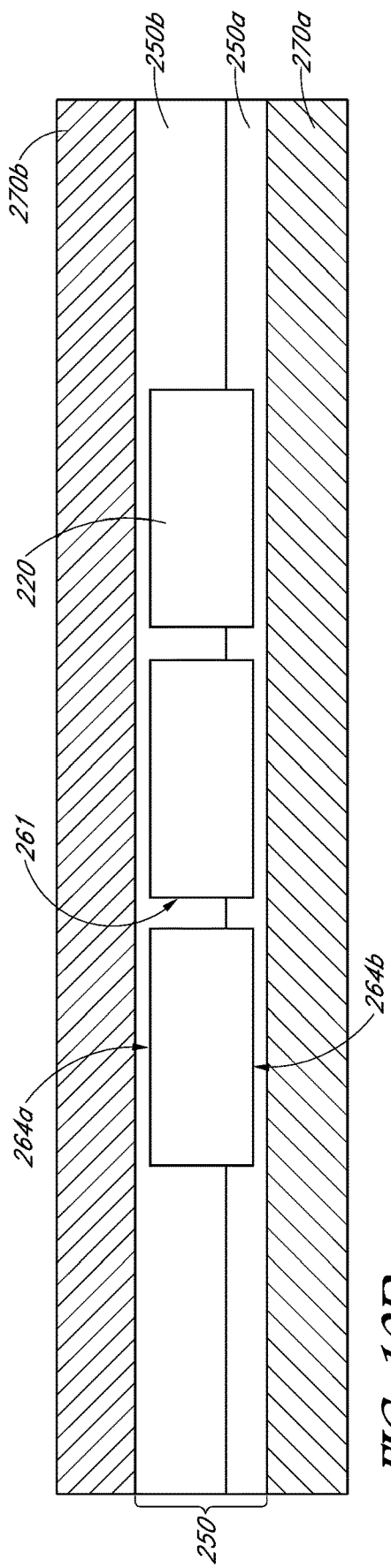
FIG. 10D is a schematic side sectional view of a partially defined component in which a second insulating carrier layer is adhered to the first adhesive layer by way of a second adhesive layer.

In FIG. 10C, the capacitors 220 can be provided (e.g., placed, deposited, etc.) on the first adhesive layer 250a. In some embodiments, the capacitors 220 can partially embed within the first adhesive layer 250a such that at least a portion of the first adhesive layer 250a is disposed along the side edge 261 of the capacitor 220 and that at least another portion of the first adhesive layer 250a is disposed along the second surface 264b of the capacitor 220. In FIG. 10D, a second adhesive layer 250b can be provided or applied over and around the capacitors 220. As shown in FIG. 10D, at least a portion of the second adhesive layer 250b can be disposed along the side edge 261 of the capacitor 220, and at least another portion of the second adhesive layer 250b can be disposed along the first surface 264a of the capacitor 220. A second insulating substrate 270b (which may comprise the same insulating material or a different insulating material from the first substrate 270a). Thus, in FIG. 10D, the insulating layer 250 can comprise the first and second adhesive layers 250a, 250b, and the capacitors 220 can be fully embedded within the insulating layer.

Figure 10E:
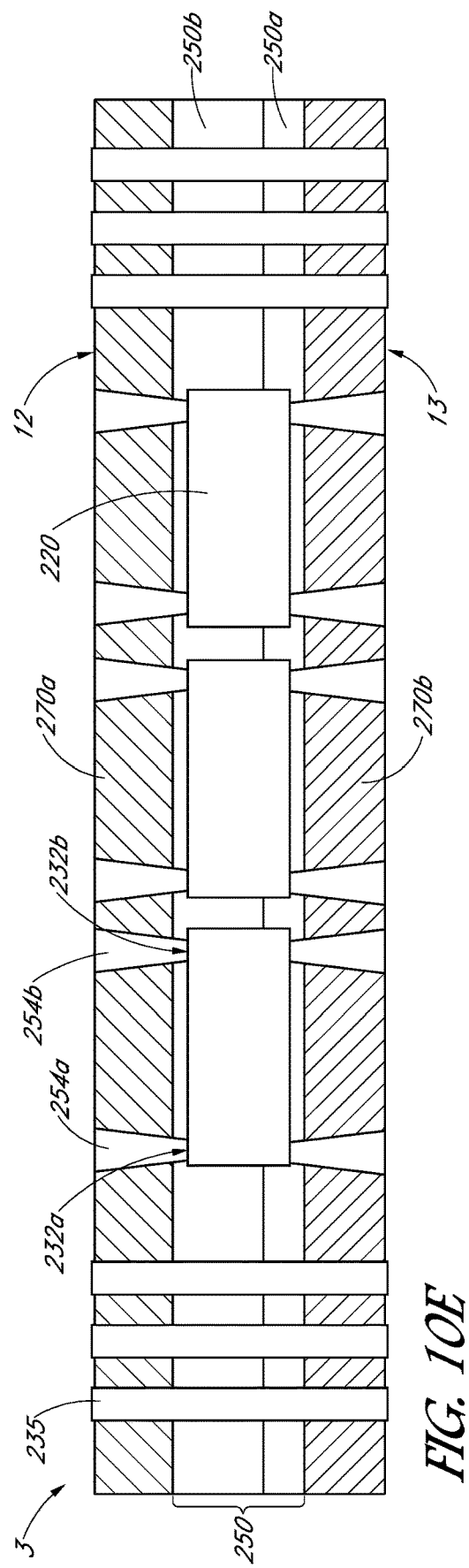
FIG. 10E is a schematic side sectional view of a passive electronic component having various interconnects and traces defined therein for electrical communication with external elements.

Turning to FIG. 10E, conductive interconnects can be formed in the passive component 3. For example, the through conductive vias 235 can be provided in through holes provided through the thickness of the passive component 3, so as to provide through electrical communication in the component 3. Additionally, interconnects 254a, 254b can be formed in corresponding holes of the insulating substrates 270a, 270b in order to electrically connect with corresponding terminals 232a, 232b of the capacitors 220. Thus, in the embodiments disclosed herein, the insulating substrates 270a, 270b can act as interconnect layers to provide electrical communication with other elements or devices. As with other embodiments disclosed herein, each surface 12, 13 of the passive component 3 can comprise different types of terminals, e.g., each surface 12, 13 can comprise an anode terminal or interconnect 254a and a cathode terminal or interconnect 254b. In other embodiments, one surface 12 may comprise only anode terminals or interconnects, and the other surface 13 may comprise only cathode terminals or interconnects, or vice versa.

As shown in FIG. 10E, the adhesives 250a, 250b can serve as an insulating element disposed between the first and second substrates. The interconnects 254a, 254b can act as conductive vias that extend through at least a portion of the insulating element (e.g., portions of the first and second adhesives 250a, 250b). Further, the interconnects 254a, 254b can extend through the substrates 270a, 270b to connect to the capacitors. The adhesives 250a, 250b can be disposed adjacent to (and/or contacting) side edges of the capacitor 220. As shown, the capacitors 220 can be disposed in a first region between the first and second substrates 270a, 270b, and the insulating element (e.g., adhesives 250a, 250b of the insulating material 250) can be disposed in a different second region between the first and second substrates 270a, 270b. Beneficially, the use of the low CTE substrates 270a, 270b and intervening insulating material 250 can provide the overall passive component 3 with a low overall effective CTE that is close to the CTE of the component(s) to which the passive component 3 is to be mounted, e.g. a semiconductor or silicon substrate. In such arrangements, beneficially, the overall effective CTE of the passive component 3 (e.g., including the insulating and conductive materials shown in FIG. 10E) can be no more than 8 ppm/° C., no more than 7 ppm/° C., or no more than 6 ppm/° C. In various embodiments, the overall effective CTE of the passive component 3 (also referred to as a microelectronic device herein) can be in a range of 3 ppm/° C. to 7 ppm/° C., in a range of 4 ppm/° C. to 8 ppm/° C., or in a range of 4 ppm/° C. to 7 ppm/° C.

Figure 10F:
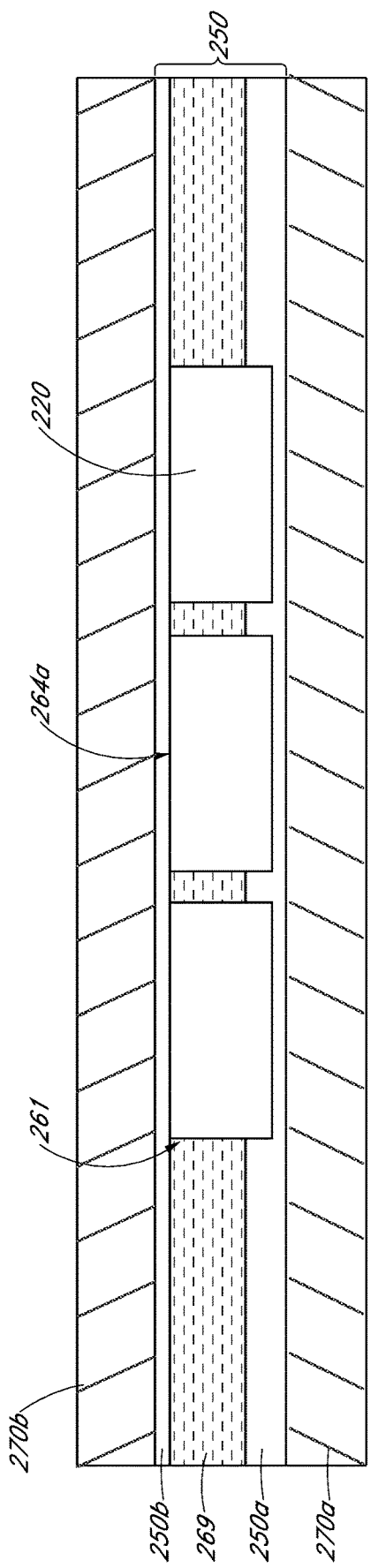
FIG. 10F is a schematic side sectional view of a partially-fabricated passive electronic component comprising capacitors embedded in an insulating layer comprising a plurality of adhesives and a molding compound.

FIG. 10F illustrates an alternative method for forming a passive component after the step shown in FIG. 10C. For example, subsequent to providing the capacitors 220 on the first adhesive layer 250a in FIG. 10C, instead of providing the second adhesive 250b over the capacitors 220 and the first adhesive layer 250a as shown in FIG. 10D, a molding compound 269 can be provided at least around the side edges 261 of the capacitors 220. The molding compound 269 can comprise an insulating sub-layer of the insulating layer 250, e.g., the molding compound 269 can comprise a non-conductive epoxy, encapsulant, etc. In some embodiments, the molding compound 269 may be applied around only the side edges 261. In other embodiments, the molding compound 269 can be applied around the side edges 261 and the surfaces 264a of the capacitors. The portions of the molding compound 269 over the surfaces 264a may be removed in any suitable manner.

Figure 10G:
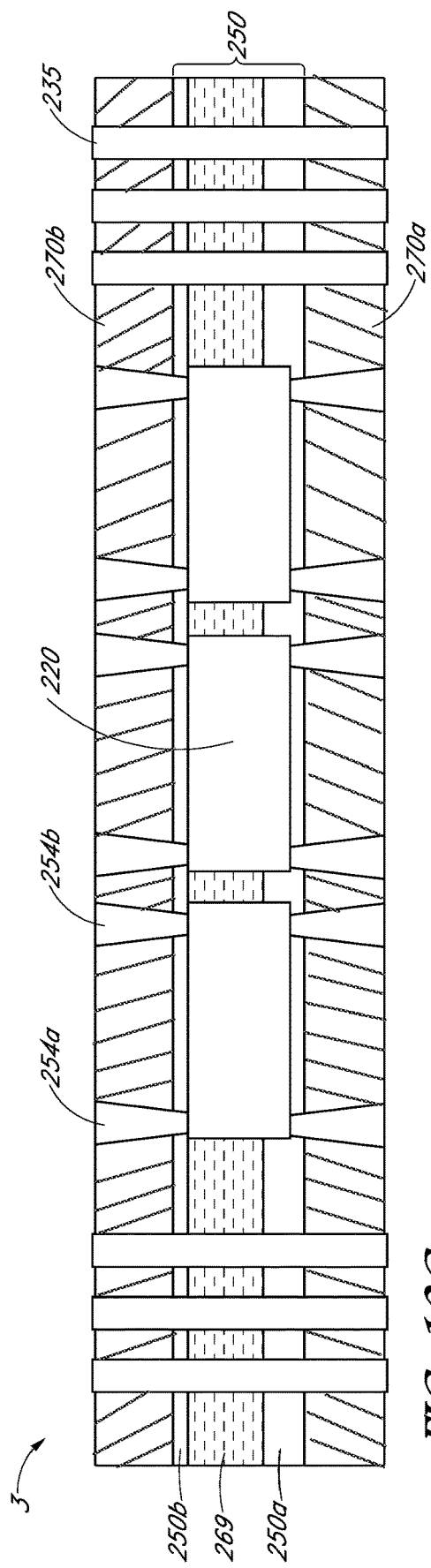
FIG. 10G is a schematic side sectional view of a passive electronic component, according to various embodiments.

Further, as shown in FIG. 10F, the second adhesive layer 250b (which can comprise a non-conductive or insulating adhesive) can be applied over the first surface 264a and the upper surface of the molding compound 269. The second insulating substrate 270b can be provided over the second adhesive layer 250b. Thus, in the embodiment of FIG. 10F, the insulating layer 250 can comprise the first and second adhesive layers 250a, 250b and the molding compound 269. The capacitors 220 can be embedded in (e.g., completely embedded in) the insulating layer 250. Turning to FIG. 10G, as with FIG. 10E, through vias 235 and interconnects 254a, 254b can be provided to provide electrical communication through the component 3 and to the capacitors 220, respectively.

The adhesives 250a, 250b, and the molding compound 269 can serve as an insulating element disposed between the first and second substrates 270a, 270b. The interconnects 254a, 254b can act as conductive vias that extend through at least a portion of the insulating element (e.g., portions of the first and second adhesives 250a, 250b). Further, the interconnects 254a, 254b can extend through the substrates 270a, 270b to connect to the capacitors. In FIG. 10G, the adhesives 250a, 250b can be disposed adjacent to (and/or contacting) upper surfaces of the capacitor 220. The molding compound 269 can be disposed adjacent to (and or contacting) side edges of the capacitors 220. The capacitors 220 can therefore be embedded within the insulating element (e.g., embedded within the adhesives 250a, 250b and the molding compound 269. As shown, the capacitors 220 can be disposed in a first region between the first and second substrates 270a, 270b, and at least a portion of the insulating element (e.g., adhesives 250a, 250b of the insulating material 250) can be disposed in a different second region between the first and second substrates 270a, 270b. Beneficially, the use of the low CTE substrates 270a, 270b and intervening insulating material 250 can provide the overall passive component 3 with a low overall effective CTE that is close to the CTE of the component(s) to which the passive component 3 is to be mounted, e.g. a semiconductor or silicon substrate. In such arrangements, beneficially, the overall effective CTE of the passive component 3 (e.g., including the insulating and conductive materials shown in FIG. 10G) can be no more than 8 ppm/° C., no more than 7 ppm/° C., or no more than 6 ppm/° C. In various embodiments, the overall effective CTE of the passive component 3 (also referred to as a microelectronic device herein) can be in a range of 3 ppm/° C. to 7 ppm/° C., in a range of 4 ppm/° C. to 8 ppm/° C., or in a range of 4 ppm/° C. to 7 ppm/° C. The component 3 of FIGS. 10A-10G can comprise a laminated structure in which a plurality of substrates (such as substrates 270a, 270b) can be coupled to one or more capacitors, e.g, by way of one or more adhesives and/or by way of a molding compound. In the illustrated embodiments, the substrates 270a, 270b may comprise materials or layers that are laminated or applied to the capacitor 220 without being deposited using a deposition process.

Figure 11A:
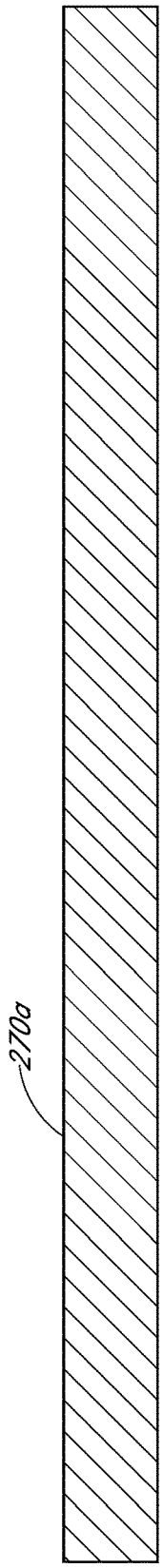
FIG. 11A is a schematic side sectional view of a first insulating carrier used to form a passive electronic component, according to another embodiment.
Figure 11B:
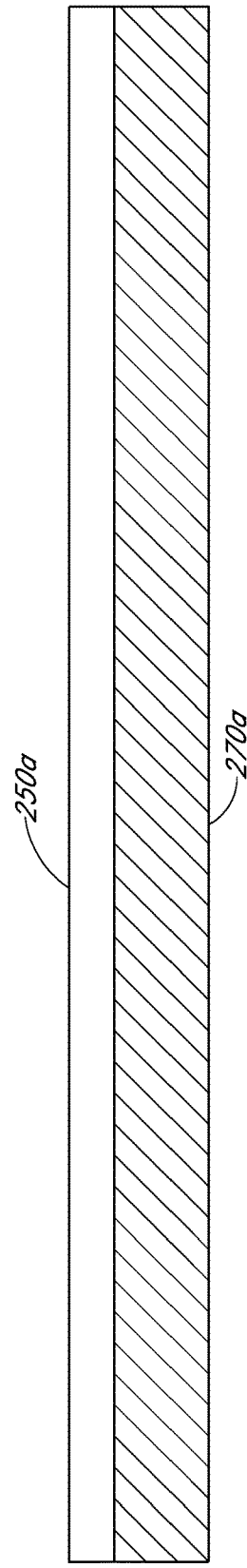
FIG. 11B is a schematic side sectional view of the first insulating carrier with a first adhesive deposited thereon.
Figure 11C:
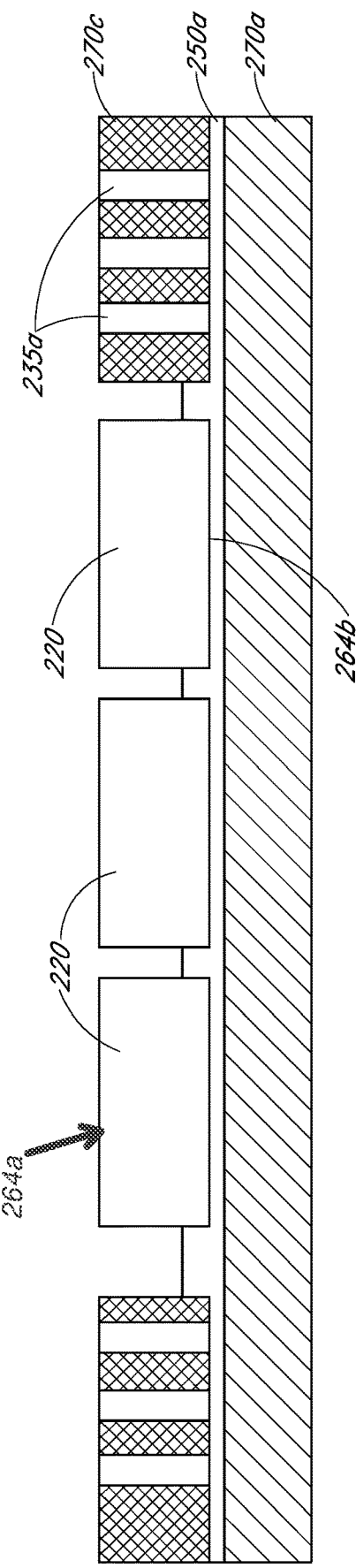
FIG. 11C is a schematic side sectional view of the first insulating carrier with a plurality of capacitors and a third insulating carrier bonded to the first insulating carrier by way of the first adhesive.

FIGS. 11A-11G illustrate another method for forming a passive electronic component 3 in which the passive component is embedded in an insulating layer 250. FIGS. 11A-11B are generally the same as FIGS. 10A-10B, respectively. In FIG. 11C, however, a third insulating substrate 270c can be provided over the first adhesive layer 250a and around the capacitors 220. The third insulating substrate 270c may be the same material as the substrates 270a, 270b. In other embodiments, the material of the third substrate 270c may differ from the material(s) of the substrates 270a, 270b. The first adhesive layer 250a can be provided over the second surface 264b and over portions of the side edges 261. As shown in FIG. 11C, beneficially, first via portions 235a can be provided through the third insulating substrate 270. The first via portions 235a can define a part of the through signal via or interconnect 235.

Figure 11D:
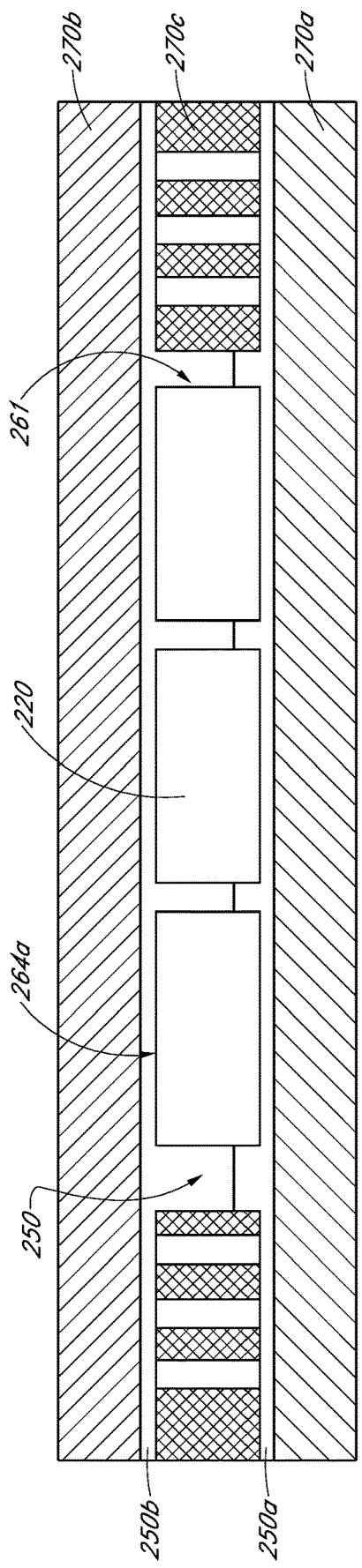
FIG. 11D is a schematic side sectional view of a partially defined component in which a second insulating carrier layer is adhered to the first adhesive layer and the third carrier by way of a second adhesive layer.

As with FIG. 10D, in FIG. 11D, the second adhesive 250b can be provided over and around the capacitors 220. For example, the second adhesive layer 250b can be provided around portions of the side edges 261 of the capacitors 220 and over the first surfaces 264a of the capacitors 220. The second insulating substrate 270b can be provided or deposited over the second adhesive layer 250b. Thus, in FIG. 11D, the capacitors 220 can be embedded in the insulating layer 250, which can comprise the first and second adhesive layers 250a, 250b. In the illustrated embodiment, for example, the capacitors 220 can be completely or fully embedded in the insulating layer 250, such that portions of the insulating layer cover most or all of the surfaces of the capacitors 220.

Figure 11E:
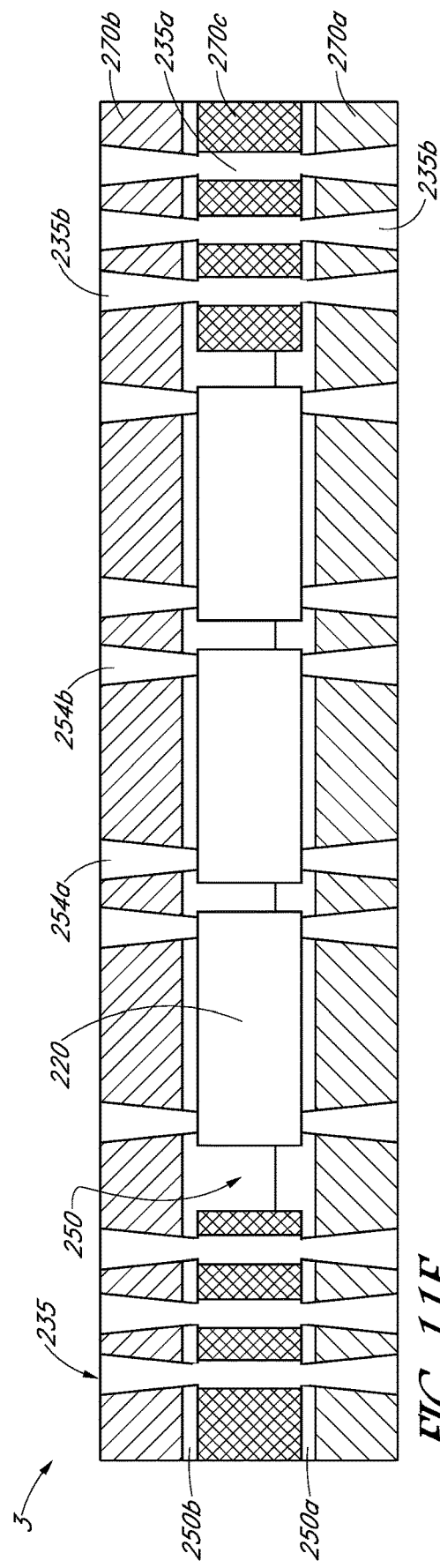
FIG. 11E is a schematic side sectional view of a passive electronic component having various interconnects and traces defined therein for electrical communication with external elements.

Turning to FIG. 11E, interconnects 254a, 254b can be provided to connect to the terminals 232a, 232b of the capacitors 220. Second via portions 235b can be provided in each of the first and second insulating substrates 270a, 270b. The second via portions 235b can be electrically connected to the first via portions 235a formed through the third insulating substrate 270c. For example, in some embodiments, the first via portions 235a can be directly bonded to corresponding second via portions 235b without an intervening adhesive. In other embodiments, the first vias portions 235a can be bonded to second via portions 235b with a conductive adhesive. Advantageously, using the first via portions 235a in the third insulating substrate 270c can enable a layer-by-layer construction of the resulting through via or interconnect 235, without providing through holes through the insulating layer 250. Instead, the third insulating substrate 270c can have a thickness about the same as the thickness of the capacitors 220 such that separate vias need not be formed through the insulating layer 250.

As above, the adhesives 250a, 250b, and the third substrate 270c can serve as an insulating element disposed between the first and second substrates 270a, 270b. The interconnects 254a, 254b can act as conductive vias that extend through at least a portion of the insulating element (e.g., portions of the first and second adhesives 250a, 250b). Further, the interconnects 254a, 254b can extend through the substrates 270a, 270b to connect to the capacitors. In FIG.

11E, the insulating material 250 can be disposed adjacent to (and/or contacting) upper surfaces of the capacitors 220 and side edges of the capacitors 220. The capacitors 220 can therefore be embedded within the insulating element. As shown, the capacitors 220 can be disposed in a first region between the first and second substrates 270a, 270b, and at least a portion of the insulating element (e.g., portions of adhesives 250a, 250b and the third substrate(s) 270c) can be disposed in a different second region between the first and second substrates 270a, 270b. Beneficially, the use of the low CTE substrates 270a, 270b, the third intervening substrate 270c, and intervening insulating material 250 can provide the overall passive component 3 with a low overall effective CTE that is close to the CTE of the component(s) to which the passive component 3 is to be mounted, e.g. a semiconductor or silicon substrate. In such arrangements, beneficially, the overall effective CTE of the passive component 3 (e.g., including the insulating and conductive materials shown in FIG. 11E) can be no more than 8 ppm/° C., no more than 7 ppm/° C., or no more than 6 ppm/° C. In various embodiments, the overall effective CTE of the passive component 3 (also referred to as a microelectronic device herein) can be in a range of 3 ppm/° C. to 7 ppm/° C., in a range of 4 ppm/° C. to 8 ppm/° C., or in a range of 4 ppm/° C. to 7 ppm/° C.

Figure 11F:
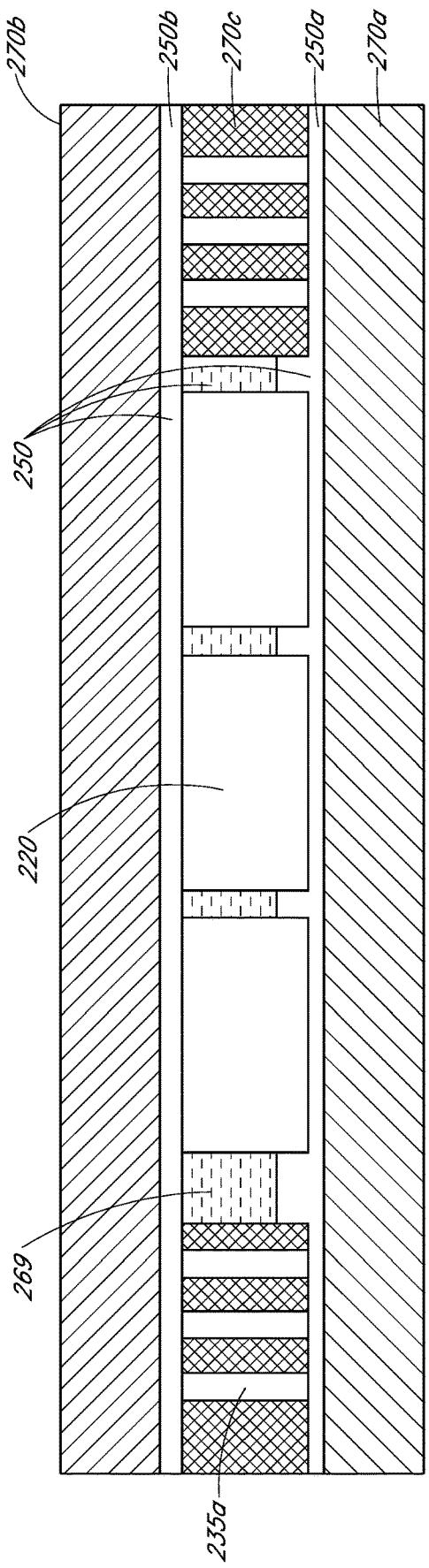
FIG. 11F is a schematic side sectional view of a partially-fabricated passive electronic component comprising capacitors embedded in an insulating layer comprising a plurality of adhesives and a molding compound.

FIG. 11F illustrates an alternative method for forming a passive component after the step shown in FIG. 11C. For example, subsequent to providing the capacitors 220 on the first adhesive layer 250a in FIG. 11C, instead of providing the second adhesive 250b over the capacitors 220, the third substrate 270c, and the first adhesive layer 250a as shown in FIG. 11D, a molding compound 269 can be provided at least around the side edges 261 of the capacitors 220. The molding compound 269 can comprise an insulating sublayer of the insulating layer 250, e.g., the molding compound 269 can comprise a non-conductive epoxy, encapsulant, etc. In some embodiments, the molding compound 269 may be applied around only the side edges 261. In other embodiments, the molding compound 269 can be applied around the side edges 261 and the surfaces 264a of the capacitors. The portions of the molding compound 269 over the surfaces 264a may be removed in any suitable manner.

Figure 11G:
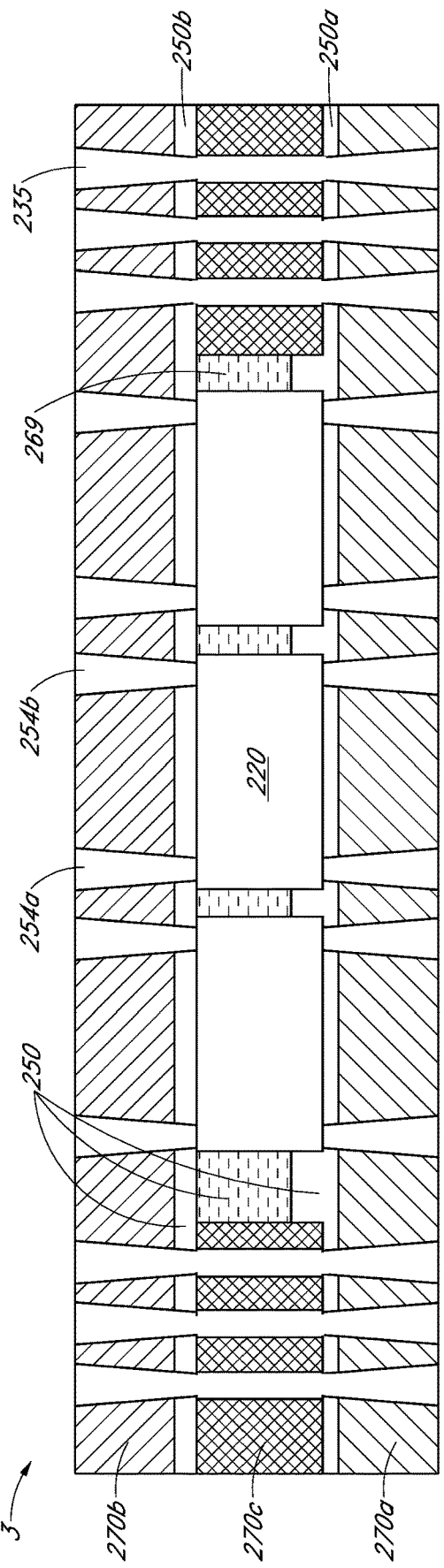
FIG. 11G is a schematic side sectional view of a passive electronic component, according to various embodiments.

Further, as shown in FIG. 11F, the second adhesive layer 250b (which can comprise a non-conductive or insulating adhesive) can be applied over the first surface 264a and the upper surface of the molding compound 269. The second insulating substrate 270b can be provided over the second adhesive layer 250b. Thus, in the embodiment of FIG. 11F, the insulating layer 250 can comprise the first and second adhesive layers 250a, 250b and the molding compound 269. The capacitors 220 can be embedded in (e.g., completely embedded in) the insulating layer 250. Turning to FIG. 11G, as with FIG. 11E, through vias 235 and interconnects 254a, 254b can be provided to provide electrical communication through the component 3 and to the capacitors 220, respectively.

The adhesives 250a, 250b, and the molding compound 269 (e.g., the insulating material 250) can serve as an insulating element disposed between the first and second substrates 270a, 270b. The interconnects 254a, 254b can act as conductive vias that extend through at least a portion of the insulating element (e.g., portions of the first and second adhesives 250a, 250b). Further, the interconnects 254a, 254b can extend through the substrates 270a, 270b to connect to the capacitors. In FIG. 11G, the adhesives 250a, 250b can be disposed adjacent to (and/or contacting) upper surfaces of the capacitor 220. The molding compound 269 can be disposed adjacent to (and or contacting) side edges of the capacitors 220. The capacitors 220 can therefore be embedded within the insulating element (e.g., embedded within the adhesives 250a, 250b and the molding compound 269). As shown, the capacitors 220 can be disposed in a first region between the first and second substrates 270a, 270b, and at least a portion of the insulating element (e.g., adhesives 250a, 250b of the insulating material 250 and the molding compound 269) can be disposed in a different second region between the first and second substrates 270a, 270b. Beneficially, the use of the low CTE substrates 270a, 270b and intervening insulating element can provide the overall passive component 3 with a low overall effective CTE that is close to the CTE of the component(s) to which the passive component 3 is to be mounted, e.g. a semiconductor or silicon substrate. In such arrangements, beneficially, the overall effective CTE of the passive component 3 (e.g., including the insulating and conductive materials shown in FIG. 11G) can be no more than 8 ppm/° C., no more than 7 ppm/° C., or no more than 6 ppm/° C. In various embodiments, the overall effective CTE of the passive component 3 (also referred to as a microelectronic device herein) can be in a range of 3 ppm/° C. to 7 ppm/° C., in a range of 4 ppm/° C. to 8 ppm/° C., or in a range of 4 ppm/° C. to 7 ppm/° C.

Figure 11H:
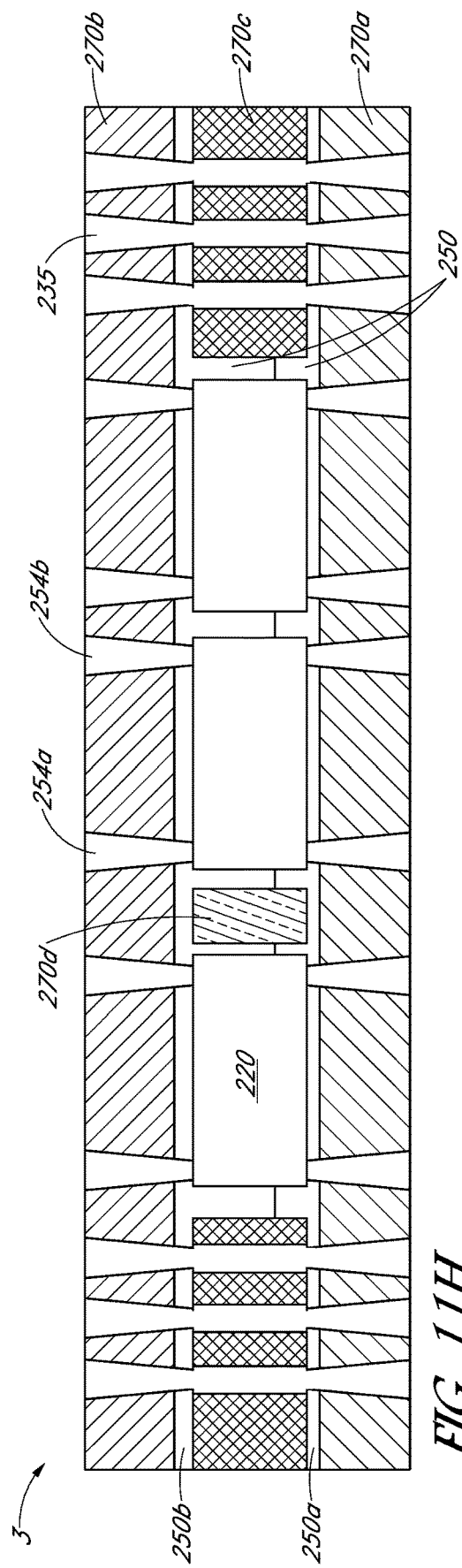
FIG. 11H is a schematic side sectional view of a passive electronic component having additional insulating carrier layers.
Figure 11I:
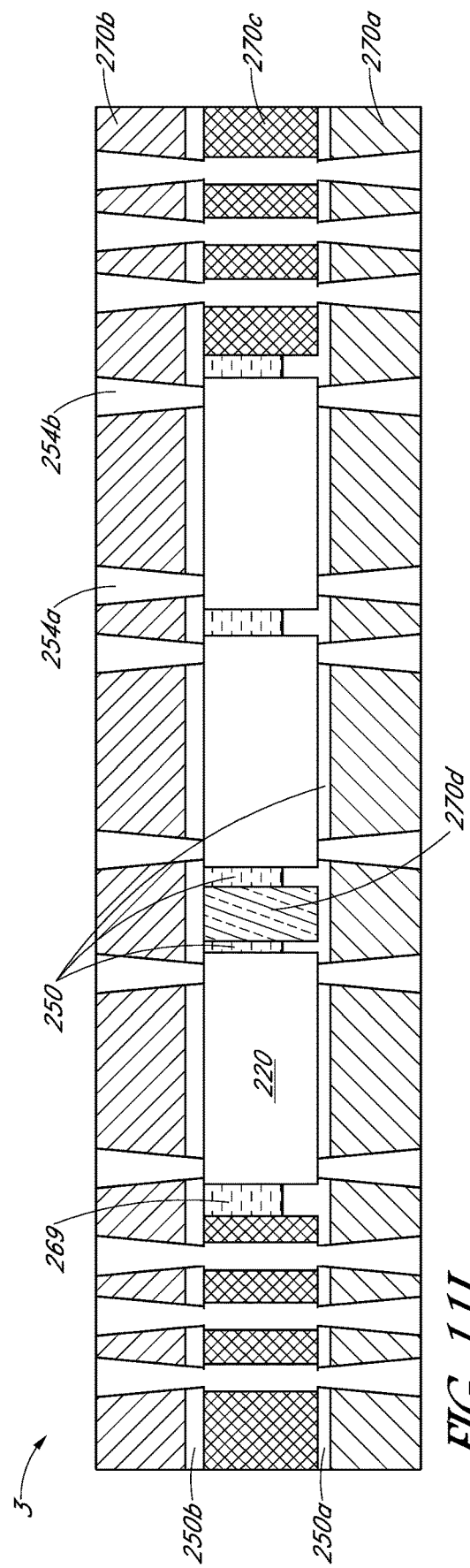
FIG. 11I is a schematic side sectional view of a passive electronic component having additional insulating carrier layers and a molding compound over the passive component.

FIGS. 11H and 11I illustrate alternative arrangements to FIGS. 11E and 11G, respectively. In FIG. 11H, for example, additional insulating substrates 270d can be provided around the capacitors 220. The substrate 270d may comprise a material that is the same as or different from the substrates 270a-270c. In FIG. 11I, the molding compound 269 can be provided as part of the insulating layer 250. The features of FIGS. 11H and 11I may otherwise be generally similar to the features explained above in FIGS. 11A-11G. The component 3 of FIGS. 11A-11I can comprise a laminated structure in which a plurality of substrates (such as substrates 270a, 270b) can be coupled to one or more capacitors, e.g, by way of one or more adhesives, by an intervening third substrate 270c, and/or by way of a molding compound. In the illustrated embodiments, the substrates 270a, 270b may comprise materials or layers that are laminated or applied to the capacitor 220 without being deposited using a deposition process.

Figure 12A:
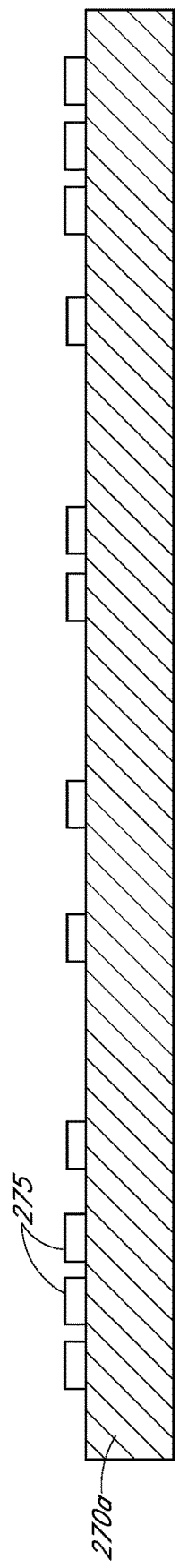
FIG. 12A is a schematic side sectional view of a first insulating carrier used to form a passive electronic component and having a plurality of contact pads thereon, according to another embodiment.
Figure 12B:
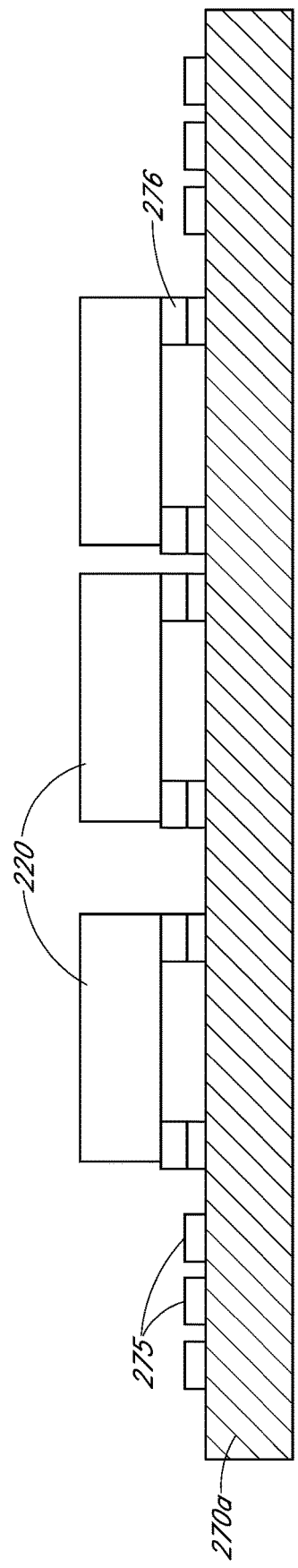
FIG. 12B is a schematic side sectional view of the first insulating carrier with a first adhesive comprising solder that electrically and mechanically connects the capacitors to the first insulating carrier.
Figure 12C:
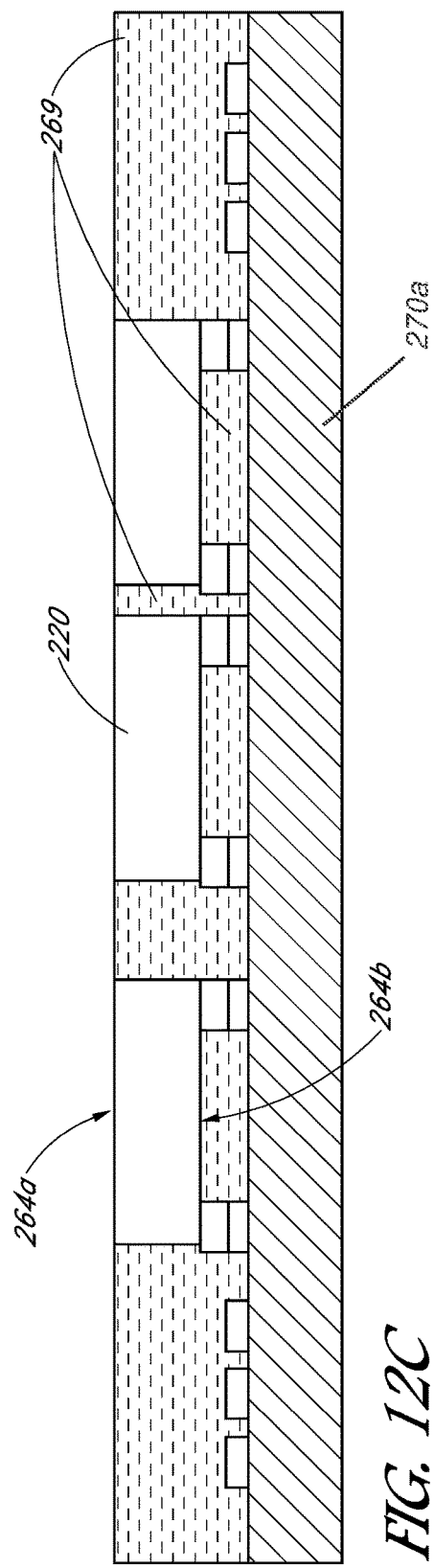
FIG. 12C is a schematic side sectional view of the first insulating carrier with a plurality of capacitors and a molding compound disposed about the capacitors.

FIGS. 12A-12E illustrate another method for forming a passive electronic component 3. In FIG. 12A, the first insulating substrate 270a can have a plurality of conductive contact pads 275 on an exterior surface thereof. In FIG. 12B, the capacitors 220 can be connected to the contact pads 275 of the substrate 270a by way of a first adhesive, e.g., by way of a conductive adhesive 276, which comprises solder in the illustrated embodiment. In other embodiments, the capacitors 220 can be connected to the contact pads 275 by direct bonding without an intervening adhesive. Turning to FIG. 12C, a molding compound 269 can be provided around and/or over the capacitors 220 and over surfaces of the substrate layer 270a.

Figure 12D:
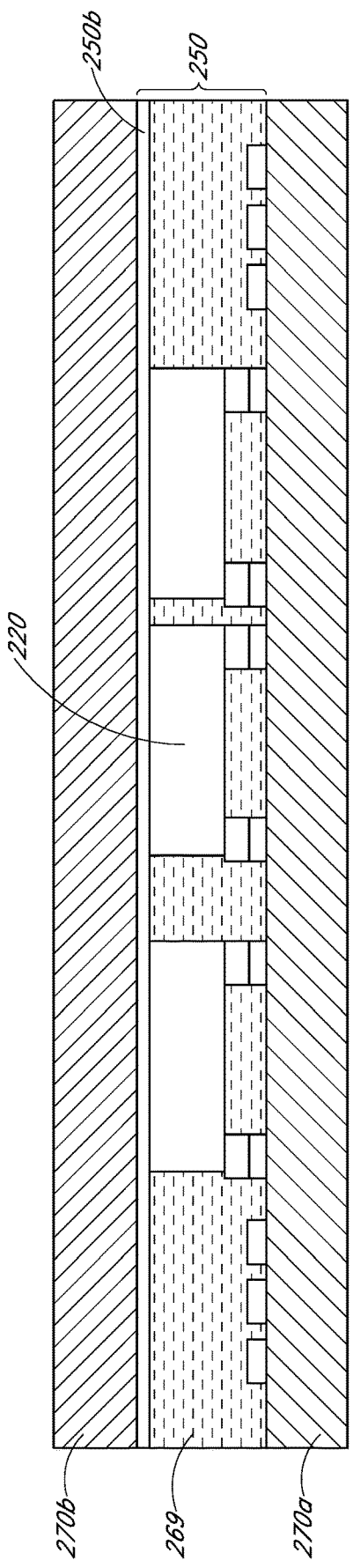
FIG. 12D is a schematic side sectional view of a partially defined component in which a second insulating carrier layer is adhered to the first adhesive layer and the molding compound by way of a second adhesive layer.
Figure 12E:
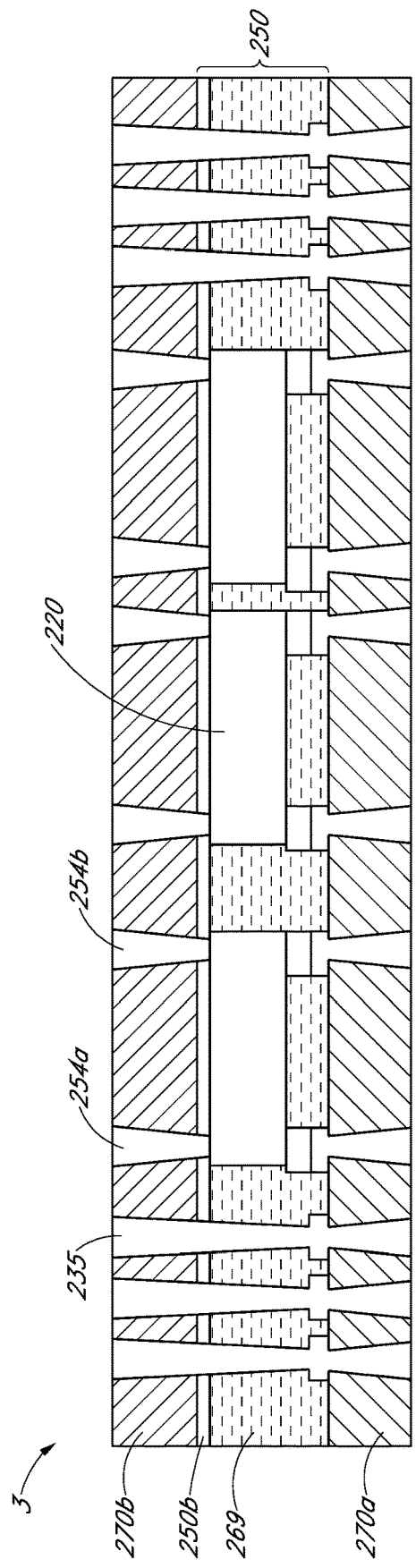
FIG. 12E is a schematic side sectional view of a passive electronic component having various interconnects and traces defined therein for electrical communication with external elements.

In FIG. 12D, the adhesive layer 250b can be applied over the upper surface of the molding compound 269 and over the first surfaces 264a of the capacitors 220. The second insulating substrate 270b can be provided over the adhesive layer 250b. In the embodiment of FIG. 12D, therefore, the capacitors 220 can be embedded in the insulating layer 250, which can be defined by the molding compound 269 (which is applied over the second surfaces 264b of the capacitors 220 and the side edges 261) and the adhesive layer 250b (which is applied over the first surfaces 264a of the capacitors 220). In the illustrated embodiment, the capacitors 220 can be completely or fully embedded in the insulating layer 250. In FIG. 12E, as explained above, various traces and interconnects 254a, 254b can penetrate through a portion of the insulating layer 250 to connect to terminals of the capacitors 220.

The insulating material 250 (e.g., the adhesive 250b and molding compound 269) can serve as an insulating element disposed between the first and second substrates 270a, 270b. The interconnects 254a, 254b can act as conductive vias that extend through at least a portion of the insulating element (e.g., portions of the adhesive 250b). Further, the interconnects 254a, 254b can extend through the substrates 270a, 270b to connect to the capacitors. In FIG. 12E, the molding compound 269 can be disposed adjacent to side edges of the capacitors 220. The capacitors 220 can therefore be embedded within the insulating element (e.g., embedded within the adhesive 250b and the molding compound 269). As shown, the capacitors 220 can be disposed in a first region between the first and second substrates 270a, 270b, and at least a portion of the insulating element can be disposed in a different second region between the first and second substrates 270a, 270b. Beneficially, the use of the low CTE substrates 270a, 270b and intervening insulating element can provide the overall passive component 3 with a low overall effective CTE that is close to the CTE of the component(s) to which the passive component 3 is to be mounted, e.g. a semiconductor or silicon substrate. In such arrangements, beneficially, the overall effective CTE of the passive component 3 (e.g., including the insulating and conductive materials shown in FIG. 12E) can be no more than 8 ppm/° C., no more than 7 ppm/° C., or no more than 6 ppm/° C. In various embodiments, the overall effective CTE of the passive component 3 (also referred to as a microelectronic device herein) can be in a range of 3 ppm/° C. to 7 ppm/° C., in a range of 4 ppm/° C. to 8 ppm/° C., or in a range of 4 ppm/° C. to 7 ppm/° C. The component 3 of FIGS. 12A-12E can comprise a laminated structure in which a plurality of substrates (such as substrates 270a, 270b) can be coupled to one or more capacitors, e.g, by way of one or more adhesives, and/or by way of a molding compound. In the illustrated embodiments, the substrates 270a, 270b may comprise materials or layers that are laminated or applied to the capacitor 220 without being deposited using a deposition process.

Figure 13A:
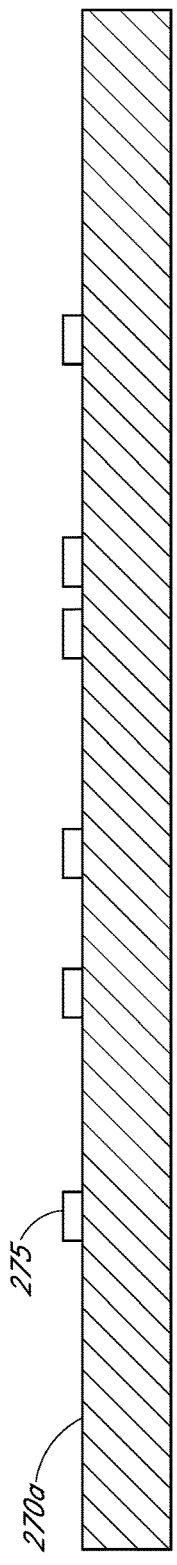
FIG. 13A is a schematic side sectional view of a first insulating carrier used to form a passive electronic component and having a plurality of contact pads thereon, according to another embodiment.
Figure 13B:
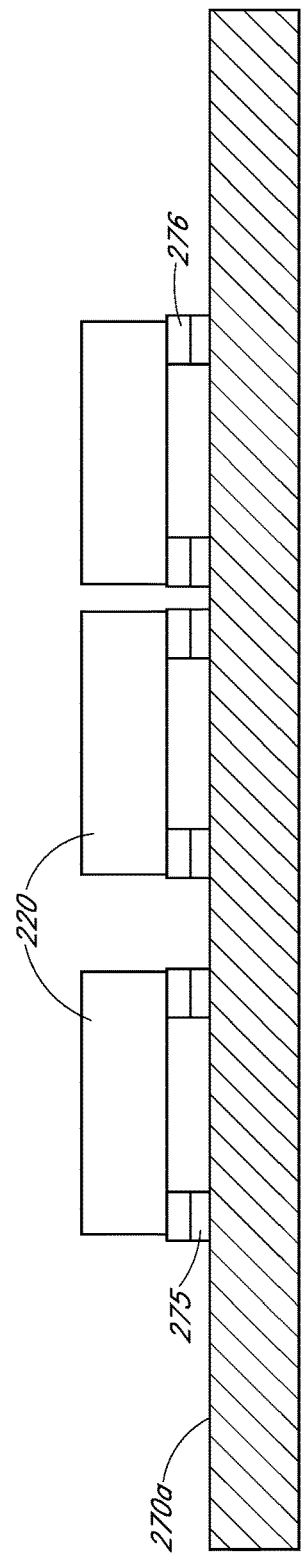
FIG. 13B is a schematic side sectional view of the first insulating carrier with a first adhesive comprising solder that electrically and mechanically connects capacitors to the first insulating carrier.
Figure 13C:
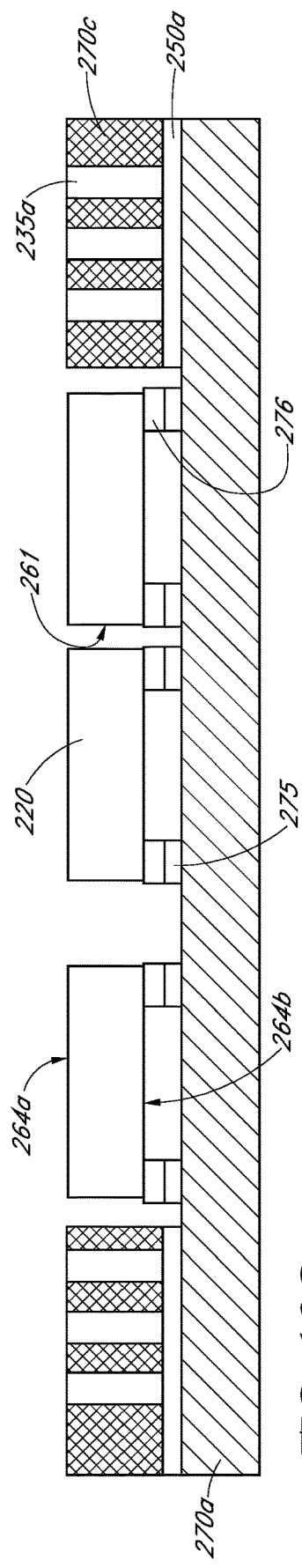
FIG. 13C is a schematic side sectional view of the first insulating carrier with an insulating carrier adhered to the first insulating carrier and disposed about the capacitors.
Figure 13D:
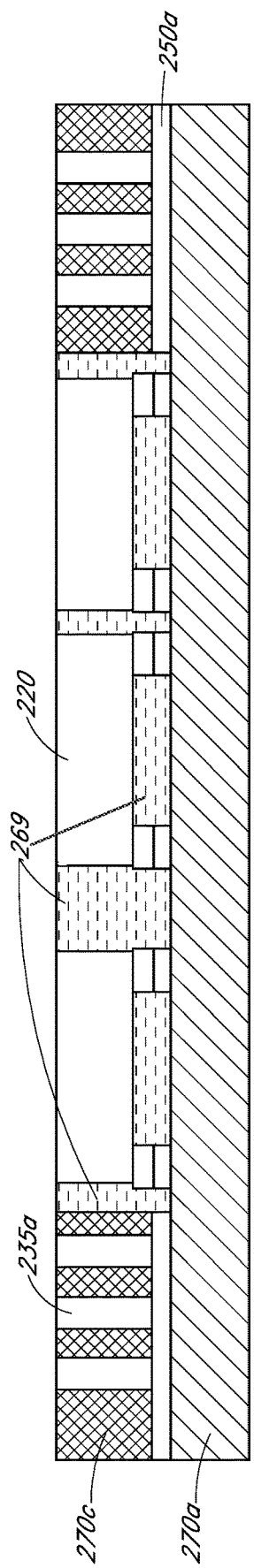
FIG. 13D is a schematic side sectional view of the partially defined component of FIG. 13C, with a molding compound applied about the capacitors.
Figure 13E:
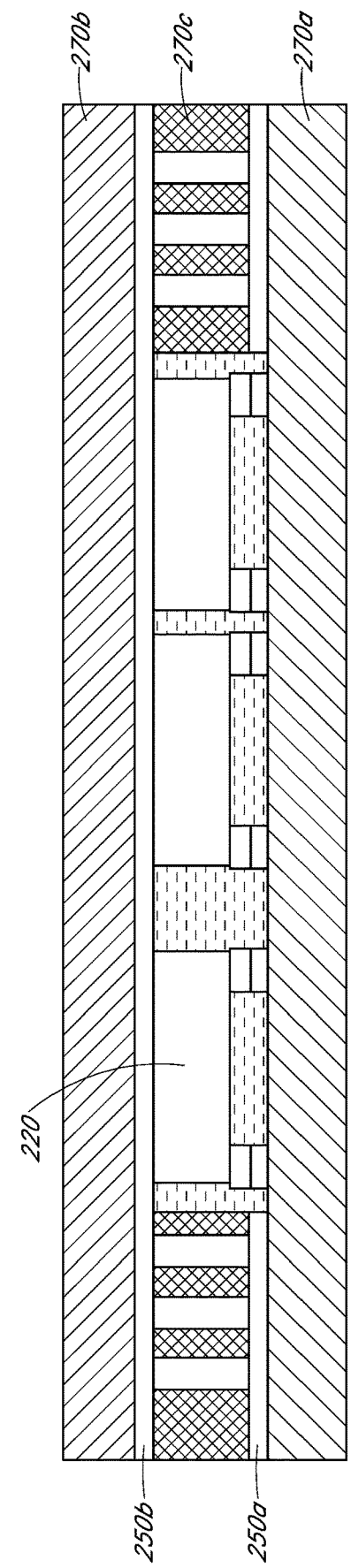
FIG. 13E is a schematic side sectional view of the partially defined component with the second insulating carrier provided over the capacitors.
Figure 13F:
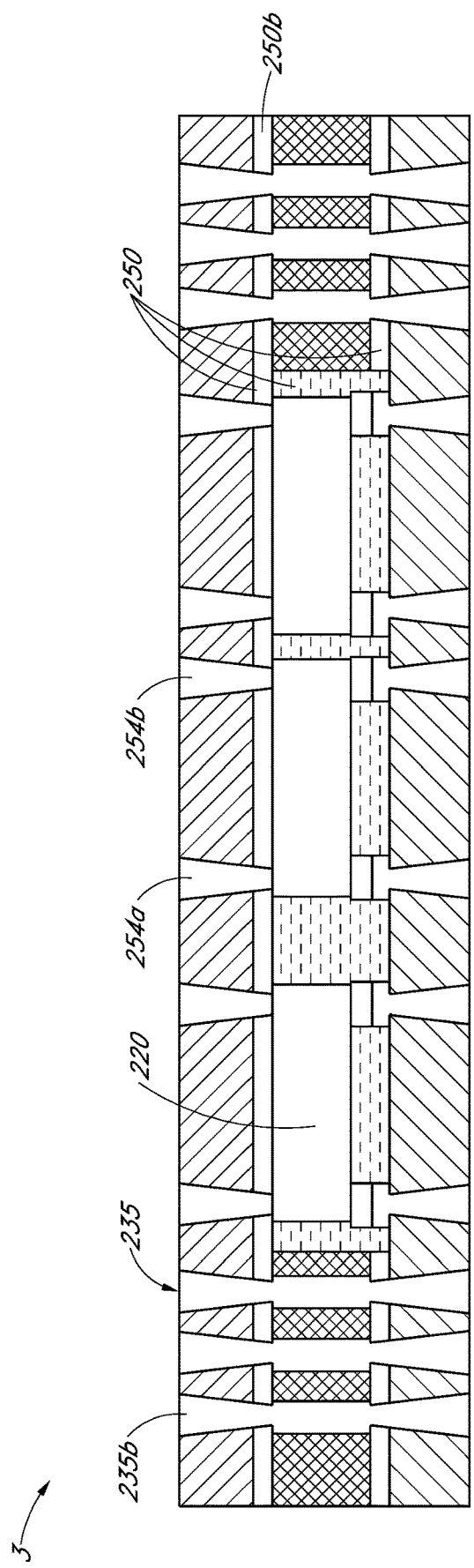
FIG. 13F is a schematic side sectional view of a passive electronic component having various interconnects and traces defined therein for electrical communication with external elements.

FIGS. 13A-13E illustrate another method for forming a passive electronic component 3. In FIG. 13A, the first insulating substrate 270a can have a plurality of conductive contact pads 275 on an exterior surface thereof. In FIG. 13B, the capacitors 220 can be connected to the contact pads 275 of the substrate 270a by way of a first adhesive, e.g., by way of a conductive adhesive 276, which comprises solder in the illustrated embodiment. In other embodiments, the capacitors 220 can be connected to the contact pads 275 by direct bonding without an intervening adhesive. Turning to FIG. 13C, a third insulating substrate 270c with first via portions 235a can be adhered to the first adhesive layer 250a, which can comprise a non-conductive adhesive. In FIG. 13D, the molding compound 269 can be provided underneath the surfaces 264b and around the side edges 261 of the capacitors 220. In FIG. 13E, the second adhesive layer 250b can be applied over the first surfaces 264a of the capacitors, and over the upper surfaces of the molding compound 269 and the third substrate layer 270c. The second substrate layer 270b can be provided over the second adhesive layer 250b. In FIG. 13F, various interconnects 254 and through vias 235 can be provided, as explained above.

The adhesives 250a, 250b, molding compound 269, and substrate 270c can serve as an insulating element disposed between the first and second substrates 270a, 270b. The interconnects 254a, 254b can act as conductive vias that extend through at least a portion of the insulating element. Further, the interconnects 254a, 254b can extend through the substrates 270a, 270b to connect to the capacitors. In FIG. 11G, the molding compound 269 can be disposed adjacent to (and or contacting) side edges of the capacitors 220. The capacitors 220 can therefore be embedded within the insulating element. As shown, the capacitors 220 can be disposed in a first region between the first and second substrates 270a, 270b, and at least a portion of the insulating element can be disposed in a different second region between the first and second substrates 270a, 270b. Beneficially, the use of the low CTE substrates 270a, 270b and intervening insulating element can provide the overall passive component 3 with a low overall effective CTE that is close to the CTE of the component(s) to which the passive component 3 is to be mounted, e.g. a semiconductor or silicon substrate. In such arrangements, beneficially, the overall effective CTE of the passive component 3 (e.g., including the insulating and conductive materials shown in FIG. 13F) can be no more than 8 ppm/° C., no more than 7 ppm/° C., or no more than 6 ppm/° C. In various embodiments, the overall effective CTE of the passive component 3 (also referred to as a microelectronic device herein) can be in a range of 3 ppm/° C. to 7 ppm/° C., in a range of 4 ppm/° C. to 8 ppm/° C., or in a range of 4 ppm/° C. to 7 ppm/° C. The component 3 of FIGS. 13A-13F can comprise a laminated structure in which a plurality of substrates (such as substrates 270a, 270b) can be coupled to one or more capacitors, e.g, by way of one or more adhesives, an intervening substrate 270c, and/or by way of a molding compound. In the illustrated embodiments, the substrates 270a, 270b may comprise materials or layers that are laminated or applied to the capacitor 220 without being deposited using a deposition process.

FIGS. 14A and 14B illustrate another embodiment of a technique for forming a passive electronic component 3. In FIG. 14A, a carrier 277 can be provided. The adhesive layer 250a can be applied over the carrier 277. The substrate layer 270 can be adhered to the carrier 277 with the adhesive layer 250a, and the capacitors 220 can be applied within a cavity of the substrate layer 270a (or the substrate layer 270 can be applied about previously deposited capacitors 220). The molding compound 269 (which can have a low CTE as explained above) can be applied about the capacitors 220, e.g., about the side surfaces 261 of the capacitors 220. The insulating layer 250 can be defined at least in part by the molding compound 269 and the adhesive layer 250a, such that the capacitors 220 are embedded in the insulating layer 250, e.g., partially embedded in the insulating layer 250. The carrier 277 can be removed in various embodiments, and RDLs 252a, 252b can be provided on opposing sides of the capacitors 220, molding compound 269, and insulating substrate 270. In FIGS. 14A-14B, the interconnects 254a, 254b can extend through insulating portions of the RDLs 252a, 252b (see layers 266a, 266b above) to connect to terminals of the capacitors 220. The overall effective CTE of the passive component 3 (e.g., including the insulating and conductive materials shown in FIG. 14B) can be no more than 8 ppm/° C., no more than 7 ppm/° C., or no more than 6 ppm/° C. In various embodiments, the overall effective CTE of the passive component 3 (also referred to as a microelectronic device herein) can be in a range of 3 ppm/° C. to 7 ppm/° C., in a range of 4 ppm/° C. to 8 ppm/° C., or in a range of 4 ppm/° C. to 7 ppm/° C. As above, the component 3 can comprise a laminated structure.

As explained herein, the embodiments of the passive components 3 (e.g., a microelectronic component) of FIGS. 8A-14B can be bonded (e.g., directly bonded without an intervening adhesive) to one or more other elements (such as one or more semiconductor elements. In some embodiments, the passive components 3 of FIGS. 8A-14B can be directly bonded to an element on one side of the component 3. In other embodiments, the passive component 3 can be directly bonded to elements on opposite sides of the passive component 3 such that the passive component 3 is between the elements. Indeed, such bonded structures can be realized for any and/or all of the embodiments disclosed herein.

Figure 15:
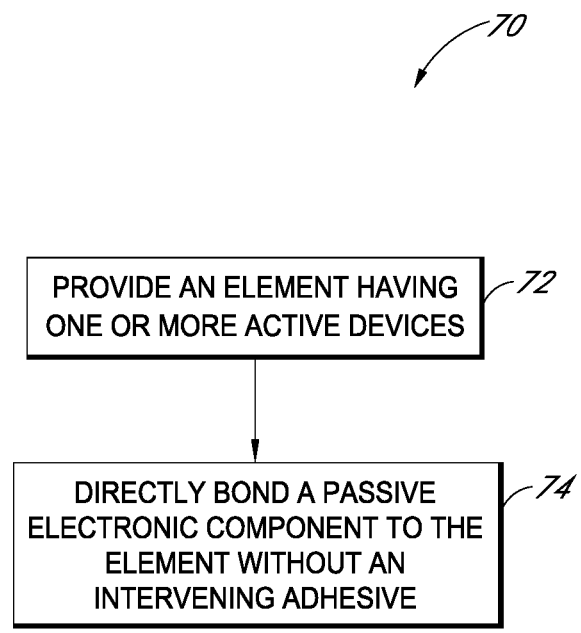
FIG. 15 is a flowchart illustrating a method for forming a bonded structure, according to various embodiments.

FIG. 15 is a flowchart illustrating a method 70 for forming a bonded structure, according to various embodiments. The method 70 can begin in a block 72 to provide an element having one or more active devices. The element can comprise a semiconductor element in various embodiments. In other embodiments, the element can comprise a material that may or may not comprise a semiconductor material. In embodiments that utilize a semiconductor element, such as a processor die, the element can be manufactured in a semiconductor processing facility to define the active devices on a wafer using semiconductor processing techniques (such as complementary metal oxide semiconductor, or CMOS, processing). A bonding layer for direct bonding can be formed on the element in the semiconductor processing facility using the semiconductor processing techniques. For example, as explained above, conductive features and non-conductive field regions can be defined at or near an exterior surface of the element. Beneficially, the bonding layer can enable the use of a low temperature anneal to improve bonding and reduce thermal mismatch.

In a block 74, a passive electronic component can be directly bonded to the element without an intervening adhesive. In various embodiments, anode and cathode terminals of the passive electronic component may be provided along the same side of the passive component. The passive component can be any suitable passive component described herein, including a capacitor. The capacitor can have a massive capacitance defined by a high K dielectric in some embodiments. In other embodiments, the capacitor can comprise a dielectric with a lower dielectric constant, such as silicon oxide or silicon nitride. In some embodiments, the passive electronic component can be manufactured in a facility that is different from the semiconductor processing facility used to manufacture the element. Manufacturing the passive component in a different facility can enable the use of high temperature processing to form high K dielectric layers in some embodiments. As with the element, a bonding layer can also be formed on the passive electronic component.

The wafer comprising the element and the wafer comprising the passive electronic component can be prepared for direct bonding as explained above. For example, the bonding layers can be polished to a very high surface smoothness, and can be activated and terminated with a desired species. The nonconductive field regions can be brought into contact with one another at room temperature to form a direct bond. The element and the passive component can be heated to strengthen the bond and/or to cause electrical contact between the conductive features.

In some embodiments, after direct bonding, additional interconnects can be provided on the bonded structure to provide a next level of communication with the package substrate. For example, any temporary carriers, such as the base 122 can be removed. One or more layers of conductive routing material (such as a back end of the line, or BEOL, layer) can be provided to improve the reliability of electrical connections with other components (such as a package substrate, interposer, or other die). The bonded wafer can be singulated, e.g., by sawing. The singulated bonded structures can be assembled into a package, e.g., the structures can be attached to a package substrate.

In some embodiments, such as the embodiment shown in FIGS. 7A-7B, the passive electronic component can comprise one or a plurality of elongate capacitors in which a majority of electrode surfaces are vertically disposed. The element can define a major lateral surface. The capacitor can comprise major surfaces of the first and second electrodes extending along a direction non-parallel to the major lateral surface of the component, with the first and second electrodes spaced apart by a dielectric. In some embodiments, the capacitors can be defined by providing a plurality of fibers extending along the non-parallel direction to define a plurality of capacitors. The plurality of fibers can serve as first electrodes and be coated with a non-conductive material to define the dielectric and subsequently coated with a conductive material to define second electrodes. Still other ways of forming the capacitors may be suitable.

In some embodiments, such as those shown in FIGS. 8A-14B, the passive electronic component can comprise a capacitor embedded in an insulating layer. In some embodiments, as explained above, the capacitor can be provided between one or more green sheets, and the capacitor and green sheets can be co-fired to form the hardened passive electronic component. In other embodiments, the capacitor can be provided in a cavity of an insulating layer. In still other embodiments, the capacitor can be provided on a first adhesive layer, and a second adhesive layer can be provided over the capacitor. First and second insulating carrier layers can couple to the first and second adhesive layers, respectively. In some embodiments, a molding compound can be provided about the passive component between the first and second adhesive layers.

Figure 16:
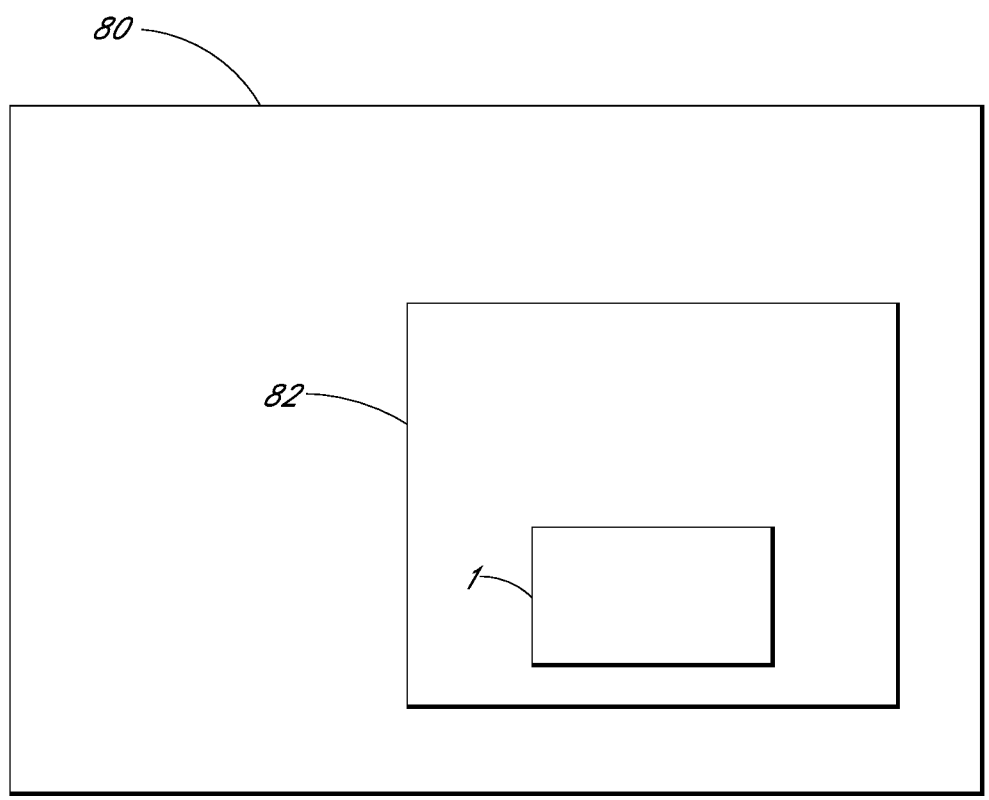
FIG. 16 is a schematic system diagram of an electronic system incorporating one or more bonded structures, according to various embodiments.

FIG. 16 is a schematic system diagram of an electronic system 80 incorporating one or more bonded structures 1, according to various embodiments. The system 80 can comprise any suitable type of electronic device, such as a mobile electronic device (e.g., a smartphone, a tablet computing device, a laptop computer, etc.), a desktop computer, an automobile or components thereof, a stereo system, a medical device, a camera, or any other suitable type of system. In some embodiments, the electronic system 80 can comprise a microprocessor, a graphics processor, an electronic recording device, or digital memory. The system 80 can include one or more device packages 82 which are mechanically and electrically connected to the system 80, e.g., by way of one or more motherboards. Each package 82 can comprise one or more bonded structures 1. The system 80 shown in FIG. 16 can comprise any of the structures 1 and passive components 3 shown and described herein.

In one embodiment, a bonded structure is disclosed. The bonded structure an element and a passive electronic component directly bonded to the element without an intervening adhesive. In some embodiments, the passive electronic component comprises a capacitor.

In another embodiment, a bonded structure is disclosed. The bonded structure can include an element having one or more active devices at or near an active surface of the element. The bonded structure can comprise a passive electronic component bonded to the element. The passive electronic component can comprise a sheet having a lateral width at least three times its thickness, the sheet covering a majority of the active surface of the element. In some embodiments, the passive electronic component can comprise a capacitor.

In another embodiment, a method of forming a bonded structure is disclosed. The method can include providing an element having one or more active devices. The method can include directly bonding a passive electronic component to the element without an intervening adhesive. In some embodiments, the passive electronic component can comprise a capacitor.

In one embodiment, a microelectronic device is disclosed. The microelectronic component can comprise a layer of insulating material having a first surface and a second surface. A multi-layer capacitor can be embedded within the layer of insulating material, between the first surface and the second surface. One or more conductive vias can be formed through the layer of insulating material, from the first surface to the second surface. A redistribution layer can be disposed on at least one of the first surface and the second surface, and arranged to electrically couple one or more terminals of the capacitor to one or more interconnects at the at least one of the first surface and the second surface.

In some embodiments, the redistribution layer can be configured to electrically couple two terminals of the multi-layer capacitor to at least two interconnects at the first surface, and no interconnects at the second surface. The redistribution layer can have a substantially planar surface and the one or more interconnects have a pitch of 1 micron or less. The insulating material can comprise a ceramic, a glass, or a liquid crystal polymer.

In another embodiment, a method for forming a microelectronic device is disclosed. The method can comprise depositing a multi-layer capacitor on a first layer of insulating material. The method can comprise depositing a second layer of insulating material over the multi-layer capacitor and the first layer of insulating material. The method can comprise pressing the second layer of the insulating material over the multi-layer capacitor and the first layer of the insulating material. The method can comprise co-firing the second layer of the insulating material, the multi-layer capacitor, and the first layer of the insulating material to form a unified device.

In some embodiments, the method can comprise depositing an intermediate layer of the insulating material between the first and second layers, and around the capacitor prior to the pressing and the co-firing. The method can comprise forming one or more vias through the first and second layers of the insulating material after the co-firing. The method can comprise forming one or more vias through the first and second layers of the insulating material prior to the co-firing. The method can comprise forming a redistribution layer on an exterior surface of the first or second layers of the insulating material, the redistribution layer including one or more electrical interconnects coupled to one or more terminals of the capacitor. The redistribution layer can include at least one interconnect coupled to each of the terminals of the capacitor. The method can comprise bonding the redistribution layer to a prepared bonding surface, by a direct bonding technique without adhesive.

In another embodiment, a method for forming a microelectronic device is disclosed. The method can comprise forming a cavity in a surface of an insulating layer. The method can comprise forming one or more vias through at least a portion of the thickness of the insulating layer. The method can comprise depositing a multi-layer capacitor into the cavity. The method can comprise forming a redistribution layer over the capacitor and the insulating layer, the redistribution layer including one or more electrical interconnects coupled to one or more terminals of the capacitor.

In some embodiments, the method can comprise planarizing a surface of the insulating layer opposite the redistribution layer, and forming another redistribution layer on the planarized surface. The other redistribution layer can include one or more electrical interconnects coupled to one or more terminals of the capacitor.

In another embodiment, a bonded structure is disclosed. The bonded structure can comprise an element and a passive electronic component having a first surface bonded to the element and a second surface opposite the first surface. The passive electronic component can comprise a capacitor between the first surface and the second surface. The capacitor can comprise first and second terminals on a first surface of the capacitor, a first conductive electrode electrically connected to the first terminal, a second conductive electrode electrically connected to the second terminal, and a high K dielectric between the first and second conductive electrodes.

In some embodiments, the high K dielectric comprises a ceramic. The element can be directly bonded to the passive electronic component without an intervening adhesive. The ceramic dielectric can comprise at least one of a titanate, a niobate, and a zirconate.

In another embodiment, a microelectronic device is disclosed. The microelectronic device can include an insulating material having a first surface and a second surface. A capacitor can be embedded within the insulating material, between the first surface and the second surface, the capacitor monolithically integrated with the insulating material to define a monolithic structure. A first interconnect can be disposed at or through the first surface and electrically connected to a first terminal of the capacitor. The capacitor can comprise a ceramic dielectric. The ceramic dielectric can comprise aluminum oxide. The capacitor can comprise a multi-layer capacitor having a plurality of dielectric layers between a plurality of conductive layers. The ceramic dielectric can be monolithically integrated with the insulating material. A redistribution layer (RDL) can be connected to one of the first surface and the second surface, the first interconnect at least partially disposed in the RDL. A second interconnect can be disposed at the first surface and electrically connected to a second terminal of the capacitor, the first terminal of a different type than the second terminal. A through conductive via can extend through the insulating layer from the first surface to the second surface. The layer of insulating material can be disposed along an upper surface of the capacitor, along a lower surface of the capacitor, and along side edges of the capacitor.

In another embodiment, a microelectronic device is disclosed. The microelectronic device can comprise an insulating material having a first surface and a second surface opposite the first surface. A capacitor can be at least partially embedded within the insulating material, between the first surface and the second surface. An interconnect layer can be disposed on the first surface, and can be arranged to electrically couple one or more terminals of the capacitor to one or more interconnects at or extending through the first surface of the insulating material.

In some embodiments, the capacitor can be completely embedded within the insulating material. The capacitor can be partially embedded within the insulating material, the insulating material disposed along outer side edges of the capacitor. The microelectronic device can comprise a first insulating substrate, wherein a first surface of the capacitor is mechanically coupled to the first insulating substrate by way of a first adhesive, the insulating material comprising the first adhesive. The microelectronic device can comprise a second insulating substrate, the second surface of the capacitor mechanically coupled to the second insulating substrate by way of a second adhesive, the insulating material further comprising the second adhesive. A molding compound can be disposed about portions of the capacitor, the insulating material further comprising the molding compound. A third intermediate insulating substrate can be disposed about the capacitor between the first and second insulating substrate. The first adhesive can comprise solder in some embodiments. A second interconnect layer can be disposed on the second surface, and can be arranged to electrically couple one or more terminals of the capacitor to one or more interconnects at the second surface of the insulating material. The microelectronic device can include a first interconnect and a second interconnect in the interconnect layer, the first interconnect connected to a first terminal of the capacitor at a first side of the capacitor and the second interconnect connected to a second terminal at the first side, the first terminal of a different type from the second terminal. The microelectronic device can include a third terminal at a second side of the capacitor and a fourth terminal at the second side, the third terminal of a different type from the fourth terminal. The layer of insulating material comprises multiple layers in some embodiments. The microelectronic device can include a conductive through via extending through the insulating material. In some embodiments, a bonded structure can comprise the microelectronic device and an element, the element directly bonded to the microelectronic device without an intervening adhesive.

In another embodiment, a microelectronic device is disclosed. The microelectronic component can comprise a first insulating substrate and a capacitor having a first surface and a second surface opposite the first surface, the first surface of the capacitor mechanically coupled to the first insulating substrate. The microelectronic device can include a second insulating substrate, the second surface of the capacitor mechanically coupled to the second insulating substrate such that the capacitor is disposed between the first and second insulating substrates. An insulating element can be disposed between the first and second insulating substrates. A first interconnect can extend through the first insulating substrate to electrically connect to a first terminal of the capacitor.

In some embodiments, the first surface of the capacitor can be mechanically coupled to the first insulating substrate by way of a first adhesive, the insulating element comprising the first adhesive. The second surface of the capacitor can be mechanically coupled to the second insulating substrate by way of a second adhesive, the insulating element further comprising the second adhesive. The first adhesive can comprise solder in some embodiments. The insulating element can comprise a molding compound disposed about portions of the capacitor. The insulating element can comprise a third intermediate insulating substrate disposed about the capacitor between the first and second insulating substrates. A coefficient of thermal expansion (CTE) of one or more of the first and second insulating substrates can be no more than 5 ppm/° C. The CTE of the one or more of the first and second insulating substrates can be in a range of 2 ppm/° C. to 5 ppm/° C. An overall effective coefficient of thermal expansion (CTE) of the microelectronic device can be no more than 7 ppm/° C. The overall effective CTE can be in a range of 3 ppm/° C. to 7 ppm/° C. A second interconnect can extend through the first insulating substrate, the first interconnect connected to a first terminal of the capacitor at a first side of the capacitor and the second interconnect connected to a second terminal at the first side, the first terminal of a different type from the second terminal. The microelectronic component can comprise a third terminal at a second side of the capacitor and a fourth terminal at the second side, the third terminal of a different type from the fourth terminal. At least a portion of the insulating element can be disposed adjacent a side edge of the capacitor. The capacitor can be disposed in a first region between the first and second substrates and at least a portion of the insulating element is disposed in a second region between the first and second substrates, the first and second regions different from one another. A bonded structure can comprise the microelectronic device and an element, the element directly bonded to the microelectronic device without an intervening adhesive.

In another embodiment, a method of forming a microelectronic device is disclosed. The method can comprise mechanically coupling a first surface of a capacitor to a first insulating substrate. The method can comprise mechanically coupling a second surface of the capacitor to a second insulating substrate such that the capacitor is disposed between the first and second insulating substrates. The method can comprise disposing an insulating element between the first and second insulating substrates. The method can comprise providing a first interconnect extending through the first insulating substrate to electrically connect to a first terminal of the capacitor.

In some embodiments, the method can comprise adhering the capacitor to the first insulating substrate with an adhesive. The method can comprise adhering the second substrate to the capacitor with a second adhesive. The method can comprise providing a molding compound around at least a portion of the capacitor between the first and second insulating substrates.

In another embodiment, a bonded structure is disclosed. The bonded structure can comprise an element and a passive electronic component having a first surface bonded to the element and a second surface opposite the first surface. The passive electronic component can comprise a first anode terminal bonded to a corresponding second anode terminal of the element and a first cathode terminal bonded to a corresponding second cathode terminal of the element, the first anode terminal and the first cathode terminal disposed on the first surface of the passive electronic component.

In some embodiments, the passive electronic component is directly bonded to the element without an intervening adhesive. The passive electronic component can comprise a capacitor. The capacitor can comprise three or more metallic layers spaced apart by a plurality of dielectric layers. The passive electronic component can comprise a third anode terminal and a third cathode terminal on the second surface of the passive electronic component. The element can comprise a semiconductor element. The bonded structure can comprise a plurality of electrical contacts on the second surface of the passive electronic component, the plurality of electrical contacts configured to electrically connect to an external component. The bonded structure can comprise an interconnect structure defining an electrical pathway between the element and a first electrical contact of the plurality of electrical contacts. The interconnect structure can comprise a conductive electrical interconnect that extends from the first surface to the first electrical contact, the conductive electrical interconnect embedded within a dielectric disposed between the first and second surfaces. The conductive electrical interconnect can comprise a longitudinal conductive portion extending from a first contact pad at or near the first surface to the first electrical contact and one or more lateral conductive portions extending laterally outward from the longitudinal conductive portion, the longitudinal conductive portion defining a resistive electrical pathway and the one or more lateral conductive portions defining a capacitive electrical pathway in parallel with the resistive electrical pathway. The element can define a major lateral surface and the capacitor comprises first and second electrode surfaces extending along a direction non-parallel to the major lateral surface, the first and second electrode surfaces spaced apart by a dielectric. A first height of the first electrode surface along the non-parallel direction can be longer than a width of an undulation of the capacitor along the major lateral surface. An aspect ratio can be defined by the first height divided by the width, the aspect ratio being greater than 5:1. At least one of the first electrode surface and the second electrode surface can comprise aluminum, silicon, doped silicon, or nickel. The capacitor can comprise a serpentine pattern extending through the passive electronic component. The serpentine pattern can comprise respective vertical portions of the first and second electrode surfaces and corresponding lateral portions of the first and second electrode surfaces that connect the vertical portions.

In another embodiment, a bonded structure is disclosed. The bonded structure can comprise an element having one or more active devices at or near an active surface of the element, the active surface defining a major lateral surface of the bonded structure. The bonded structure can comprise a passive electronic component bonded to the element, the passive electronic component comprising a capacitor having first and second electrode surfaces extending along a direction non-parallel to the major lateral surface, the first and second electrode surfaces spaced apart by a dielectric.

In some embodiments, the passive electronic component can be directly bonded to the element without an intervening adhesive. A first height of the first electrode surface along the non-parallel direction can be longer than a width of an undulation of the capacitor along the major lateral surface. An aspect ratio can be defined by the first height divided by the width, the aspect ratio being greater than 5:1. At least one of the first electrode surface and the second electrode surface can comprise aluminum. The capacitor can comprise a serpentine pattern extending through the passive electronic component. The serpentine pattern can comprise respective vertical portions of the first and second electrode surfaces and corresponding lateral portions of the first and second electrode surfaces that connect the vertical portions. The bonded structure can comprise a first terminal electrically connected to the first electrode surface and a second terminal electrically connected to the second electrode surface, the first and second terminals exposed at an upper surface of the passive electronic component. An extension portion of the second electrode surface can extend through the first electrode surface to connect to the second terminal.

In another embodiment, a bonded structure is disclosed. The bonded structure can comprise an element and a passive electronic component having a first surface bonded to the element and a second surface opposite the first surface. The passive electronic component can comprise a passive device. The passive device can include first and second terminals on the first surface of the passive electronic component, a first conductive interconnect electrically connected to the first terminal, a second conductive interconnect electrically connected to the second terminal, and a dielectric between the first and second conductive interconnects.

In some embodiments, the element can be directly bonded to the passive electronic component without an intervening adhesive. The passive device can comprise a capacitor.

In another embodiment, a bonded structure is disclosed. The bonded structure can comprise an element and a passive electronic component directly bonded to the element without an intervening adhesive.

In some embodiments, the passive electronic component can comprise a capacitor. The capacitor can comprise three or more metallic layers spaced apart by a plurality of dielectric layers. The capacitor can comprise a dielectric layer having a dielectric constant in a range of 1 to 10. The passive electronic component can comprise a first electrode, a second electrode, and a dielectric material between the first and second electrodes, wherein the dielectric material comprises a high K dielectric. The high K dielectric can comprise titanates, ($Ba_xSr_{1-x}TiO_3$, $Bi_4Ti_3O_{12}$, $PbZr_xTi_{1-x}O_3$), niobates ($LiNbO_3$), and/or zirconates ($BaZrO_3$, $CaZrO_3$). The first electrode can comprise a noble metal. The passive electronic component can have a capacitance per unit area in a range of 1 nF/mm2 to 1 µF/mm2. The passive electronic component can have a capacitance per unit area in a range of 5 nF/mm2 to 400 nF/mm2. The passive electronic component can have a capacitance per unit area in a range of 100 nF/mm2 to 400 nF/mm2. The passive electronic component can have a capacitance per unit area in a range of 400 nF/mm2 to 1000 nF/mm2. The bonded structure can comprise a plurality of passive electronic components directly bonded to the element without an intervening adhesive. The passive component can be provided within a passive component layer directly bonded to the element, the passive component layer covering a majority of the element. The passive component can comprise a first surface directly bonded to the element and a second exterior surface opposite the first surface. The bonded structure can comprise a plurality of electrical contacts on the second exterior surface, the plurality of electrical contacts configured to electrically connect to an external component. The bonded structure can comprise an interconnect structure defining an electrical pathway between the element and a first electrical contact of the plurality of electrical contacts. The interconnect structure can comprise a conductive electrical interconnect that extends from the first surface to the first electrical contact, the conductive electrical interconnect embedded within a dielectric disposed between the first and second surfaces. The conductive electrical interconnect can comprise a longitudinal conductive portion extending from a first contact pad at or near the first surface to the first electrical contact and one or more lateral conductive portions extending laterally outward from the longitudinal conductive portion, the longitudinal conductive portion defining a resistive electrical pathway and the one or more lateral conductive portions defining a capacitive electrical pathway in parallel with the resistive electrical pathway. The bonded structure can comprise a second interconnect structure comprising a second conductive electrical interconnect that extends from the first surface to a second electrical contact of the plurality of electrical contacts. The second conductive electrical interconnect can comprise a second longitudinal conductive portion extending from a second contact pad at or near the first surface to the first electrical contact and one or more second lateral conductive portions extending laterally outward from the second longitudinal conductive portion, the second longitudinal conductive portion defining a second resistive electrical pathway and the one or more second lateral conductive portions defining a second capacitive electrical pathway in parallel with the second resistive electrical pathway. The one or more lateral conductive portions and the one or more second lateral conductive portions can be interleaved with one another and separated by intervening dielectric material. One of the interconnect structure and the second interconnect structure can be configured to connect to a power source, and wherein the other of the interconnect structure and the second interconnect structure can be configured to connect to electrical ground. The passive electronic component can comprise a plurality of alternating conductive and dielectric features disposed between first and second opposing surfaces of the passive electronic component. The passive electronic component can comprise a first electrode at a first surface of the passive electronic component that is directly bonded to the element, a second electrode at a second exterior surface of the passive electronic component, and an intervening dielectric material, the first electrode patterned into a plurality of bond pads with intervening dielectric. The second electrode can comprise a noble metal. The noble metal can comprise platinum or ruthenium. The intervening dielectric material comprises a high K dielectric. The intervening dielectric material can comprise a complex oxide. The intervening dielectric material can comprise titanates, (BaxSr1-xTiO3, Bi4Ti3O12, PbZrxTi1-xO3), niobates (LiNbO3), and/or zirconates (BaZrO3, CaZrO3).

In another embodiment, a bonded structure is disclosed. The bonded structure can comprise an element having one or more active devices at or near an active surface of the element, and a passive electronic component bonded to the element, the passive electronic component comprising a sheet having a lateral width at least three times its thickness, the sheet covering a majority of the active surface of the element.

In some embodiments, the passive electronic component can comprise a capacitive sheet. The passive electronic component can be directly bonded to the element without an intervening adhesive.

In another embodiment, a method of forming a bonded structure is disclosed. The method can comprise providing an element having one or more active devices. The method can comprise directly bonding a passive electronic component to the element without an intervening adhesive.

In some embodiments, the method can comprise forming three or more metallic layers spaced apart by a plurality of dielectric layers in the passive electronic component. The passive electronic component can comprise a sheet having a lateral width at least three times its thickness, the method comprising covering a majority of an active surface of the element with the sheet. The method can comprise forming the passive electronic component to include a first electrode comprising a refractory metal, a second electrode, and an intervening dielectric layer having a dielectric constant greater than 10. The method can comprise patterning the second electrode to define a plurality of portions of the second electrode. The method can comprise forming the passive electronic component in a first facility and forming the element in a second facility different from the first facility.

For purposes of summarizing the disclosed embodiments and the advantages achieved over the prior art, certain objects and advantages have been described herein. Of course, it is to be understood that not necessarily all such objects or advantages may be achieved in accordance with any particular embodiment. Thus, for example, those skilled in the art will recognize that the disclosed implementations may be embodied or carried out in a manner that achieves or optimizes one advantage or group of advantages as taught or suggested herein without necessarily achieving other objects or advantages as may be taught or suggested herein.

All of these embodiments are intended to be within the scope of this disclosure. These and other embodiments will become readily apparent to those skilled in the art from the following detailed description of the embodiments having reference to the attached figures, the claims not being limited to any particular embodiment(s) disclosed. Although this certain embodiments and examples have been disclosed herein, it will be understood by those skilled in the art that the disclosed implementations extend beyond the specifically disclosed embodiments to other alternative embodiments and/or uses and obvious modifications and equivalents thereof. In addition, while several variations have been shown and described in detail, other modifications will be readily apparent to those of skill in the art based upon this disclosure. It is also contemplated that various combinations or sub-combinations of the specific features and aspects of the embodiments may be made and still fall within the scope. It should be understood that various features and aspects of the disclosed embodiments can be combined with, or substituted for, one another in order to form varying modes of the disclosed implementations. Thus, it is intended that the scope of the subject matter herein disclosed should not be limited by the particular disclosed embodiments described above, but should be determined only by a fair reading of the claims that follow.

What is claimed is:

1. A bonded structure comprising:
   an integrated device die comprising a first surface comprising a first non-conductive region and a first plurality of conductive regions; and
   a passive electronic component comprising:
      a second surface directly hybrid bonded to the first surface, such that a second non-conductive region of the second surface is directly bonded to the first non-conductive region without an intervening adhesive and a second plurality of conductive regions is directly bonded to the first plurality of conductive regions without an intervening adhesive; and
      a plurality of capacitors electrically connected to at least some of the second plurality of conductive regions, wherein the capacitors of the passive electronic component form part of a power delivery network for the integrated device die.

2. The bonded structure of claim 1, wherein the plurality of capacitors of the passive electronic component improve the stability of the power supply to the integrated device die.

3. The bonded structure of claim 1, wherein the passive electronic component reduces impedance at frequencies above 500 MHz, as compared to a configuration in which the integrated device die and the passive electronic component are not directly bonded.

4. The bonded structure of claim 1, wherein the plurality of capacitors of the passive electronic component are not separated from the integrated device die by any standoff.

5. The bonded structure of claim 1, further comprising a redistribution layer between the plurality of capacitors and the second plurality of conductive regions.

6. The bonded structure of claim 1, wherein the plurality of capacitors have electrode surfaces that are generally perpendicular to the second surface.

7. The bonded structure of claim 1, wherein the second surface of the passive electronic component covers the entirety of the first surface of the integrated device die.

8. The bonded structure of claim 1, wherein the hybrid bonded integrated device die and passive electronic component are both singulated from a wafer-to-wafer bond.

9. The bonded structure of claim 1, wherein sidewalls of the integrated device die and passive electronic component are aligned in a manner characteristic of singulation after bonding.

10. The bonded structure of claim 1, wherein the passive electronic component comprises materials having a dielectric constant greater than 5.

11. The bonded structure of claim 10, wherein the passive electronic component comprises materials having a dielectric constant greater than 20.

12. The bonded structure of claim 1, wherein the passive electronic component includes an array of capacitive cells having an effective capacitance per unit area of at least 5 nF/mm$^2$.

13. The bonded structure of claim 12, wherein the effective capacitance per unit area is at least 50 nF/mm$^2$.

14. The bonded structure of claim 12, wherein the effective capacitance per unit area is at least 100 nF/mm$^2$.

15. The bonded structure of claim 12, wherein the effective capacitance per unit area is at least 200 nF/mm$^2$.

16. The bonded structure of claim 1, wherein the passive electronic component further includes vias providing signals separate from the power delivery network to the integrated device die.

17. The bonded structure of claim 1, wherein the integrated device die comprises a processor.

18. The bonded structure of claim 1, wherein the integrated device die further comprises a substrate and a plurality of active devices on the same side of the substrate as the first surface.

19. A bonded structure comprising:
an integrated device die comprising a first surface comprising a first non-conductive region and a first plurality of conductive regions; and
an electronic component comprising:
a second surface directly hybrid bonded to the first surface, such that a second non-conductive region of the second surface is directly bonded to the first non-conductive region without an intervening adhesive and a second plurality of conductive regions is directly bonded to the first plurality of conductive regions without an intervening adhesive; and
a plurality of capacitors electrically connected to at least some of second plurality of conductive regions, wherein the capacitors filter a component of a power signal delivered to the integrated device die.

20. The bonded structure of claim 19, wherein the plurality of capacitors cover at least 55% of an active surface of the integrated device die.

21. The bonded structure of claim 20, wherein the plurality of capacitors cover at least 75% of an active surface of the integrated device die.

22. The bonded structure of claim 19, wherein the plurality of capacitors filter out DC components of signals provided to the integrated device die.

23. The bonded structure of claim 19, wherein the plurality of capacitors are deep trench capacitors.

24. The bonded structure of claim 19, wherein the electronic component comprises materials having a dielectric constant greater than 5.

25. The bonded structure of claim 24, wherein the materials have a dielectric constant greater than 20.

26. The bonded structure of claim 25, wherein the materials have a dielectric constant greater than 100.

27. The bonded structure of claim 19, wherein the electronic component further comprises vias to allow electrical communication through the electronic component.

28. The bonded structure of claim 27, wherein the vias provide signals to the integrated device die separate from the power signal.

29. The bonded structure of claim 19, wherein the first surface is on a front side of the integrated device die.

30. The bonded structure of claim 19, wherein the first surface is on a back side of the integrated device die.

31. The bonded structure of claim 30, wherein the integrated device die comprises one or more vias electrically connecting at least one of the first plurality of conductive regions to a device on a front side of the integrated device die.

* * * * *